(12) United States Patent
Tsujimoto

(10) Patent No.: US 9,329,213 B2
(45) Date of Patent: May 3, 2016

(54) POWER MEASURING APPARATUS

(75) Inventor: Hiroaki Tsujimoto, Wakayama (JP)

(73) Assignee: SIRC CO., LTD., Osaka (JP)

( * ) Notice: Subject to any disclaimer, the term of this patent is extended or adjusted under 35 U.S.C. 154(b) by 309 days.

(21) Appl. No.: 13/983,144

(22) PCT Filed: Jan. 27, 2012

(86) PCT No.: PCT/JP2012/051883

§ 371 (c)(1),
(2), (4) Date: Oct. 11, 2013

(87) PCT Pub. No.: WO2012/105459

PCT Pub. Date: Aug. 9, 2012

(65) Prior Publication Data

US 2014/0049253 A1    Feb. 20, 2014

(30) Foreign Application Priority Data

Feb. 1, 2011   (JP) ................................. 2011-019639
Nov. 17, 2011  (JP) ................................. 2011-251194

(51) Int. Cl.
*G01N 27/72*   (2006.01)
*G01R 33/12*   (2006.01)
(Continued)

(52) U.S. Cl.
CPC ................ *G01R 21/06* (2013.01); *G01R 21/08* (2013.01); *G01R 33/07* (2013.01); *G01R 33/09* (2013.01); *G01R 33/093* (2013.01); *G01R 33/098* (2013.01); *G01R 33/091* (2013.01)

(58) Field of Classification Search
CPC ........ G01R 33/09; G01R 21/06; G01R 21/08; G01R 33/093; G01R 33/098; G01R 33/07; G01R 33/091
USPC ............... 324/51, 55, 96, 117, 137, 142, 144, 324/200, 207.21, 228, 244, 252
See application file for complete search history.

(56) References Cited

U.S. PATENT DOCUMENTS 5,521,501 A   5/1996   Dettmann et al.
5,719,494 A   2/1998   Dettmann et al.
(Continued)

FOREIGN PATENT DOCUMENTS

CN   1148234 A   4/1997
CN   1394284 A   1/2003
(Continued)

OTHER PUBLICATIONS

Japanese Office Action mailed Jun. 16, 2015 in Japanese Application No. 2012-555846.
(Continued)

*Primary Examiner* — Huy Q Phan
*Assistant Examiner* — Raul Rios Russo
(74) *Attorney, Agent, or Firm* — Greenblum & Bernstein, P.L.C.

(57) ABSTRACT

The present invention provides various thin-film sensor type power measuring apparatuses which can be constructed in a simplified and compact structure so as to measure the power of high-frequency circuits or batteries. This power measuring apparatus includes: a magnetic film disposed in parallel to a primary conductor through which a load current flows; a power supply with input and output terminals for supplying an element current to the magnetic film; a bias magnetic field applying unit for applying a DC magnetic field in a direction that is parallel, perpendicular, or diagonal to the direction of magnetization of the magnetic film; and a detection unit for detecting the voltage between the ends of the magnetic film in the direction of the element current. The power measuring apparatus detects only the DC voltage component between the ends of the magnetic film in the direction of the element current.

19 Claims, 54 Drawing Sheets

(51) Int. Cl.
*G01R 21/06* (2006.01)
*G01R 33/07* (2006.01)
*G01R 21/08* (2006.01)
*G01R 33/02* (2006.01)
*G01R 33/09* (2006.01)

(56) References Cited

U.S. PATENT DOCUMENTS

| | | | |
|---|---|---|---|
| 7,417,242 B2 * | 8/2008 | Ray | H01J 37/244 250/310 |
| 7,463,016 B2 * | 12/2008 | Shoji | G01R 15/205 324/117 R |
| 2003/0042902 A1 * | 3/2003 | Kobayashi | B82Y 25/00 324/252 |
| 2012/0229131 A1 | 9/2012 | Takenaga et al. | |

FOREIGN PATENT DOCUMENTS

| | | |
|---|---|---|
| EP | 0759619 | 2/1997 |
| JP | 54-127346 A | 10/1979 |
| JP | 61-70478 | 4/1986 |
| JP | 62-66413 | 3/1987 |
| JP | 1-250875 | 10/1989 |
| JP | 2-120677 | 5/1990 |
| JP | 8-503778 | 4/1996 |
| JP | 8-211138 | 8/1996 |
| JP | 11-274598 | 10/1999 |
| JP | 2005-236815 | 9/2005 |
| JP | 2006-317203 | 11/2006 |
| JP | 2009-145217 | 7/2009 |
| WO | 2011/024923 | 3/2011 |

OTHER PUBLICATIONS

Office Action issued in China Family Member Patent Appl. No. 201280007234.8, dated Sep. 17, 2015.
Office Action issued in Japan Family Member Patent Appl. No. 2012-555846, dated Oct. 6, 2015.
Hiroaki Tsujimoto et al., "Thin film power using magnetic this film", The Institute of Electrical Engineers of Japan Magnetics Kenkyukai Shiryo, 2005, vol. MAG-05, No. 174-196 pp. 45-48.

* cited by examiner

100Hz

200Hz

NO BIAS MAGNETIC FIELD

MAGNIFIED

MAGNETORESISTANCE EFFECT

TYPICAL MAGNETORESISTANCE EFFECT

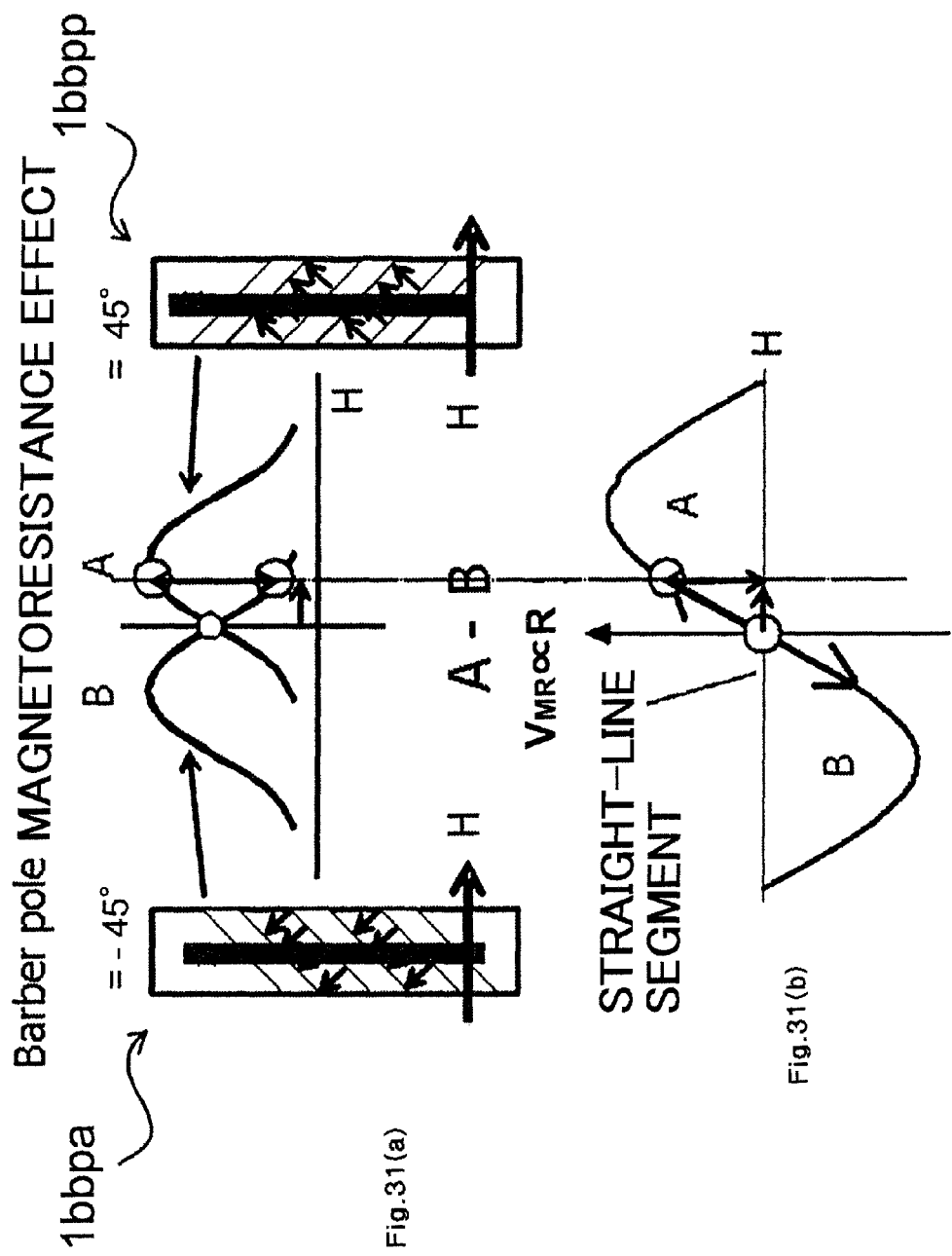

Fig.47(a) DIFFERENCE IN LEVEL BETWEEN SIGNALS BEING NEARLY TEN-THOUSAND TIMES
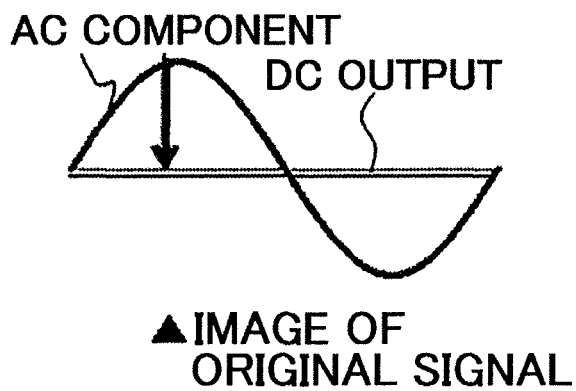
▲ IMAGE OF ORIGINAL SIGNAL
Fig.47(b)
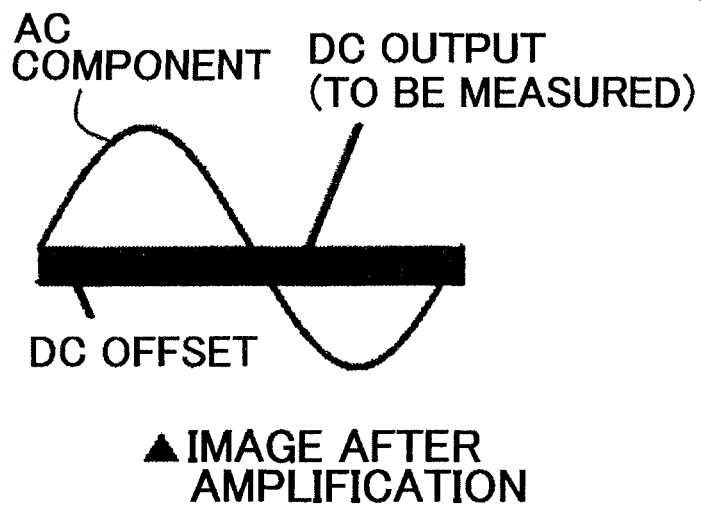
▲ IMAGE AFTER AMPLIFICATION
Fig.47(c)
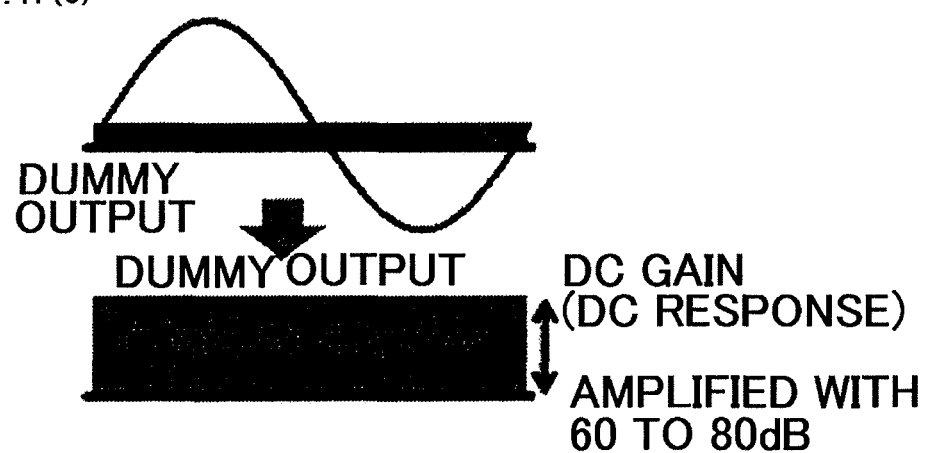

POWER MEASURING APPARATUS

FIELD

The present invention relates to various thin-film sensor type power measuring apparatuses which are simplified in structure and reduced in size yet capable of measuring power in high-frequency circuits or batteries.

BACKGROUND

In recent years, while environments for taking advantage of the Internet or the like have been prepared, measurement systems including one for remote electric-power meter reading are being developed. Conventionally, to measure electric power, use has been made of the integrating wattmeter which converts power consumption to the number of revolutions of the disk for integration operation. Recently, the integrating wattmeter has been additionally provided with a sensor for detecting revolutions, an electric current meter (CT), or a potentiometer (PT) so as to perform multiplication computation with an electronic circuit or a microprocessor, thereby measuring the power. The integrating wattmeter has a complicated device structure, which is not only large but also expensive, and cannot be digitally controlled because the power is measured mechanically. Furthermore, in combination of these, extra energy may be consumed.

In this context, it is desired to develop a power meter which is capable of measuring power consumption as the amount of electric power as it is and which can be reduced in size and integrated.

On the other hand, in recent years, not only electrical devices for business use but also household electrical devices have increasingly incorporated high-frequency circuits, causing various adverse effects to occur due to the occurrence of harmonic currents. For example, in an area where cutting of the leakage of harmonic currents is loosely regulated, the leakage of harmonic currents has affected a surrounding household electrical device, e.g., causing the device to be on fire. Thus, there has arisen a social need for a sensor and a power measuring apparatus which can measure the occurrence of harmonic currents in a simplified manner.

As a substitute for the integrating wattmeter, for example, suggested were a power measuring apparatus and a magnetic field sensor therefor, which are capable of taking advantage of the magnetoresistance effect of the magnetic thin film so as to measure power consumption as the amount of electric power as it is (Non-Patent Literature 1). The power measuring apparatus and the magnetic field sensor are configured to employ a magnetic thin film (arranged on a substrate) disposed in parallel to a primary conductor through which an alternating current flows, allow a primary voltage to be applied to both the ends of the magnetic thin film via a resistor, and take the output on both the ends of the magnetic thin film. For example, this power measuring apparatus takes power IV from the amplitude value of the second harmonic component.

This power measuring apparatus or the like is configured to take a signal component proportional to power by focusing attention on the fact that linear characteristics can be obtained without a bias magnetic field by taking advantage of a planar hall effect (PHE) or a phenomenon that in a ferromagnet of magnetic thin film, the electrical resistance value of the magnetic substance varies depending on the angle formed between the current and the magnetization (this power measuring apparatus is referred to as "the planar hole type power measuring apparatus" or "the PHE type power measuring apparatus").

Note that the magnetic field sensor employed here is an element for converting a change in an external magnetic field into an electrical signal, the element being configured such that a magnetic thin film such as a ferromagnetic thin film or a semiconductor thin film is patterned to flow current through the patterned magnetic thin film and the change in the external magnetic field is then converted as a change in voltage into the electrical signal.

However, the PHE type power measuring apparatus has to take the voltage output, to be detected across the magnetic thin film, in a direction orthogonal to the load current through a primary conductor. That is, the voltage has to be outputted on both the ends of the magnetic thin film in the width direction thereof. Thus, the PHE type power measuring apparatus needs to have a magnetic thin film increased in width to some extent, and thus cannot use a magnetic thin film reduced in width (which means here, e.g., a straight line shape or a rectangular shape that is thinner in the longitudinal direction). Furthermore, the PHE type power measuring apparatus has a geometric restriction that the magnetic thin film has to be formed of a bridge circuit. These mean that the PHE type power measuring apparatus can be installed with difficulty on a special line, such as the microstrip line or the coplanar line, which is employed in high-frequency circuits.

As other power measuring apparatuses for high-frequency use, a bolometer or precision measuring instrument may also available. However, such an instrument has a large complicated structure and is very expensive, so that the instrument cannot be used for power measurement or detection in each device or each facility.

CITATION LIST

Patent Literature

Patent Literature 1: Japanese Patent Application Laid-Open No. Hei. 11-274598

Non-Patent Literature

Non-Patent Literature 1: Thin film power meter using magnetic thin film (The Institute of Electrical Engineers of Japan, Journal of Technical Meeting of Magnetics Vol. MAG-05, No. 182).

SUMMARY

Technical Problem

The present invention was developed in view of the aforementioned problems. It is therefore an object of the present invention to provide a power measuring apparatus which has a simplified and inexpensive structure and which is suitable for power measurement of, for example, various types of circuits including high-frequency circuits or batteries.

Solution to Problem

A power measuring apparatus according to a first invention for measuring power to be consumed by a load connected to a power supply via a connection line, the power measuring apparatus being characterized by including:

a pair of connection ends for connecting to the power supply in parallel to the load;

a magnetic film part including a magnetic film;

a sensor element having a pair of sensor terminals provided on both ends of the magnetic film part, with one end of the sensor terminals connected to one of the connection ends, the sensor element being disposed adjacent to the connection line with an insulating layer interposed therebetween in such a manner that the longitudinal direction of the magnetic film part is generally in parallel to the direction of the connection line in which a current flows;

a measurement resistor with one end connected to the other end of the sensor terminals of the sensor element and the other end connected to the other of the connection ends; and a voltage detecting unit for measuring a voltage between measurement terminals, the measurement terminals being the respective sensor terminals.

This makes it possible to provide a more compact and inexpensive power meter than conventional integrating wattmeters. Furthermore, this power measuring apparatus well employs an elongated magnetic film because the apparatus outputs a voltage in the longitudinal direction of the magnetic film, and is thus also suitable for power measurement on a line such as the microstrip line that is often employed in high-frequency circuits. In this regard, this power measuring apparatus has a significant advantage over the PHE type power measuring apparatus that outputs a voltage in the width direction of the magnetic film and thus cannot have a magnetic film of a reduced width.

A power measuring apparatus according to a second invention for measuring power to be consumed by a load connected to a power supply via a connection line, the power measuring apparatus being characterized by including:

a pair of connection ends for connecting to the power supply in parallel to the load;

a magnetic film part with a first magnetic film and a second magnetic film each formed in a straight line and connected in series to each other, the first magnetic film and the second magnetic film having a connection point grounded;

a sensor element having a pair of sensor terminals provided on both ends of the magnetic film part, with one end of the sensor terminals connected to one of the connection ends, the sensor element being disposed adjacent to the connection line with an insulating layer interposed therebetween in such a manner that the longitudinal direction of the magnetic film part is generally in parallel to the direction of the connection line in which a current flows;

a measurement resistor with one end connected to the other end of the sensor terminals of the sensor element and the other end connected to the other of the connection ends; and a voltage detecting unit for measuring a voltage between measurement terminals, the measurement terminals being the respective sensor terminals.

The power measuring apparatus of the present invention can cancel out an offset caused by a magnetic field applied to the magnetic film and detect only a change in a magnetic field being measured.

A power measuring apparatus according to a third invention for measuring power to be consumed by a load connected to a power supply via a connection line, the power measuring apparatus being characterized by including:

a pair of connection ends for connecting to the power supply in parallel to the load;

a magnetic film part with a first magnetic film and a second magnetic film each formed in a straight line and having different operating points, the first magnetic film and the second magnetic film being connected in series to each other and having a connection point grounded;

a sensor element having a pair of sensor terminals provided on both ends of the magnetic film part, with one end of the sensor terminals connected to one of the connection ends, the sensor element being disposed adjacent to the connection line with an insulating layer interposed therebetween in such a manner that the longitudinal direction of the magnetic film part is generally in parallel to the direction of the connection line in which a current flows;

a measurement resistor with one end connected to the other end of the sensor terminals of the sensor element and the other end connected to the other of the connection ends; and a voltage detecting unit for measuring a voltage between measurement terminals, the respective measurement terminals being a point for connecting via a resistor between the one end and the other end of the sensor terminals and the grounded point.

The power measuring apparatus according to the third invention employs, in combination, sensor elements having different operating points, and thus eliminates the need for a bias magnetic field when used.

A power measuring apparatus according to a fourth invention for measuring power to be consumed by a load connected to a power supply via a connection line, the power measuring apparatus being characterized by including:

a pair of connection ends for connecting to the power supply in parallel to the load;

a magnetic film part including a magnetic film;

a sensor element having a pair of sensor terminals provided on both ends of the magnetic film part, with one end of the sensor terminals connected to one of the connection ends, the sensor element being disposed adjacent to the connection line with an insulating layer interposed therebetween in such a manner that the longitudinal direction of the magnetic film part is generally in parallel to the direction of the connection line in which a current flows;

a measurement resistor with one end connected to the other end of the sensor terminals of the sensor element and the other end connected to the other of the connection ends; and a voltage detecting unit which is connected, in parallel to the sensor element and the measurement resistor, with a series connection of an equivalent sensor resistor having a resistance value equivalent to that of the sensor element and an equivalent measurement resistor having the same resistance value as that of the measurement resistor, the voltage detecting unit detecting a potential between measurement terminals, the respective measurement terminals being a connection point between the sensor element and the measurement resistor and a connection point between the variable resistor and the equivalent resistor.

The power measuring apparatus according to the fourth invention employs the sensor element as one resistor element of a bridge circuit, so that an AC component can be cancelled out and a slight DC component superposed on the AC component can be detected with high accuracy.

A power measuring apparatus according to a fifth invention for measuring power to be consumed by a load connected to a power supply via a connection line, the power measuring apparatus being characterized by including:

a pair of connection ends for connecting to the power supply in parallel to the load;

a magnetic film part with a first magnetic film and a second magnetic film each formed in a straight line and connected in series to each other, the first magnetic film and the second magnetic film having a connection point grounded;

a sensor element having a pair of sensor terminals provided on both ends of the magnetic film part, with one end of the sensor terminals connected to one of the connection ends, the sensor element being disposed adjacent to the connection line with an insulating layer interposed therebetween in such a manner that the longitudinal direction of the magnetic film part is generally in parallel to the direction of the connection line in which a current flows;

a measurement resistor with one end connected to the other end of the sensor terminals of the sensor element and the other end connected to the other of the connection ends; and a voltage detecting unit wherein an equivalent measurement hand resistor having the same resistance value as that of the measurement resistor is connected both to the sensor terminal with the sensor element connected to the one of the connection ends and to the other end with the measurement resistor connected to the other of the connection ends, the voltage detecting unit detecting a potential between measurement terminals, the measurement terminals being the respective sensor terminals.

The fifth power measuring apparatus can cancel out an AC component and detect a slight DC component superposed on the AC component with high accuracy. The apparatus can also cancel out an offset caused by the magnetic film.

A power measuring apparatus according to a sixth invention for measuring power to be consumed by a load connected to a power supply via a connection line, the power measuring apparatus being characterized by including:

a pair of connection ends for connecting to the power supply in parallel to the load;

a magnetic film part with a first magnetic film and a second magnetic film each formed in a straight line and having different operating points, the first magnetic film and the second magnetic film being connected in series to each other and having a connection point grounded;

a sensor element having a pair of sensor terminals provided on both ends of the magnetic film part, with one end of the sensor terminals connected to one of the connection ends, the sensor element being disposed adjacent to the connection line with an insulating layer interposed therebetween in such a manner that the longitudinal direction of the magnetic film part is generally in parallel to the direction of the connection line in which a current flows;

a measurement resistor with one end connected to the other end of the sensor terminals of the sensor element and the other end connected to the other of the connection ends; and a voltage detecting unit wherein an equivalent measurement hand resistor having the same resistance value as that of the measurement resistor is connected both to the sensor terminal with the sensor element connected to the one of the connection ends and to the other end with the measurement resistor connected to the other of the connection ends, the voltage detecting unit detecting a potential between measurement terminals, the respective measurement terminals being a point for connecting between the sensor terminals via a resistor and the grounded point grounded.

The power measuring apparatus according to the sixth invention does not require a magnetic field for adjusting the operating point when used. In addition, the apparatus can cancel an AC component and detect a DC component superposed on the AC component with high accuracy.

A power measuring apparatus according to a seventh invention for measuring power to be consumed by a load connected to a power supply via a connection line, the power measuring apparatus being characterized by including:

a pair of connection ends for connecting to the power supply in parallel to the load;

a magnetic film part including a magnetic film;

a sensor element having a pair of sensor terminals provided on both ends of the magnetic film part, with one end of the sensor terminals connected to one of the connection ends, the sensor element being disposed adjacent to the connection line with an insulating layer interposed therebetween in such a manner that the longitudinal direction of the magnetic film part is generally in parallel to the direction of the connection line in which a current flows;

a measurement resistor with one end connected to the other end of the sensor terminals of the sensor element and the other end connected to the other of the connection ends; and a voltage detecting unit for measuring a voltage between measurement terminals, the measurement terminals being the respective ends perpendicular to the sensor terminals of the magnetic film part.

The power measuring apparatus according to the seventh invention can employ the planar hall effect as the sensor element.

BRIEF DESCRIPTION OF DRAWINGS

FIGS. 31(a) and 31(b) show that due to barber pole patterns of different inclinations, the magnetoresistance effect of a barber pole magnetic film exhibits the characteristics that would be made available when different bias magnetic fields, i.e., positive and negative ones are applied to the right and left of the magnetic film, respectively.

FIG. 47(a) is an image view showing a slight DC component, 47(b) is an image view showing the DC component amplified by a low-pass filter or an amplifier, and 47(c) is an image view showing that the output voltages across a dummy resistor VR and a magnetic thin film Rmr are subjected to differential amplification to thereby take only the DC voltage component.

DESCRIPTION OF EMBODIMENTS

Now, embodiments of the present invention will be described with reference to the drawings. First, a description will be made to the measurement principle of a power measuring apparatus of the present invention.

The power measuring apparatus according to the present invention takes advantage of magnetoresistance effect or a phenomenon that the electrical resistance value of a magnetic substance varies depending on the angle (orientation) which is formed between a current and magnetization (spontaneous magnetization) in a ferromagnet or a semiconductor. A description will be made more specifically with reference to FIG. 1. A current I is allowed to flow through a ferromagnet.

Figure 2:
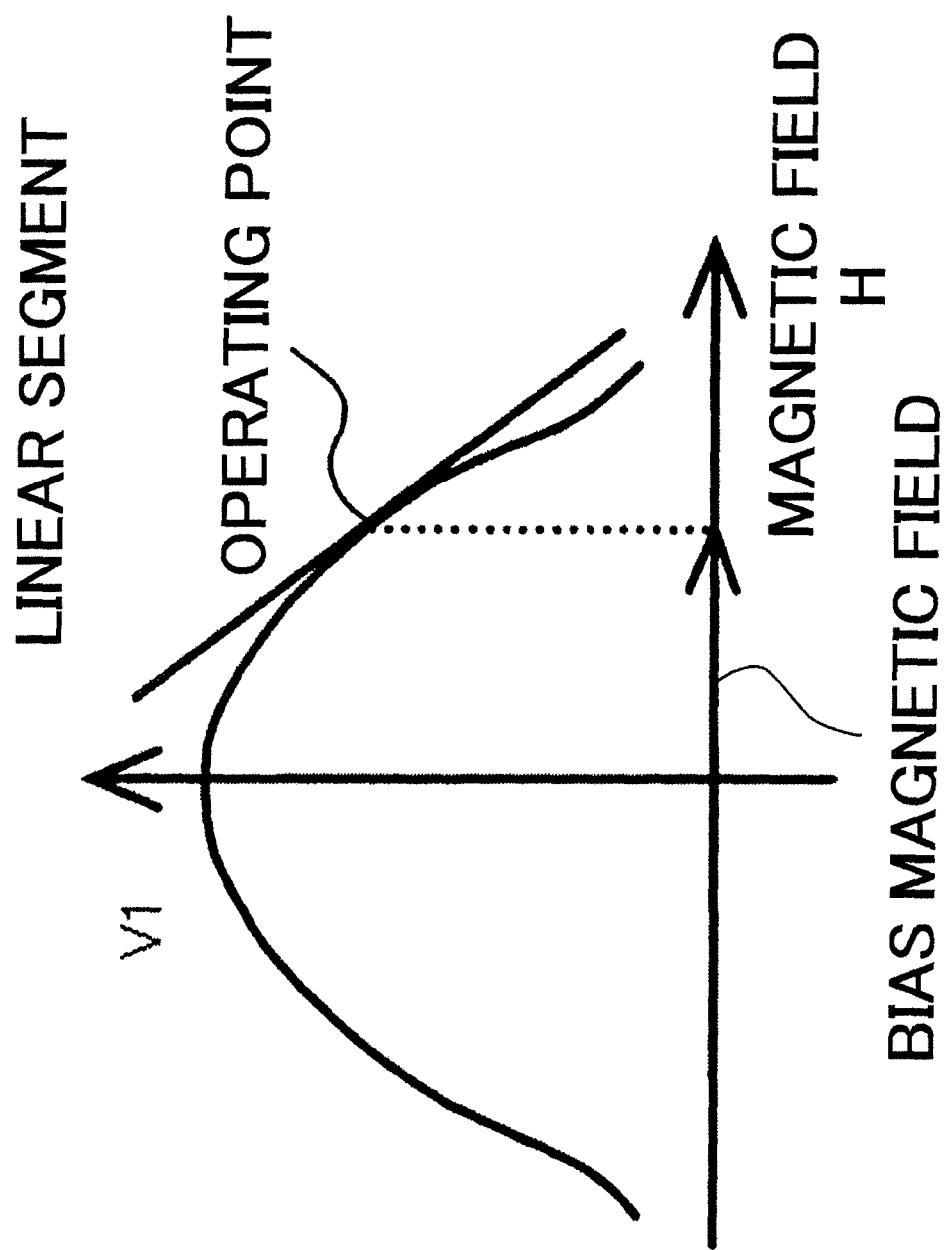
FIG. 2 is a graph showing that the magnetoresistance effect requires a bias magnetic field.

Here, when a magnetic field H acts upon a ferromagnet in a direction perpendicular to the direction of flow of the current I, the magnetic field H affects magnetization M so as to change the direction thereof. This in turn causes a voltage V1 in the direction of the current to be changed. For the magnetoresistance effect in the same direction as that of the current I through the ferromagnet, the output voltage V1 for the magnetic field H exhibits an even function as shown in FIG. 2. In FIG. 2, the horizontal axis represents the magnetic field acting upon the ferromagnet, while the vertical axis represents the voltage V1 across the ferromagnet in the direction of the current.

Figure 1:
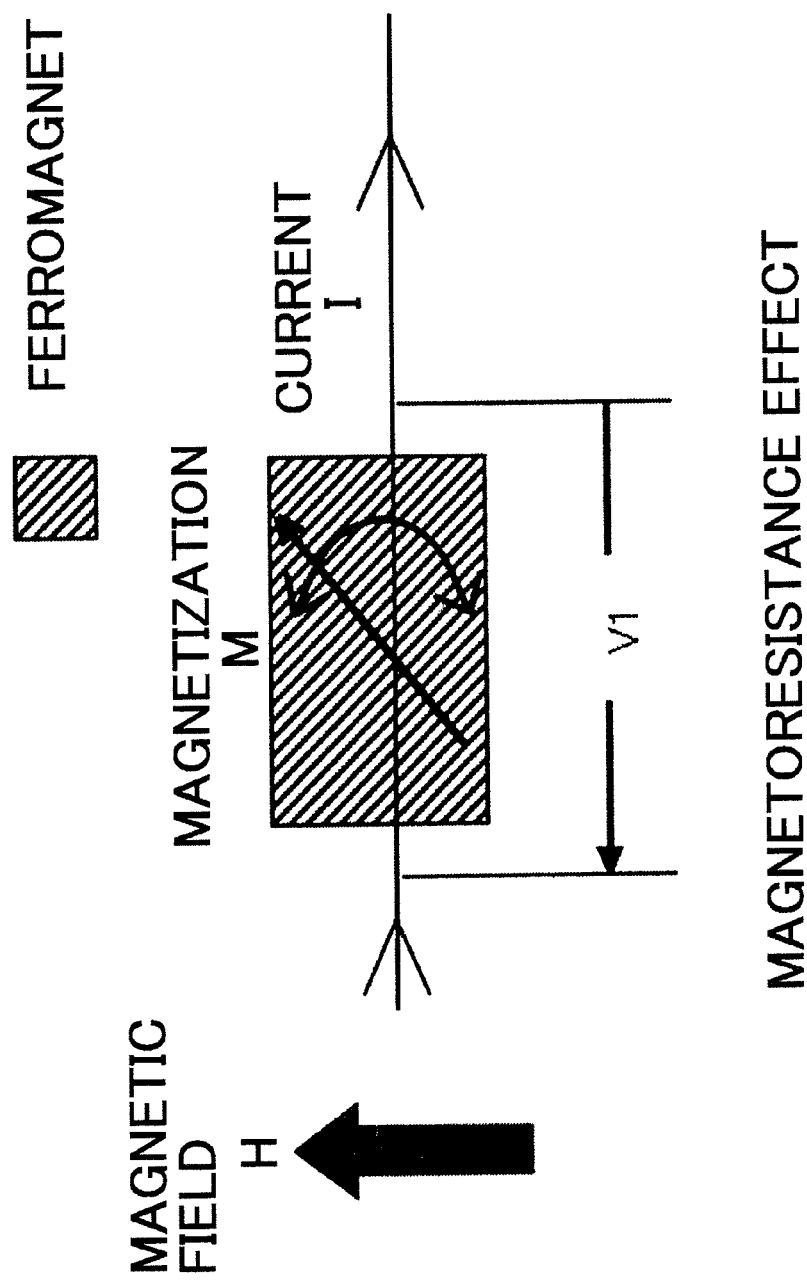
FIG. 1 is an explanatory schematic view showing magnetoresistance effect.

The horizontal axis is determined to be positive or negative depending on the direction. For example, assuming that the magnetic field H directed from bottom to top with respect to paper surface in FIG. 1 is in the positive direction, a magnetic field directed and acting from top to bottom in the figure is a negative magnetic field. The output voltage V1 exhibits a bell-shaped characteristic, so that a bias magnetic field has to be applied either in the positive or negative direction in order to obtain a linear characteristic. FIG. 2 shows that the bias magnetic field is applied in the positive direction, and the operating point has moved to an inclined segment of the bell-shaped characteristic curve.

<Measurement Principle and Basic Structure of the Magnetoresistive Type Power Measuring Apparatus (for AC Input)>

Now, a description will be made to the measurement principle of the power measuring apparatus of the present invention with reference to FIG. 3. This circuit is constructed as a parallel circuit in which a current from a power supply Vin is divided into currents I1 and I2. The current from the power supply Vin is allowed to flow in parallel both along a transport path in which the current I1 is allowed to flow through a primary conductor film Cu and a load R1 (Load R1) across which power consumption is measured and along a measurement path in which the current I2 is allowed to flow through a magnetic film 1a and a measurement resistor R2 (12). Note that it is assumed here that the measurement resistor R2 is sufficiently greater than the resistance value Rmr of the magnetic film 1a.

The current I1 flowing through the load R1 generates a magnetic field H around the primary conductor Cu when flowing through the primary conductor Cu. The magnetic field H causes magnetoresistance effect in the magnetic film 1a as well as a change in the voltage Vmr between the ends of the magnetic film. The output voltage Vmr is proportional to the power consumption in the load R1. It is thus possible to measure the power consumption in the load R1 by measuring the output voltage Vmr.

It can be explained as follows that the voltage Vmr between the ends of the magnetic film is representative of the power consumption in the load R1.

[Equation 1]

The magnetic field applied to the magnetic film:

$$H = \alpha I_1$$

The change in the electrical resistance of the magnetic film:

$$\Delta R_m = \beta H$$
$$= \beta(\alpha I_1)$$

The electrical resistance across the entire magnetic film:

$$R_m = R_{m0} + \Delta R_m$$
$$= R_{m0} + \alpha\beta I_1$$

The voltage in the longitudinal direction of the magnetic film:

$$V_{mr} = R_m I_2 = (R_{m0} + \Delta R_m)I_2 = (R_{m0} + \alpha\beta I_1)I_2$$

$$V_{in} = V_0 \sin\omega t$$

$$I_1 = \frac{V_0}{R_1}\sin(\omega t - \theta)$$

$$I_2 = \frac{V_0}{R_2}\sin\omega t$$

$$V_{mr} = (R_{m0} + \alpha\beta I_1)I_2$$
$$= \left(R_{m0} + \alpha\beta\frac{V_0}{R_1}\sin(\omega t - \theta)\right)\frac{V_0}{R_2}\sin\omega t$$
$$= \frac{R_{m0}V_0}{R_2}\sin\omega t + \alpha\beta\frac{V_0}{R_1}\sin(\omega t - \theta)\frac{V_0}{R_2}\sin\omega t$$
$$= \frac{R_{m0}V_0}{R_2}\sin\omega t + \alpha\beta\frac{V_0}{R_1}\frac{V_0}{R_2}\frac{1}{2}\{\cos\theta - \cos(2\omega t - \theta)\}$$
$$= \frac{R_{m0}V_0}{R_2}\sin\omega t - \alpha\beta\frac{V_0}{R_1}\frac{V_0}{R_2}\frac{1}{2}\cos(2\omega t - \theta) + \alpha\beta\frac{V_0}{R_1}\frac{V_0}{R_2}\frac{1}{2}\cos\theta$$
$$= \text{AC component} + \text{DC component}\left(k * \frac{V_0^2}{R_1}\cos\theta\right)$$

The final one of the calculation equations above represents the sum of an AC component and a DC component. That is, the AC voltage and the DC voltage are superposed to appear in the output voltage Vmr in the longitudinal direction of the magnetic film 1a. It is thus possible to measure the power consumption in the load R1 (P=I1*V1=V1²/R1) for an AC input by measuring only the DC voltage component in the longitudinal direction of the magnetic film 1a. Note that the DC component in the final equation above is proportional to (V1²/R1)cos θ. That is, measuring the DC component of Vmr is to measure the effective power including the power factor case.

Figure 3:
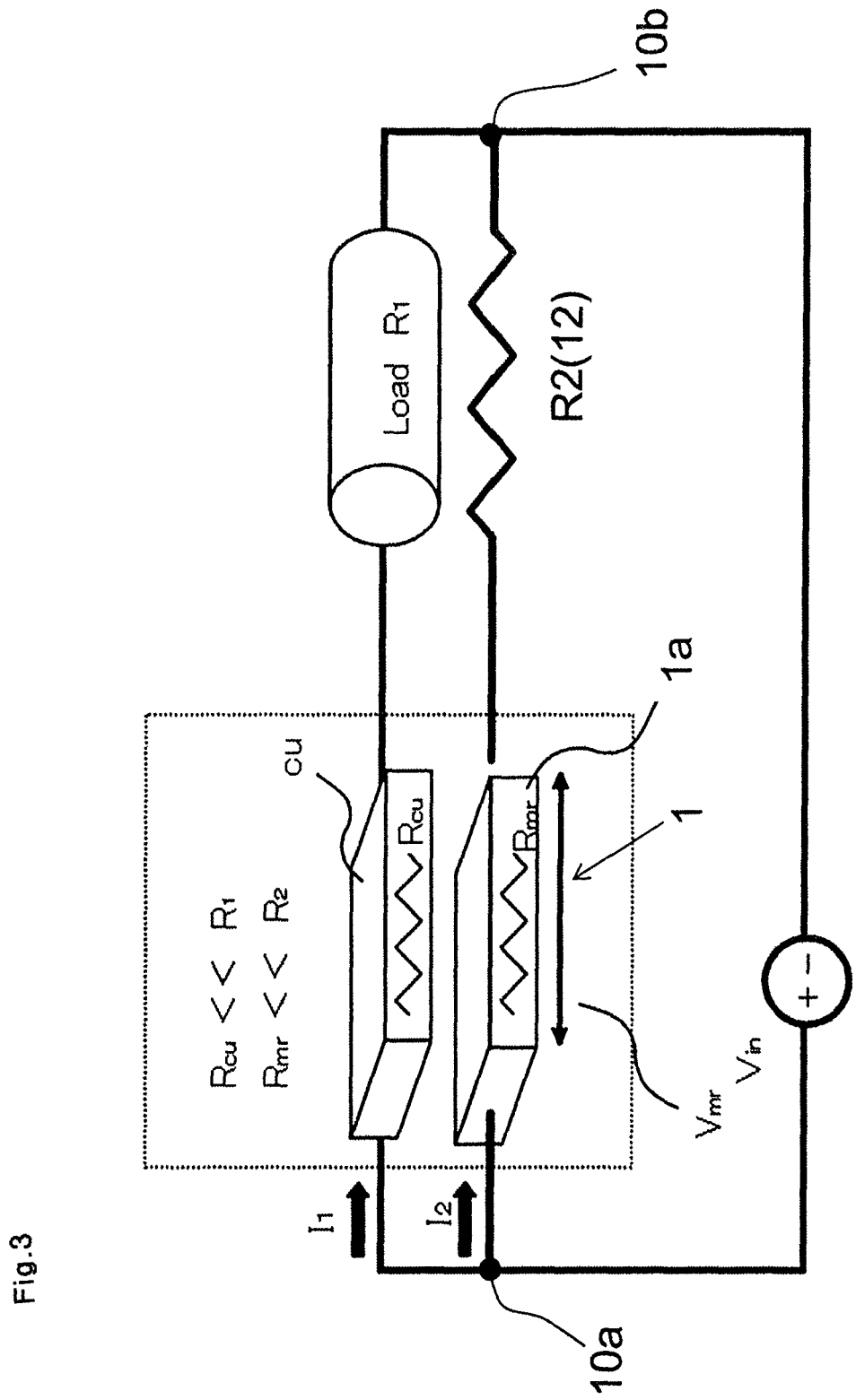
FIG. 3 shows the outline of the measurement principle of a power measuring apparatus of the magnetoresistive type.

Furthermore, in the view which illustrates the principle of the power measuring apparatus shown in FIG. 3, discussion will also be made to power measurement in the case where harmonics are contained in the AC voltage and current being applied to the load R1. Equation 2 below shows calculation equations for determining the output voltage Vmr when nth order harmonics are contained in V1 and I1 in Equation 1 above.

[Equation 2]

The magnetic field applied to the magnetic film:

$$H = \alpha I_1$$

The change in the electrical resistance of the magnetic film:

$$\Delta R_m = \beta H$$
$$= \beta(\alpha I_1)$$

The electrical resistance across the entire magnetic film:

$$R_m = R_{m0} + \Delta R_m$$
$$= R_{m0} + \alpha\beta I_1$$

The voltage in the longitudinal direction of the magnetic film:

$$V_{mr} = R_m I_2 = (R_{m0} + \Delta R_m)I_2 = (R_{m0} + \alpha\beta I_1)I_2$$

$$V_{in} = \sum_{n=1}^{\infty} V_{0n}\sin n\omega t$$

$$I_1 = \sum_{n=1}^{\infty} \frac{V_{0n}}{R_1}\sin(n\omega t - \theta_n)$$

$$I_2 = \sum_{n=1}^{\infty} \frac{V_{0n}}{R_1}\sin n\omega t$$

$$V_{mr} = (R_{m0} + \alpha\beta I_1)I_2$$
$$= \left(R_{m0} + \alpha\beta\sum_{n=1}^{\infty}\frac{V_{0n}}{R_1}\sin(n\omega t - \theta_n)\right)\cdot\sum_{m=1}^{\infty}\frac{V_{0m}}{R_2}\sin m\omega t -$$
$$R_{m0}\cdot\sum_{m=1}^{\infty}\frac{V_{0m}}{R_2}\sin m\omega t + \alpha\beta\sum_{n=1}^{\infty}\frac{V_{0n}}{R_1}\sin(n\omega t - \theta_n)\cdot$$
$$\sum_{m=1}^{\infty}\frac{V_{0m}}{R_2}\sin m\omega t$$
$$= R_{m0}\cdot\sum_{m=1}^{\infty}\frac{V_{0m}}{R_2}\sin m\omega t + \alpha\beta\sum_{n=1}^{\infty}\frac{V_{0n}}{R_1}\sin(n\omega t - \theta_n)\cdot$$
$$\frac{V_{0n}}{R_2}\sin n\omega t + \left[\alpha\beta\sum_{n=1}^{\infty}\frac{V_{0n}}{R_1}\sin(n\omega t - \theta_n)\cdot\sum_{m=1}^{\infty}\frac{V_{0m}}{R_2}\sin m\omega t\right]_{n\neq m}$$
$$= R_{m0}\cdot\sum_{m=1}^{\infty}\frac{V_{0m}}{R_2}\sin m\omega t + \alpha\beta\sum_{n=1}^{\infty}\frac{V_{0n}}{R_1}\frac{V_{0n}}{R_2}[\cos\theta_n - \cos(2n\omega t - \theta_n)] +$$
$$\left[\alpha\beta\sum_{n=1}^{\infty}\frac{V_{0n}}{R_1}\sin(n\omega t - \theta_n)\cdot\sum_{m=1}^{\infty}\frac{V_{0m}}{R_2}\sin m\omega t\right]_{n\neq m} - \text{AC component} +$$

$$\text{DC component}\left(k * \sum_{n=1}^{\infty}\frac{V_{0n}^2}{R_1}\cos\theta_n\right)$$

The final equation in Equation 2 is the sum of the AC component and the DC component of each frequency component. Thus, the power measuring apparatus according to the present invention is configured such that from a perspective of the measurement principle, the AC voltage and the DC voltage are superposed to appear in the output voltage Vmr in the longitudinal direction of the magnetic film 1a even when high frequencies are contained in the voltage and the current. At this time, the DC voltage component of the output voltage Vmr is a DC voltage or the total sum of a DC voltage proportional to the power consumption by a fundamental and a DC voltage proportional to the power consumption by harmonics.

Thus, the power measuring apparatus according to the present invention makes it possible to measure the power consumption in the load R1 (the effective power including the power factor) by measuring only the DC voltage across the magnetic film 1a in the longitudinal direction thereof even when the power supply contains harmonic components.

With reference to FIG. 3, briefly describing the power measuring apparatus based on the measurement principle mentioned above, the apparatus includes: a sensor element 1 with the magnetic film 1a; the measurement resistor R2; and a voltage detecting unit (not shown in FIG. 3) for measuring the voltage across the sensor element 1. Furthermore, the apparatus has a pair of connection ends (10a, 10b) for connecting these components to a transport circuit in which power is measured.

In the power measuring apparatus, signals to be detected are a DC voltage signal. Thus, it is possible to measure power consumption by employing a simple device such as a digital tester (DMM) as the voltage detecting unit. Furthermore, the DC voltage signal is essentially less susceptible to noises induced by high frequencies. Thus, it can be said that the power measuring apparatus is suitable for power measurement in high-frequency circuits. Furthermore, since the power measuring apparatus detects the voltage across the magnetic film in the longitudinal direction thereof (in the direction of current), an elongated magnetic film of a reduced width provides an increased output voltage (which provides a higher SNR).

Thus, the power measuring apparatus makes it easy to arrange a generally linear element in the shape of a line such as the microstrip line, the strip line, and the cosplanar line which are often used in the high-frequency circuit. In this regard, it can also be said that the power measuring apparatus is suitable for power measurement for high-frequency circuits in principle.

<Specific Configuration of the Magnetoresistive Type Power Measuring Apparatus and Measurement Results>

Figure 4:
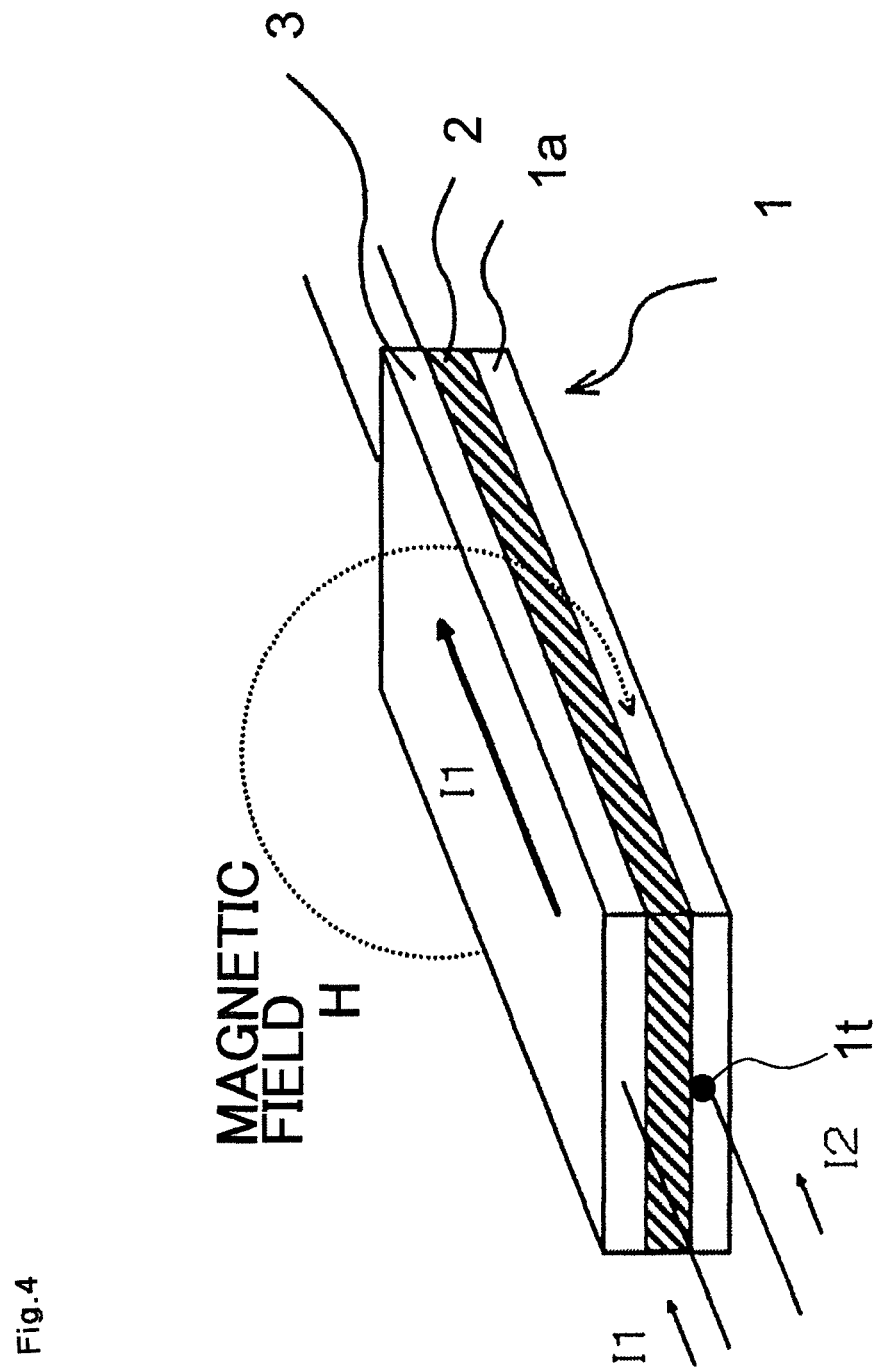
FIG. 4 is a generally perspective cross-sectional view illustrating a magnetic field sensor unit in the magnetoresistive type power measuring apparatus.

Now, a description will be made to AC power measurement by the magnetoresistance effect of the magnetic film in the power measuring apparatus of the present invention. FIG. 4 shows the sensor element 1 to be used for the power measuring apparatus. The sensor element 1 is made up of the magnetic film 1a, and sensor terminals 1t provided on both the shorter sides of the magnetic film 1a. Note that this drawing does not illustrate the sensor terminal 1t on the rear side. It is also acceptable to include a substrate which may be formed of an insulating material in order to hold the magnetic film 1a. FIG. 4 illustrates an integrated three-layer structure in which an insulating film 2 is interposed between a conductor film 3 equivalent to a connection line for flowing current therethrough to a load and the magnetic film 1a. The insulating film 2 is an insulating layer that is provided to bring the sensor element 1 into intimate contact with the connection line.

The magnetic field H is formed by the current I1 flowing through the conductor film 3. For example, the conductor film 3, the insulating film 2, and the magnetic film 1a are formed of copper Cu, polyimide substrate, and permalloy, respectively. Furthermore, referring to FIG. 5 which illustrates a sectional detailed example of the sensor element 1, the permalloy film 1a is formed as a magnetic film on top of a glass substrate 4 and then the copper film 3s (3sa, 3sb) is formed so as to connect to both ends of the permalloy film 1a. The polyimide substrate 2 is formed on top of a surface of the permalloy film 1a and the copper film 3s, and then the conductor film 3 is formed on top of the surface of the polyimide substrate 2. The current I2 (see FIG. 3) that is in phase with the current I1 flowing from left to right through the conductor film 3 disposed on the upper side flows through the copper film 3sa. This current flows from the left to right end through the magnetic film 1a (permalloy) into the copper film 3sb.

The surface of the conductor film 1a toward the polyimide substrate 2 (the upper surface in the drawing) may be placed on a line, such as the microstrip line or the coplanar line, through which a high-frequency current (AC) flows. This causes the magnetic field H generated by the line to act upon the magnetic film (equivalent to the magnetic film 1a of FIG. 4), allowing for determining power as electrical output (the DC power component) by the magnetoresistance effect of the magnetic film.

Figure 5:
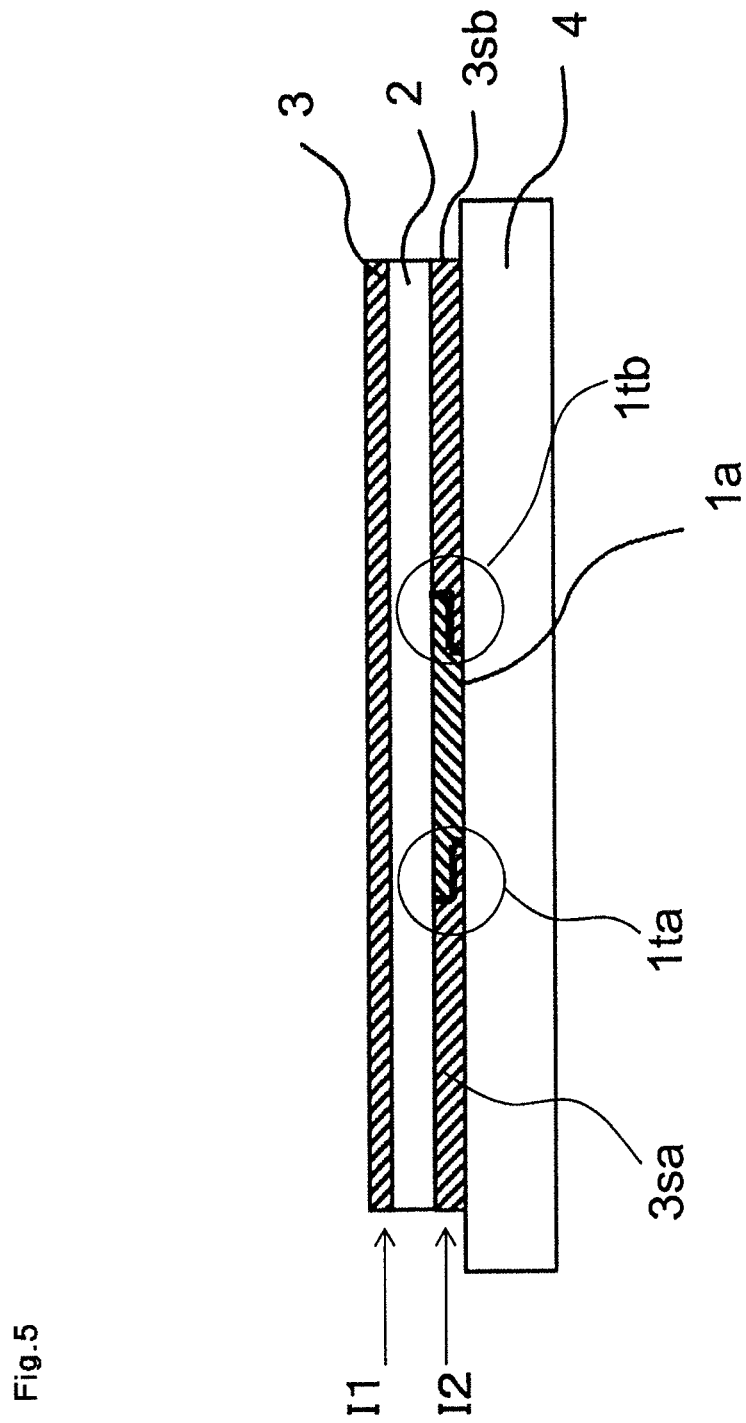
FIG. 5 is a cross-sectional view illustrating an insulating portion and a magnetic film of the magnetic field sensor of FIG. 4.
Figure 25A:
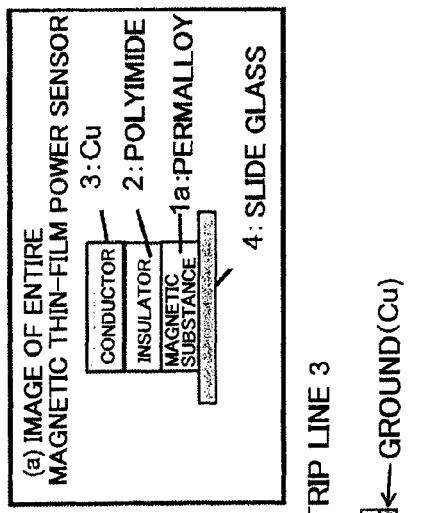
FIG. 25(a) is a schematic view similar to FIG. 5; 25(b) is a schematic view showing the power measuring apparatus used for measuring a microstrip line; and 25(c) is a schematic view showing the power measuring apparatus used for measuring a coplanar line.
Figure 25B:
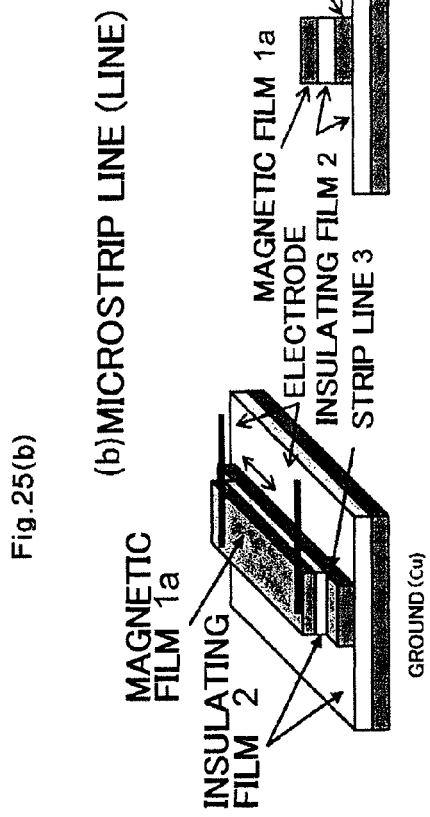
Figure 25C:
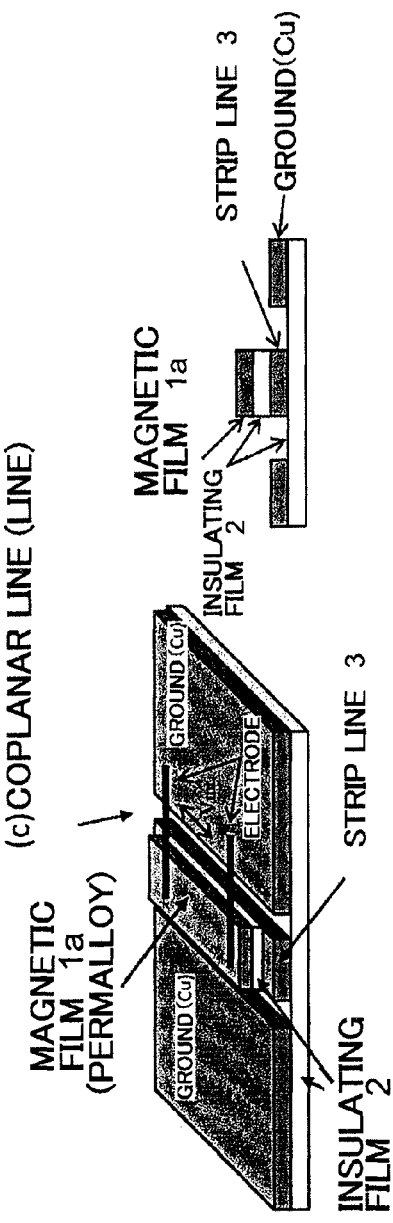

FIG. 25(a) is a schematic view identical to FIG. 5, FIG. 25(b) is a schematic view illustrating the power measuring apparatus used for measuring a microstrip line, and FIG. 25(c) is a schematic view illustrating the power measuring apparatus used for measuring a coplanar line. Note that in FIG. 25, the same reference numerals as those of FIG. 5 refer to the same components. Referring to both FIGS. 25(a) and (b), the current I1 flows through a strip line 3 and the current I2 flows through the magnetic film 1a. Furthermore, the center strip line 3 or a signal line of the microstrip line and the coplanar line also serves as the conductor film 3 on which the sensor element 1 of the power measuring apparatus is disposed. That is, the power measuring apparatus can also be formed integrally with part of the microstrip line or the coplanar line.

[Measurement Circuit 1]

FIG. 6(a) illustrates the configuration of the magnetoresistive type power measuring apparatus in conjunction with a circuit 20 for which power is to be measured. The circuit 20 for which power was to be measured was configured to have a power supply that was made up of a function generator 22 and an amplifier 24. There is provided a load R1. Note that a connection line connects between the load and the power supply. On the connection line, the portion where the sensor unit of the power measuring apparatus is provided in a prescribed manner was denoted by a connection line Rcu. The function generator 22 provides a signal, which is then amplified by the amplifier (DC amplifier) 24, thus serving as an AC power supply.

The power measuring apparatus 15 includes the sensor element 1, the measurement resistor 12 (R2), and a voltage detecting unit 28. Furthermore, the power measuring apparatus 15 has a pair of connection ends 10 (10a, 10b) for connecting in parallel to the power supply of the circuit for which power is to be measured. The connection ends 10 may be coupled to anywhere in the circuit for which power is to be measured so long as the connection ends can be connected in parallel to the load R1 with respect to the power supply. Between the connection ends, connected in series are the sensor element 1 including the magnetic film and the measurement resistor 12 (R2). The terminals of the measurement resistor 12 are denoted by symbol 12*a* and 12*b*, respectively.

Figure 6:
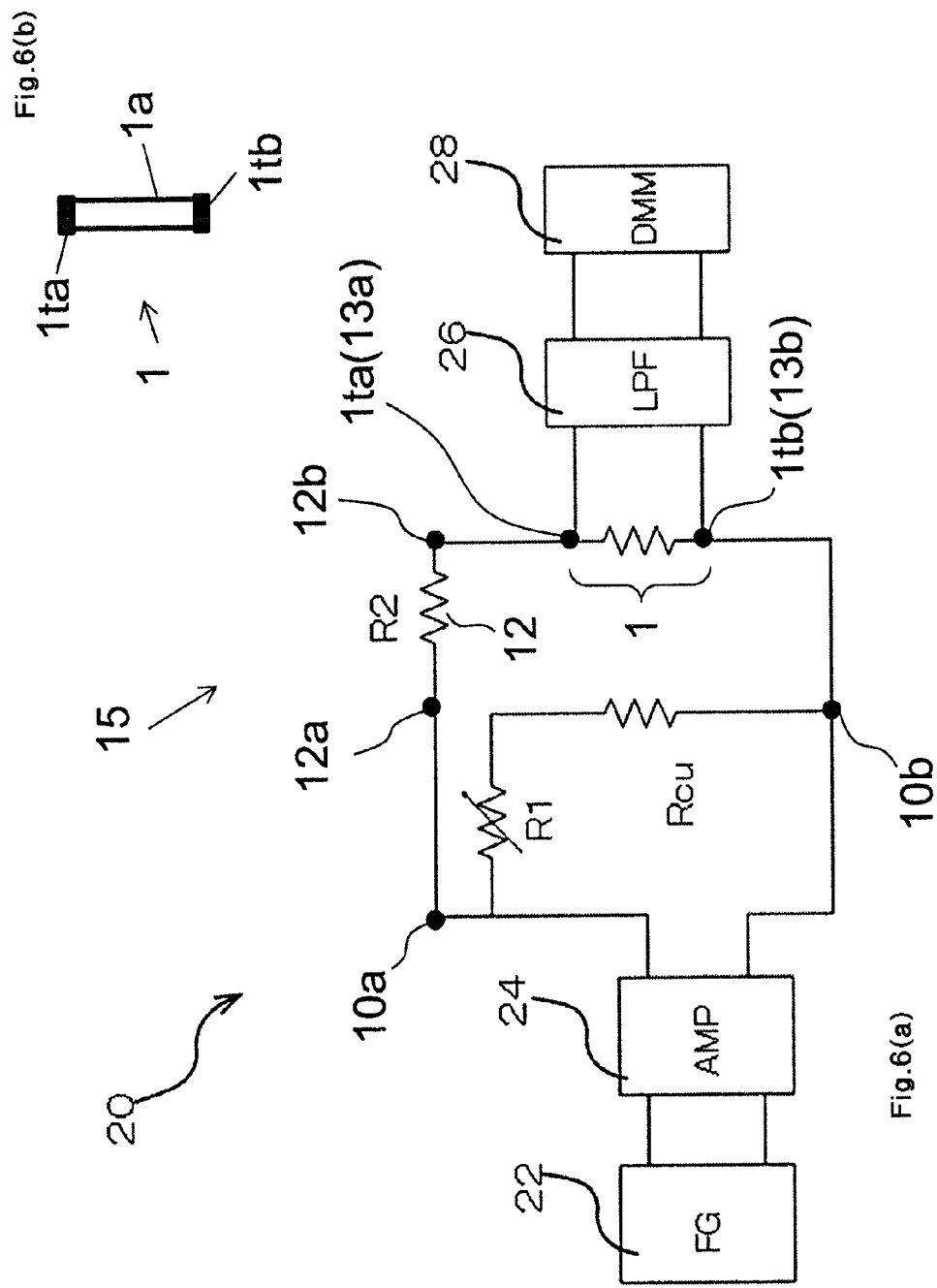
FIGS. 6(a) and 6(b) show an example of a measurement circuit of the magnetoresistive type power measuring apparatus.

The sensor element 1 has a pair of the sensor terminals 1*ta* and 1*tb* and is provided with the magnetic film 1*a* formed between the sensor terminals. FIG. 6(*b*) is an enlarged view illustrating the sensor element 1. That is, the sensor terminals are provided on the respective mutually opposing shorter sides of the strip-shaped magnetic film. Note that "the sensor terminal it" will be referred to when describing both the sensor terminals without a distinction therebetween, while "the sensor terminal 1*ta*" or "the sensor terminal 1*tb*" will be referred to when describing the sensor terminals separately. Furthermore, the same notation will be employed for the terminals of the connection ends 10 and the measurement resistor 12.

One end 1*tb* of the sensor terminals is connected to one connection end 10*b*. The sensor element 1 is disposed on the connection line of the circuit, for which power is measured, so that the longitudinal direction of the magnetic film is aligned in the same direction as that of the current flowing through the connection line. At this time, there is formed an insulating layer between the magnetic film of the sensor element 1 and the connection line. This is done so as not to allow the current flowing through the connection line to flow into the magnetic film.

The magnetic film exhibits magnetoresistance effect when being subjected to the effect of the magnetic field caused by the current flowing through the connection line. Since the magnetoresistance effect can be thought to be proportional to the strength of the acting magnetic field, the sensor element is disposed preferably as close to the connection line as possible.

The other end 1*ta* of the sensor element 1 is connected to one end 12*b* of the measurement resistor 12. On the other hand, the other end 12*a* of the measurement resistor 12 is connected to the other 10*a* of the connection ends 10. In this manner, from the one end 10*b* to the other end 10*a* of the connection ends 10, the sensor element 1 and the measurement resistor 12 are connected in series. Furthermore, the respective sensor terminals (1*ta*, 1*tb*) are a measurement terminal 13 (13*a*, 13*b*), so that the voltage between the measurement terminals 13 is measured by the voltage detecting unit 28. Here, since what is measured by the voltage detecting unit 28 and effective as power is the DC voltage, there is coupled a low-pass filter 26 between the measurement terminals 13. Note that the low-pass filter can be provided in any electrode measuring apparatus according to the present invention.

The low-pass filter 26 cuts high-frequency components of a voltage. The DC component of an output voltage with high frequencies cut by the low-pass filter 26 is measured by a digital tester 28 (DMM=digital multimeter). That is, the voltage detecting unit 28 is made up of the DMM. Note that it is needless to say that the voltage detecting unit 28 may detect voltages by other means than the DMM.

Note that for the magnetoresistive type, the magnetic film of the sensor element 1 is preferably strip-shaped. This is because allowing a current to flow in the longitudinal direction makes it possible to provide an increased change in resistance. However, this is not to exclude other shapes such as square, rhombic, circular, or elliptical shapes or bent shapes. This is because the magnetic film needs to be consistent with the shape of the connection line for the current flowing through the load. That is, as used herein, the expression "strip-shaped" may be construed as the notion that encompasses the shapes mentioned above.

Furthermore, this specification describes that the sensor terminals are provided on the respective mutually opposing shorter sides of the strip-shaped magnetic film. However, any sensor terminals that are provided in order to allow a current to flow substantially in the longitudinal direction of the magnetic film could be provided anywhere other than the mutually opposing shorter sides of the strip-shaped magnetic film. This is because depending on the shape of the connection line for allowing a current to flow through the load, the sensor terminals may be provided away from the shorter sides of the magnetic film.

Furthermore, as shown in FIG. 2, to achieve a linear operating point for magnetoresistance effect, a DC bias magnetic field needs to be applied in a direction perpendicular to the longitudinal direction of the sensor element. The DC bias magnetic field is referred to as the operating point adjustment bias magnetic field, and means for producing the operating point adjustment bias magnetic field is referred to as the operating point adjustment bias magnetic field applying means. The operating point adjustment bias magnetic field applying means can be formed of a permanent magnet or an electromagnet or the like.

Note that any power measuring apparatus of the present invention can be provided with the operating point adjustment bias magnetic field applying means except for the case where the operating point adjustment bias magnetic field is not required as for a barber pole magnetic film or a magnetization easy axis tilted magnetic film, to be discussed later.

Figure 7:
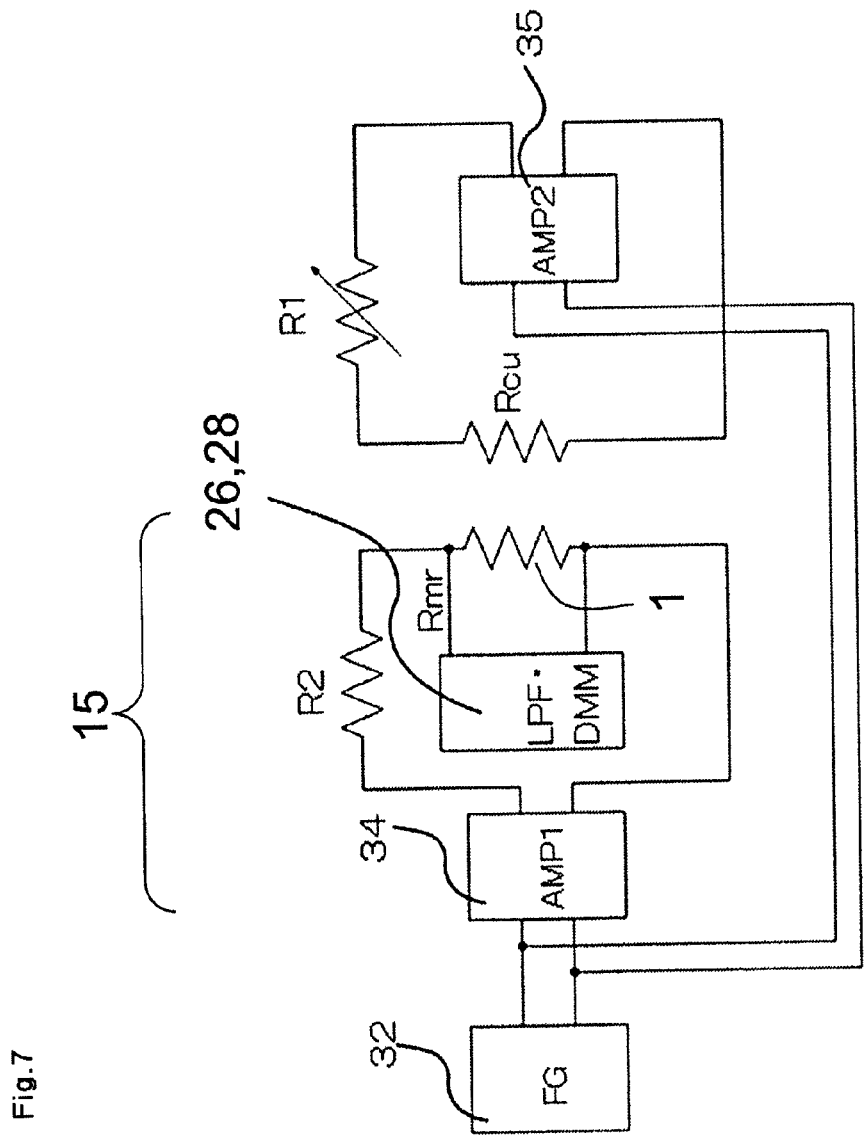
FIG. 7 is a view showing an improved example of the measurement circuit of FIG. 6.

FIG. 7 illustrates another configuration of the power measuring apparatus 15. Referring to FIG. 7, a signal from a function generator 32 is supplied to two amplifiers (DC amplifiers) 34 and 35 so that a change in the offset of the amplifier 35 (AMP 2) will not affect the output voltage from the sensor element 1. The amplifier 34 (AMP 1) and the amplifier 35 (AMP 2) are supplied with in-phase AC outputs.

The current allowed to flow through the power measuring apparatus 15 of the present invention must be at the same frequency as that of the current flowing through the circuit for which power is to be measured. Referring to FIG. 6, this condition was met because the power measuring apparatus was connected at the connection ends 10 in parallel to the circuit for which power is to be measured. However, the power measuring apparatus may not be coupled to the same power supply to which the circuit for which power is to be measured (the transport path) is connected. Even in this case, the power measuring apparatus itself can have a power supply so long as a current can be allowed to flow at the same frequency as that of a current flowing through the transport path. This power supply may be a voltage source or alternatively a current source.

Note that Equation 3 below shows the reason that a current in phase with the current flowing through the circuit for which power is to be measured needs to flow through the magnetic film in the power measuring apparatus of the present invention. Equation 3 can be understood from the fact that the output voltage includes only an AC component if input voltages are not at the same frequency ($\omega_1$ not equal to $\omega_2$). Note that like Equations 1 and 2, Equation 3 is based on the power measurement principle of FIG. 3.

[Equation 3]

The magnetic field applied to the magnetic film:

$$H = \alpha I_1$$

The change in the electrical resistance of the magnetic film:

$$\Delta R_m = \beta H$$
$$= \beta(\alpha I_1)$$

The electrical resistance across the entire magnetic film:

$$R_m = R_{m0} + \Delta R_m$$
$$= R_{m0} + \alpha\beta I_1$$

The voltage in the longitudinal direction of the magnetic film:

$$V_{mr} = R_m I_2 = (R_{m0} + \Delta R_m)I_2 = (R_{m0} + \alpha\beta I_1)I_2$$

In the case of $V_1, V_2$ are different frequency $$V_1 = V_{01}\sin\omega_1 t$$

$$V_2 = V_{02}\sin\omega_2 t$$

$$I_1 = \frac{V_{01}}{R_1}\sin(\omega_1 t - \theta_1),$$

$$I_{02} = \frac{V_{02}}{R_2}\sin\omega_2 t$$

$$V_{mr} = (R_{m0} + \alpha\beta I_1)I_2$$
$$= \left(R_{m0} + \alpha\beta\frac{V_{01}}{R_1}\sin(\omega_1 t - \theta_1)\right)\frac{V_{02}}{R_2}\sin\omega_2 t$$
$$= \frac{R_{m0}V_{02}}{R_2}\sin\omega_2 t + \alpha\beta\frac{V_{01}}{R_1}\frac{V_{02}}{R_2}\sin(\omega_1 t - \theta_1)\sin\omega_2 t$$
$$= \frac{R_{m0}V_{02}}{R_2}\sin\omega_2 t + \alpha\beta\frac{V_{01}}{R_1}\frac{V_{02}}{R_2}\frac{1}{2}\cos((\omega_1 - \omega_2)t + \theta_1) -$$
$$\alpha\beta\frac{V_{01}}{R_1}\frac{V_{02}}{R_2}\frac{1}{2}\cos((\omega_1 + \omega_2)t - \theta_1)$$
$$= \text{AC compornentonly}$$

Furthermore, in the configuration shown in FIG. 7, it is the same as that of FIG. 6 that the high-frequency components of the output voltage from the magnetic film are cut by the low-pass filter 26 and the DC component of the output voltage is measured by the digital tester 28.

Figure 8:
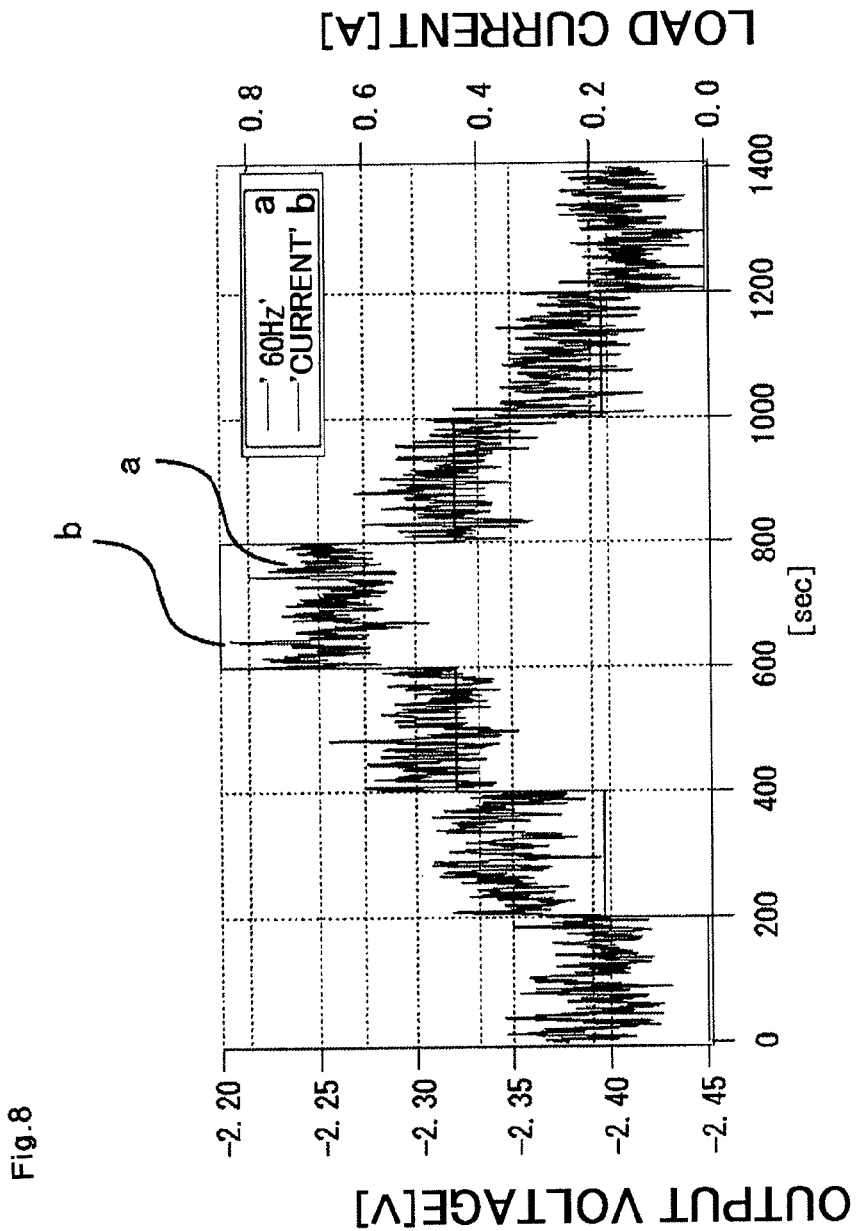
FIG. 8 shows measurement results provided by the measurement circuit of FIG. 7.
Figure 9A:
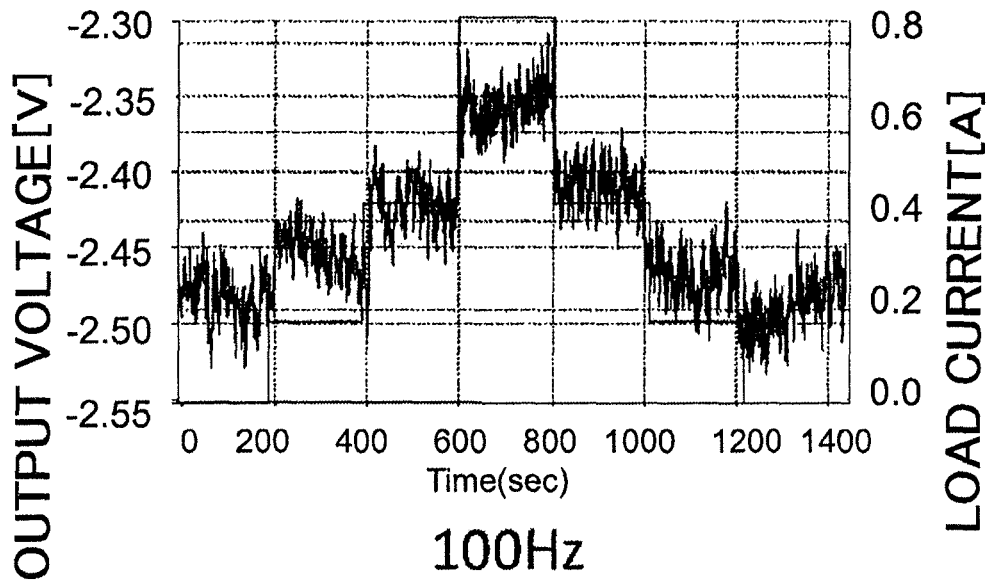
FIGS. 9(a) and 9(b) show other measurement results than those of FIG. 8.
Figure 9B:
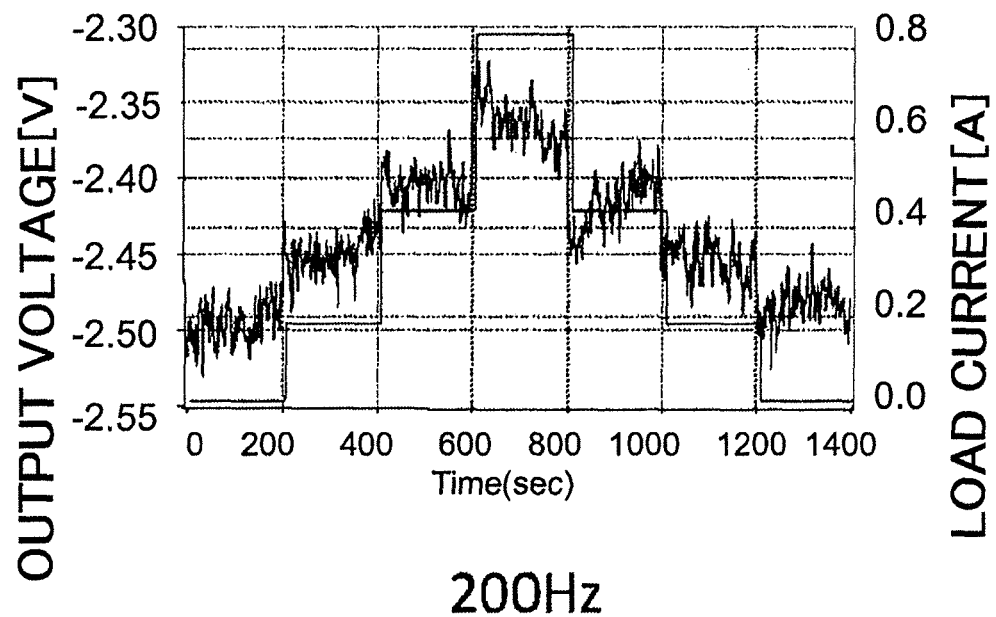
Figure 10:
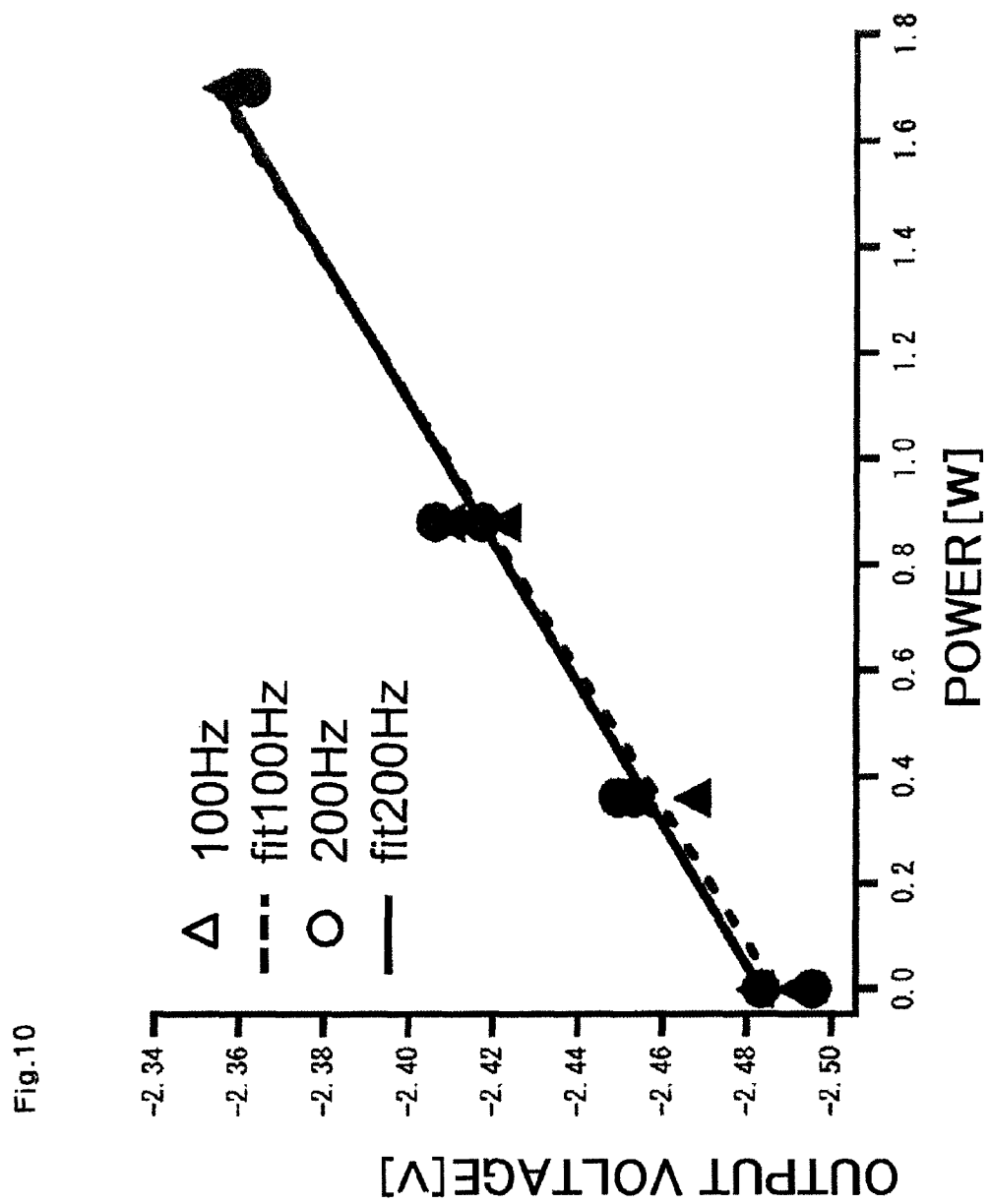
FIG. 10 shows other measurement results than those of FIG. 8.

The power measurement results obtained by the configuration of FIG. 7 are shown in FIG. 8 to FIG. 10. FIGS. 8 and 9 plot the results of measurements of the output voltage from the sensor element 1 with a supply voltage of an effective value 2.0 V from an AC power supply of 60 Hz. The measurements were carried out while the load R1 was varied every 200 seconds from infinity (open) to 10 ohms, 3.9 ohms, and 2 ohms and then from 2 ohms to 3.9 ohms, 10 ohms, and infinity (open). The horizontal axis represents the time. However, it substantially represents the magnitude of the load resistor. The left vertical axis represents the output voltage from the digital tester 28, and the right vertical axis represents the value of the current flowing through the load.

Outputs oscillating in the direction of the vertical axis are an output voltage, which is denoted by symbol "a." The lower the resistance becomes, the more the current flows and the more the load consumes power. The output voltage "a" increases or decreases depending on the change in resistance. Furthermore, the current "b" flowing through the load is indicated at generally the same position as the output voltage "a." Since the right and left vertical axes are both linear, it can be seen that the output voltage "a" proportional to the current flowing through the load (i.e., power consumption) is obtained. Note that the resistance values of each resistor are R1 approximately equal to 150 ohms, Rcu<<1, and R2=4.7 kilo ohms, and a low-pass filter 36 has a performance of a 80 dB gain (DC response).

Now, FIG. 9 shows the results of measurements provided by varying the frequency of the supply voltage. FIG. 9(a) shows the measurement results obtained by the supply voltage at a frequency of 100 Hz, FIG. 9(b) shows those at 200 Hz. In both the figures, the horizontal axis represents the time (substantially the resistance value), the left vertical axis representing the output voltage, and the right vertical axis representing the current flowing through the load, this case being the same as with FIG. 8. It is understood that at any frequency, the output voltage varies in response to the power consumption varied in a step-wise manner.

FIG. 10 is a graph representing the relationship between the power consumption and the output voltage while the average value of output voltages is calculated over the time interval of each frequency (i.e., the selected resistance value of the load). The horizontal axis represents the power consumption, and the vertical axis represents each average value of output voltages. From this graph, it can be seen that the output voltage proportional to the power consumption is obtained with good reproducibility. Note that the output voltages being different at each frequency with power consumption equal to zero [W] are thought to be due to a measurement-by-measurement change in the offset of the amplifier 35 (AMP2).

<Power Measuring Apparatus for Every Arbitrary Nth Order Harmonic (Applicable to the Magnetoresistive Type, the Planar Hall-Effect Type (PHE Type), and the Hall-Effect Type Power Measuring Apparatuses)>

As described above, in the power measuring apparatus that takes advantage of magnetoresistance effect, the AC voltage component and the DC voltage component are superposed to be outputted to the sensor element, and of the components, the DC voltage component is detected by the voltage detecting unit such as the DMM. On the other hand, the output signal is detected by the PHE type power measuring apparatus or a power measuring apparatus employing a thin-film element such as a power measuring apparatus taking advantage of a semiconductor thin film (also referred to as the "thin-film type power measuring apparatus"), and is a DC voltage.

As is obvious from Equation 2 above, it can be seen that when nth order harmonics are contained in the supply voltage, the DC voltage component of the output voltage signal Vmr is the total sum of the effective power consumptions (including the power factor) of each of the nth order harmonics. Thus, in the case of the power measuring apparatus of the present invention, only the DC voltage of the sensor element has to be measured even for a power supply containing nth order harmonics in order to enable the measurement of the total power consumption of each corresponding high frequency. This will be described in more detail below.

Figure 11:
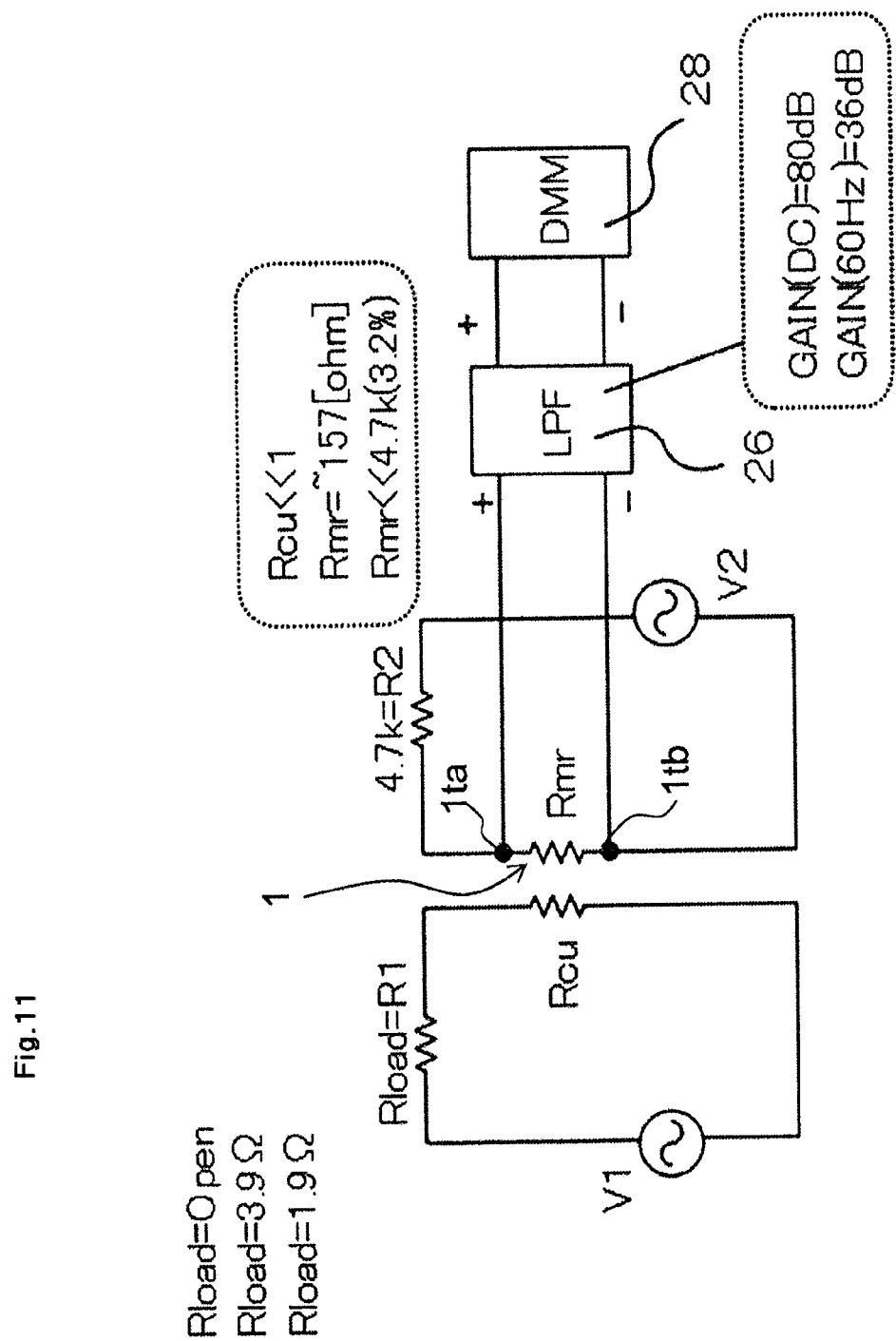
FIG. 11 shows an example of a measurement circuit for demonstrating the adequacy of an nth order harmonic measurement by the power measuring apparatus.

FIG. 11 illustrates the measurement circuit that was used for a demonstration. Note that the same reference numerals and symbols as those of FIG. 3 denote the same components. First, an AC power supply V1 is connected to the load resistor (RLoad=R1), with the result that a current flows therethrough. This current also flows through a conductor film Rcu that is a connection line. Furthermore, on the side of the power measuring apparatus, the high-frequency components of the output voltage from the sensor element 1 (of a resistance of Rmr) are cut off by the low-pass filter 26. Here, those components equal to or greater than the minimum oscillation frequency in the power supply V1 are cut off. The output voltage with the high-frequency components cut off by the low-pass filter 26 is measured by the digital tester 28 (DMM=digital multimeter) for the DC component. Furthermore, the sensor element 1 is supplied with a current from a power supply V2. This allows a current to flow through the sensor unit at a frequency different from the frequency of a current flowing through a circuit for which power is to be measured.

Figure 12:
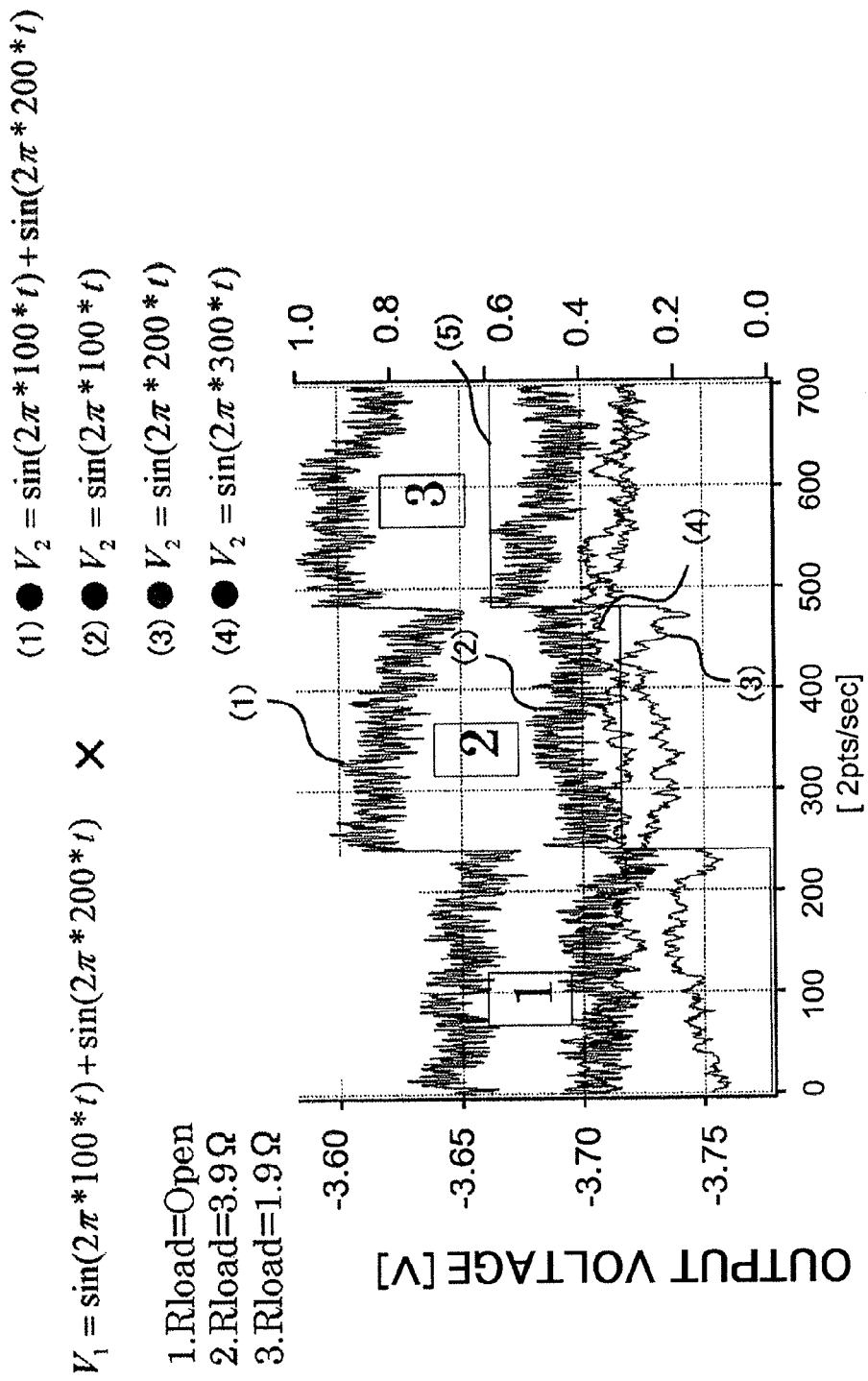
FIG. 12 shows measurement results provided by the measurement circuit of FIG. 11.

FIG. 12 shows the results of the measurements of the output voltage by the DMM 28 in the measurement circuit of FIG. 11. First, in the circuit to be measured, as shown on the upper left in FIG. 12, the power supply V1 contains a 100 Hz component and a 200 Hz component, which have an equal magnitude and are superposed upon each other (represented by "100 Hz+200 Hz"). That is, FIG. 12 shows an example of measurement of power consumption using a supply voltage that contains two frequency components of 100 Hz and 200 Hz.

On the other hand, the load resistor RLoad was switched over to open (=infinity), 3.9 ohms, and 1.9 ohms at predetermined time intervals. The current determined by the supply voltage and the load flew through the load Rload. On the other hand, on the side of the power measuring apparatus, the signals prepared for the power supply V2 were (1) 100 Hz+200 Hz, (2) 100 Hz, (3) 200 Hz, and (4) 300 Hz, allowing a current to flow between the sensor terminals (1ta, 1tb) of the sensor element 1.

In FIG. 12, the horizontal axis represents the time, the left vertical axis represents the detected voltage by the power measuring apparatus (the measured value by the DMM 28 of FIG. 11), and the right vertical axis represents the current flowing through the load. The horizontal axis directly represents the time, but substantially represents the resistance value of the load in the circuit for which power is to be measured because the resistance was switched over in sequence. Note that the regions with the load being infinity, 3.9 ohms, and 1.9 ohms are denoted by numbers "1," "2," and "3," respectively, which are each indicated in a square box. Since the current flowing through the load increases as the load decreases, power consumption increases. Furthermore, the line denoted by symbol (5) in FIG. 12 indicates the current flowing through the load, and the current increases in a stepwise manner depending on the respective regions.

It can be seen from FIG. 12 that the measured voltage values (the vertical axis) increase as power consumption increases across the load resistor RLoad with the current allowed to flow through the sensor element at (1) 100 Hz+200 Hz, (2) 100 Hz, and (3) 200 Hz. On the other hand, at (4) 300 Hz, the measured voltage value does not increase. That is, it can be seen that the 300 Hz component not supplied to the sensor element as a current and not contained in the (100 Hz+200 Hz) signal component is not detected even when the current is allowed to flow through the sensor element. It can be thus seen that the frequency component not available at the power supply on the side for which power consumption is to be measured is not outputted as a DC component in the power measuring apparatus according to the present invention.

It is also seen that the input current to the sensor element contains generally the same level of noise at (1) 100 Hz+200 Hz and (2) 100 Hz, but a slightly reduced level of noise at (3) 200 Hz and a further reduced level of noise at (4) 300 Hz. It can be thus seen that the power measuring apparatus is suitable all the more for high-frequency power measurement. Note that offset voltages and the variations thereof are estimated to be affected by the measuring device.

Figures 13A, 13B:
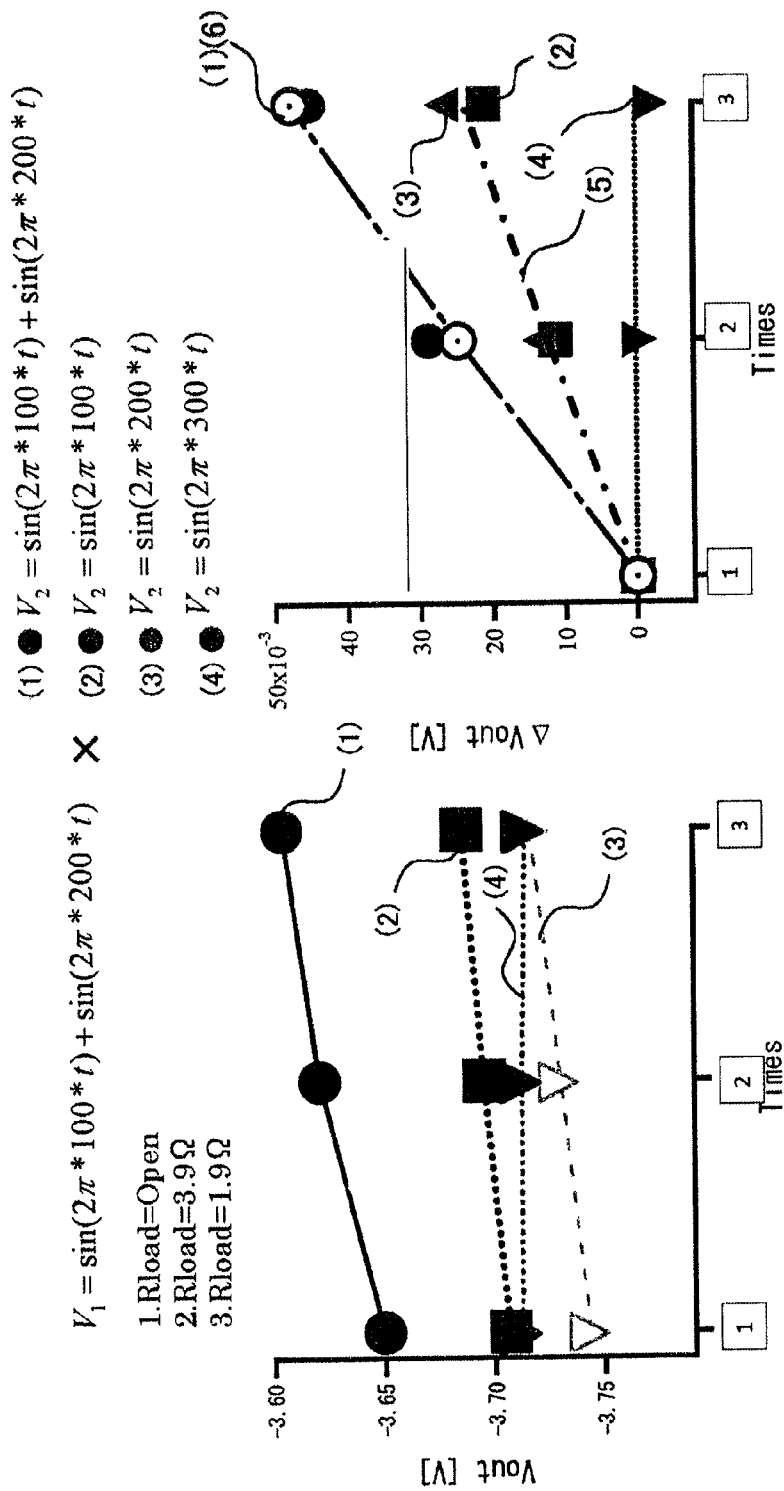
FIG. 13(a) is a graph showing a summary of the measurement results of FIG. 12.
FIG. 13(b) is a rewritten graph showing a change in V2 output with respect to zero watt consumption.

FIG. 13(*a*) is a graph showing a summary of the measurement results of FIG. 12 or the results provided by the measurement system of FIG. 11. The vertical axis represents the output voltage from the power measuring apparatus, and the horizontal axis represents the time (substantially, the resistance value of the load). Average values were plotted for the respective time (the resistance value of the load).

FIG. 13(*b*) shows the amounts of changes in voltage measured by the power measuring apparatus which were rewritten with respect to a zero W consumption. The horizontal axis represents the time (substantially, the resistance value of the load), and the vertical axis represents the voltage. As can be seen from FIG. 13(*b*), the measurement results of the currents allowed to flow through the sensor element at (2) 100 Hz and (3) 200 Hz have a good consistency and a good linearity. Furthermore, it can be seen that the measurement result at (1) 100 Hz+200 Hz and the sum of the measured values at (6) 100 Hz and 200 Hz have a good consistency. This shows that the power measuring apparatus is capable of measuring power consumption at all harmonics as well as measuring power consumption at a given nth order harmonic.

Figures 14A, 14B:
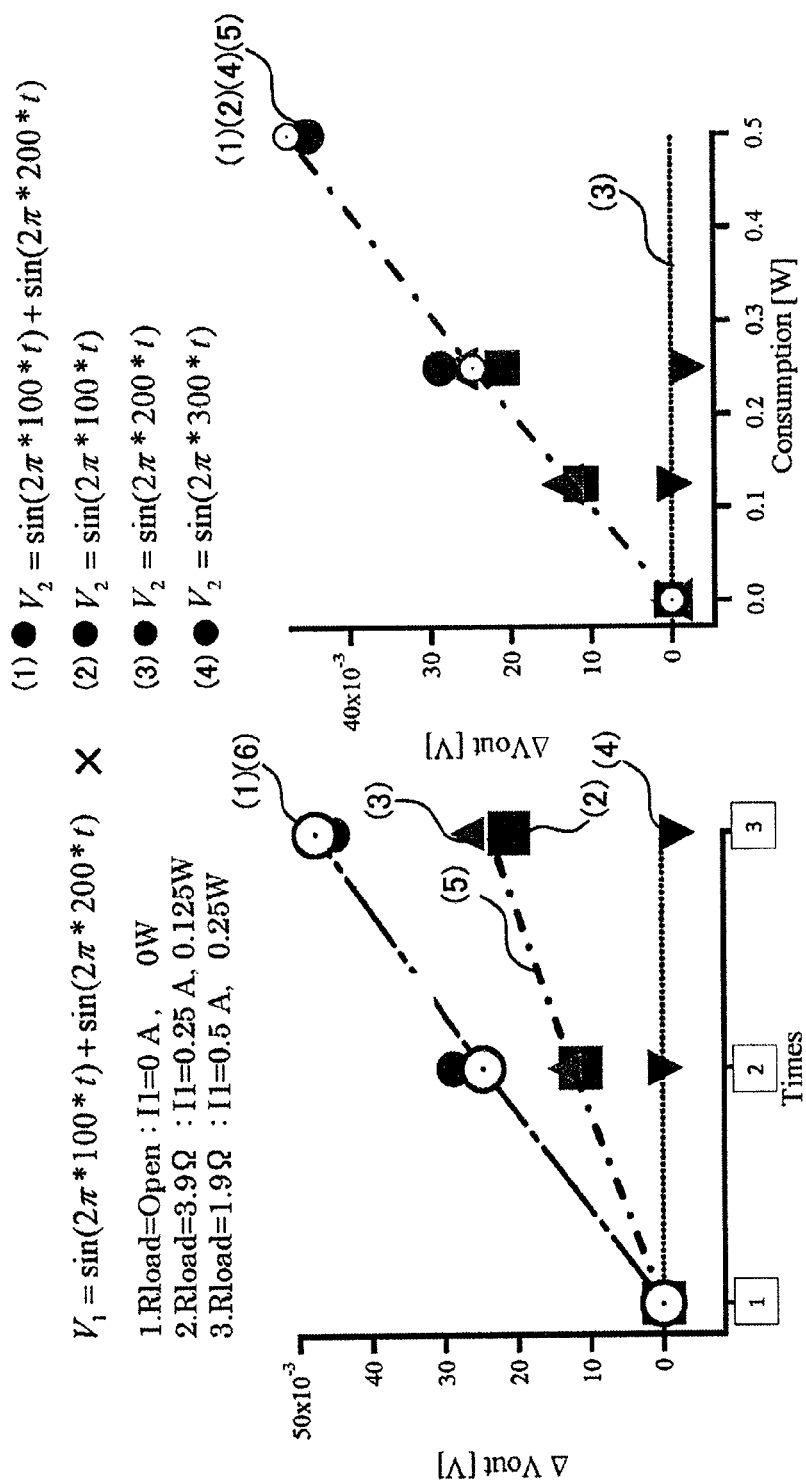
FIG. 14(a) is a graph showing a summary of the measurement results of FIG. 12.
FIG. 14(b) is a rewritten graph showing the measurement results of (a) on the left with the horizontal axis representing power consumption by a load resistance RLoad.

FIG. 14(*a*) is a graph (the same as FIG. 13(*b*)) showing a summary of the measurement results of FIG. 11 and FIG. 12, and FIG. 14(*b*) shows the measurement results of FIG. 14(*a*) which are rewritten with the power consumption in the load resistor RLoad represented on the horizontal axis. As can be seen from FIG. 14(*b*), all measured values are on a straight line, so that the measurement results have a good consistency and a good linearity.

Furthermore, it can be seen from FIG. 14(*a*) that the measurement result at (1) 100 Hz+200 Hz and the sum of the measured values at (6) 100 Hz and 200 Hz have a good consistency. This shows that the power measuring apparatus is capable of measuring power consumption at all harmonics as well as measuring power consumption at a given nth order harmonic.

Figure 15:
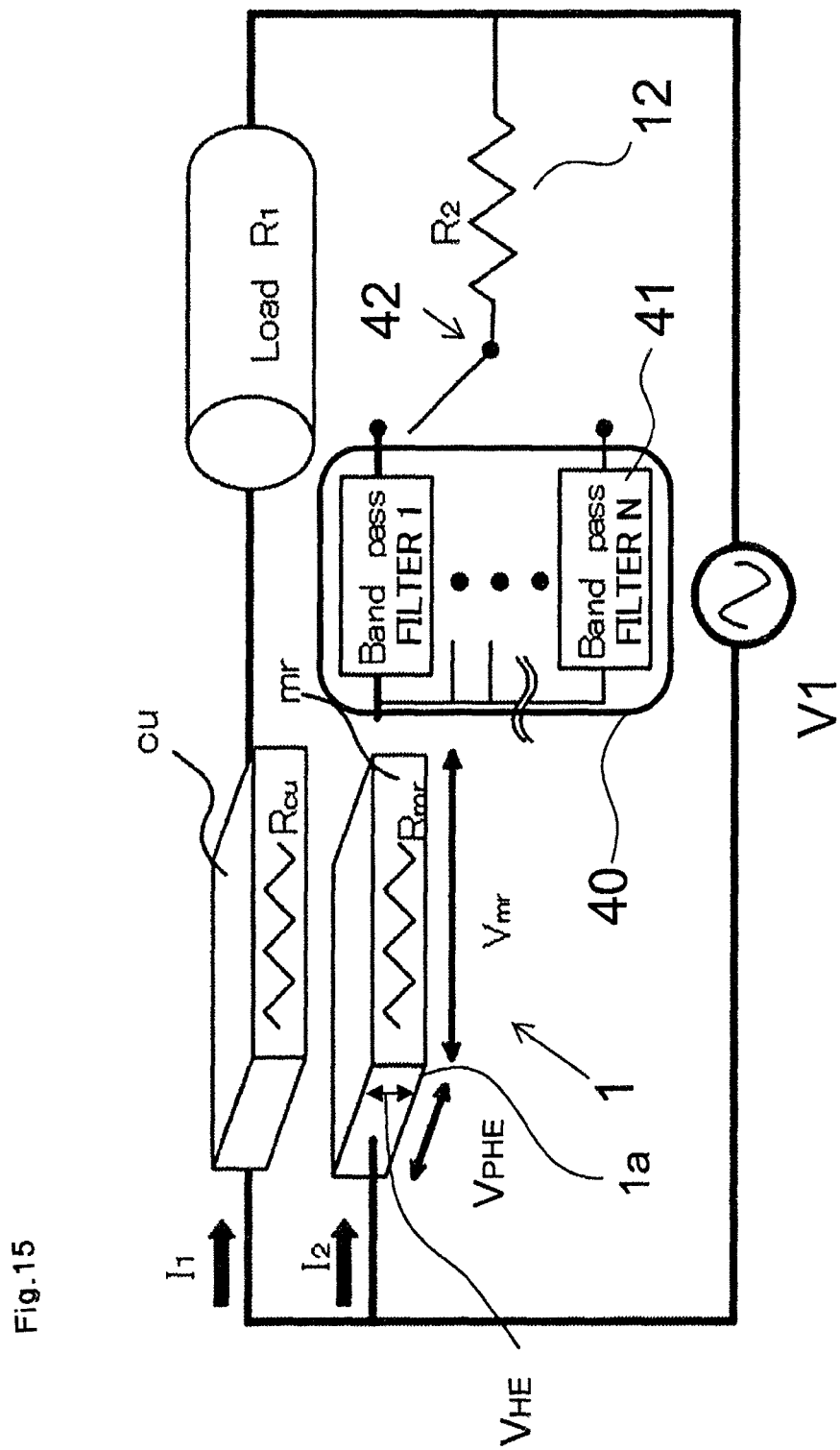
FIG. 15 shows a configuration of a power measuring apparatus which extracts a desired nth order high frequency through a bandpass filter for output.

FIG. 15 illustrates another example of the specific configuration of the power measuring apparatus of the present invention. Note that in FIG. 15, the voltage detecting unit for measuring the output from the sensor element was eliminated. In this configuration, n bandpass filters 41 are disposed in parallel, so that bandpass filter means 40 having a switch 42 for selecting one of the bandpass filters is connected in series to the sensor element 1 and the measurement resistor 12. Here, the switch 42 is described as for selecting one bandpass filter. However, n or less number of bandpass filters may be selected at the same time.

The power measuring apparatus configured as described above is capable of detecting a voltage proportional to a given nth order harmonic using the bandpass filters 41. In the power measuring apparatus, the magnetic field generated by the current I1 flowing through the load R1 varies the adjacent electrical resistor Rmr of the sensor element 1. In this respect, the power measuring apparatus is the same as a power measuring apparatus incorporating a conventional thin film element. However, the power measuring apparatus allows a current proportional to a given nth order harmonic voltage through the bandpass filters 41 from high frequencies contained in the AC power supply to flow into the sensor element 1.

The bandpass filters 41 have a function of passing a required range of frequencies therethrough but blocking (attenuating) other frequencies. For example, when the bandpass filters 41 of FIG. 15 pass a current I2 at 120 Hz, the output voltage Vmr from the sensor element 1 has only a 120 Hz frequency component.

Thus, the output voltage Vmr provided by the power measuring apparatus of FIG. 15 makes it possible to obtain a DC voltage proportional to the power consumed by the nth order harmonic voltage selected by the bandpass filters 41. Note that the power measuring apparatus taking advantage of the thin film element is also applicable to (1) the power measuring apparatus that takes advantage of a change in the electrical resistance of the magnetic thin film caused by magnetoresistance effect and (2) the power measuring apparatus that takes advantage of a change in the electrical resistance of the magnetic thin film caused by the planar Hall effect, which have been described above, and as well, to (3) the power measuring apparatus that takes advantage of a change in the electrical resistance of a semiconductor film caused by the Hall effect. Note that as for the output voltage, the DC component is detected as the respective output from (1) the voltage Vmr in the longitudinal direction with a magnetic film denoted by symbol $1a$; (2) a voltage VPHE in the width direction with the magnetic film denoted by symbol $1a$; and (3) a voltage VHE in the thickness direction with a semiconductor film denoted by symbol $1a$.

The power measuring apparatus of FIG. 15 is capable of detecting the power consumption by the harmonic components of the power supply. Thus, in areas where leakage of high-frequency component power frequently causes fires in electrical appliances, the power measuring apparatus is available as means for detecting the leakage of high frequencies for each frequency and issuing an alarm about high-frequency leakage.

On the other hand, while the aforementioned power measuring apparatus configured as shown in FIG. 15 has the input voltage at an nth order harmonic, the example of the configuration of the power measuring apparatus of FIG. 15 may also employ an input voltage at a single frequency. As described with reference to Equations 1 to 3, the power measuring apparatus is capable of measuring the power consumption in the load to be measured, only by the DC voltage component. Thus, it is possible to separate only the DC voltage component by removing the AC voltage component by the bandpass filter, thereby measuring the power consumption of the load. Furthermore, the output voltage components of the low-frequency or high-frequency region can be removed by the bandpass filter, thereby measuring the power consumption of the required frequency region.

<Method for Stabilizing Output Voltage when Measuring Direct Current (Magnetic Field) (Applicable to the Magnetoresistive Type and the Planar Hall Effect Type Power Measuring Apparatuses)>

"Applying the AC Bias Magnetic Field (Improvement in Reproducibility)"

Figure 16A:
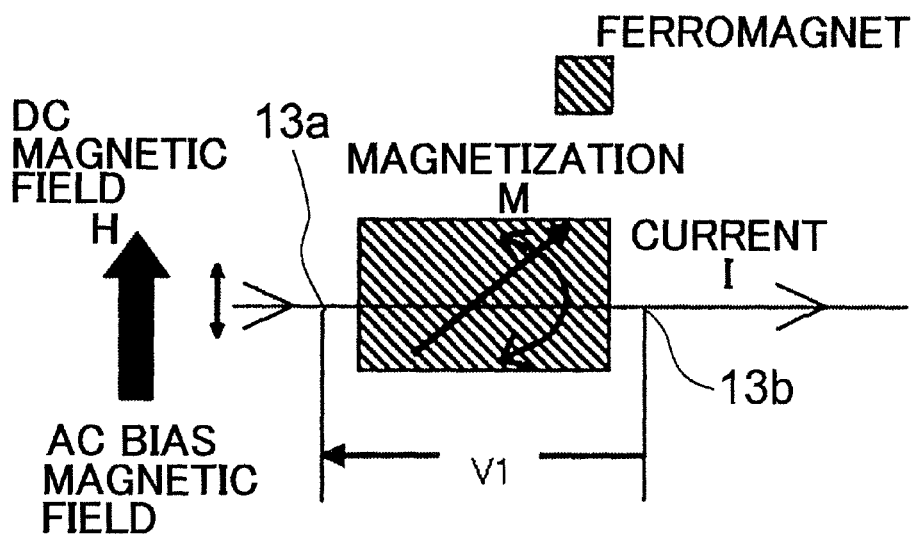
FIGS. 16(a) and 16(b) are explanatory schematic view of the magnetoresistance effect and the planar Hall effect.
Figure 16B:
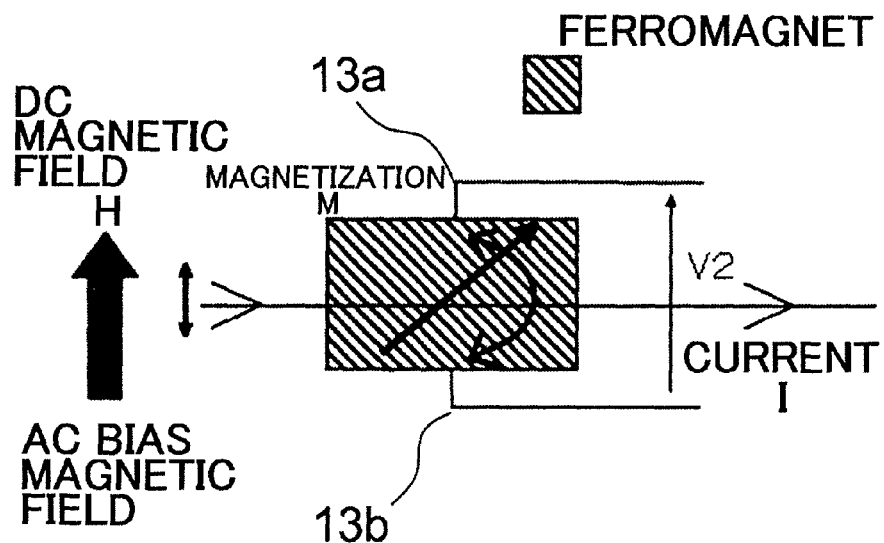

Now, FIG. 16($a$) is a schematic view showing the magnetic film part (ferromagnet) of the (anisotropic) magnetoresistive type power measuring apparatus, and FIG. 16($b$) is a schematic view showing the magnetic film part (ferromagnet) of the planar hole type (hereafter referred to as "PHE type") power measuring apparatus. The PHE type is configured to measure a voltage V2 between two sides mutually opposing in the direction perpendicular to the current allowed to flow through the magnetic film.

Thus, for the PHE type power measuring apparatus, the measurement terminals 13 (13$a$, 13$b$) for taking a voltage are formed on the sides where no sensor terminals of the sensor element are formed. In this respect, the PHE type power measuring apparatus is different from the magnetoresistive type power measuring apparatus (FIG. 16($a$)), with the other components being the same as those of the power measuring apparatus described in relation to FIGS. 6 and 7. Here, it was shown that when measuring DC power using the sensor element of both the power measuring apparatuses of FIGS. 16($a$) and ($b$), the DC output voltages of outputs V1 and V2 were typically unstable (drifted).

Figure 17:
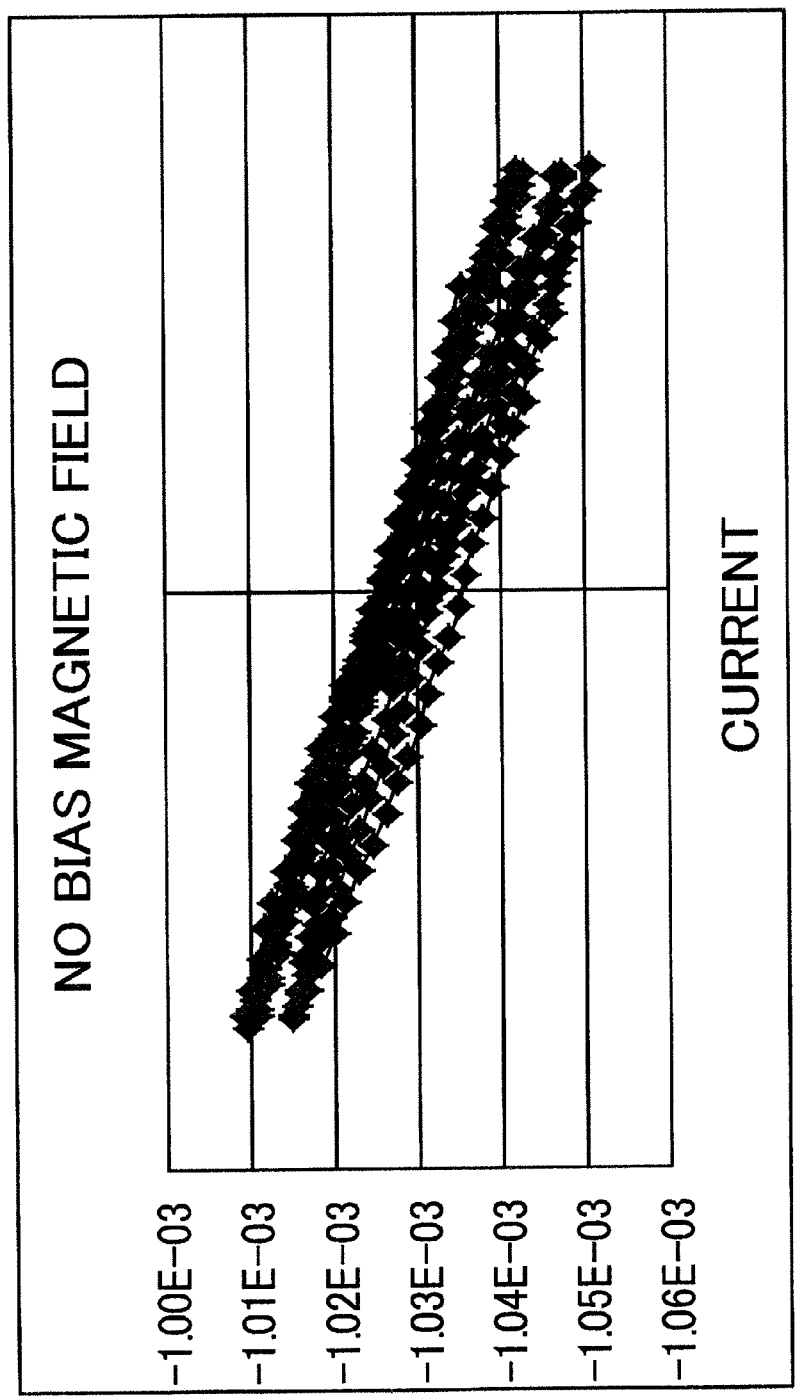
FIG. 17 shows output measurement results with no AC bias magnetic field applied.

FIG. 17 shows the measurement results of the output voltage V2 for the current I1 when measuring only the DC magnetic field H (without applying an AC bias magnetic field) by the PHE type power measuring apparatus with the measurement terminals formed as in FIG. 16($b$). Here, only a direct current is allowed to flow through the load. Note that the experiment conditions for FIG. 17 are as follows.

Magnetic element used: Circular element 10 mm in diameter

DC applied magnetic field: −2 A (−100 A/m) to 2 A (100 A/m)

Measurement: Period was 120 sec, for this one, 300 prot/ 600 sec

Furthermore, since no AC component exists when only the direct current flows through the load, the power measuring apparatus does not require the low-pass filter 26 (see FIG. 6). That is, for the power measuring apparatus of the present invention, no low-pass filter may be connected to the voltage detecting unit 28 in some cases.

In FIG. 17, the horizontal axis represents the current flowing through the load, and the vertical axis represents the detected voltage. Since the PHE type element provides the output voltage property of an odd function for a magnetic field acting thereon, the element exhibits the property of an output voltage that decreases rightward from the zero current point. Measurements were repeated several times. However, the results varied as shown in FIG. 17. It can be seen from FIG. 17 that the reproducibility of the output voltage deteriorates due to the drift when power measurement is carried out with the action of only a DC magnetic field by the load current (direct current) flowing through a primary conductor.

Figure 18A:
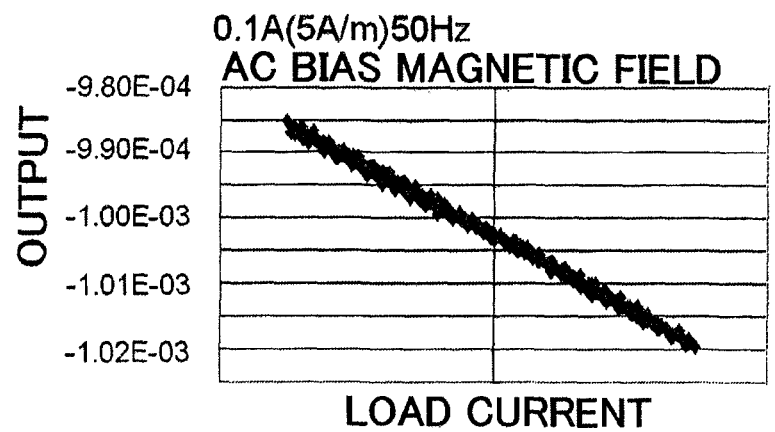
FIGS. 18(a), 18(b) and 18(c) show output measurement results with different AC bias magnetic fields applied.
Figure 18B:
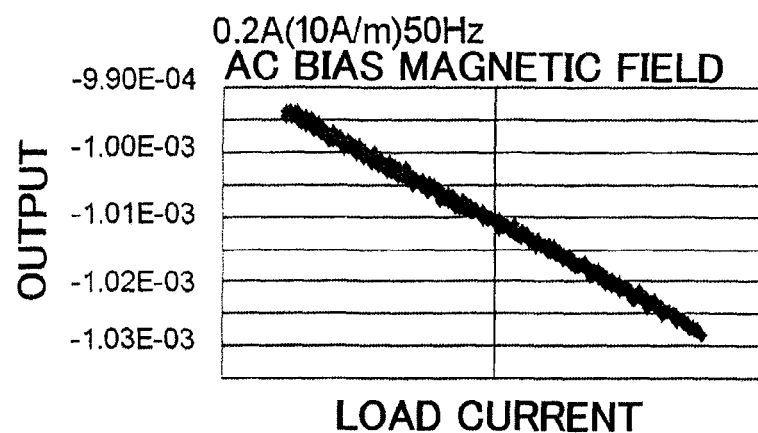
Figure 18C:
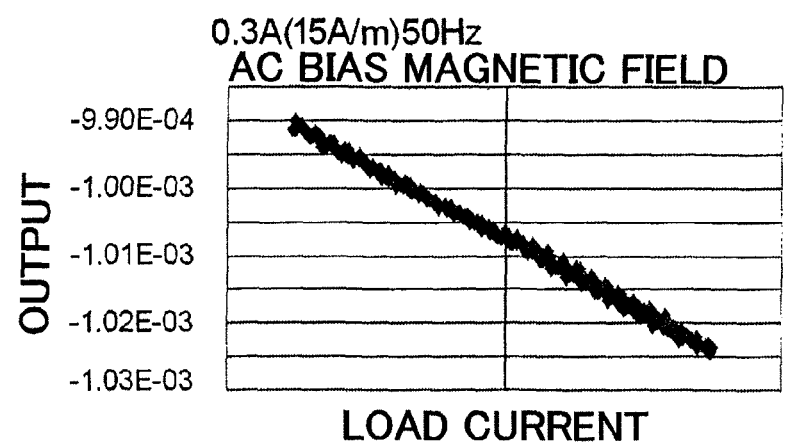
Figure 19D:
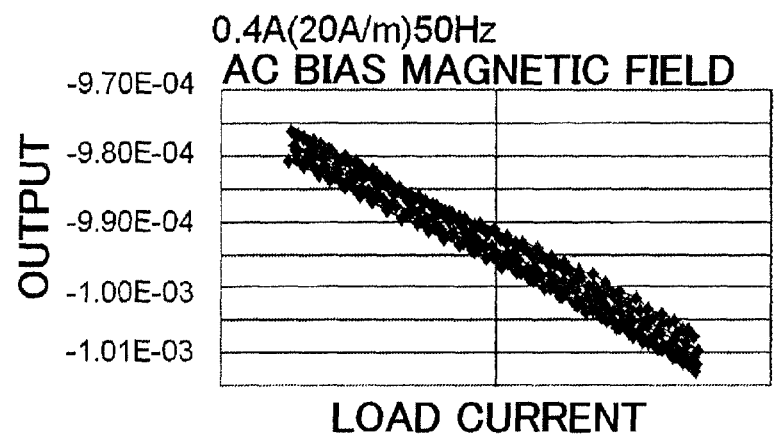
FIGS. 19(d) and 19(e) show output measurement results with different AC bias magnetic fields applied.
Figure 19E:
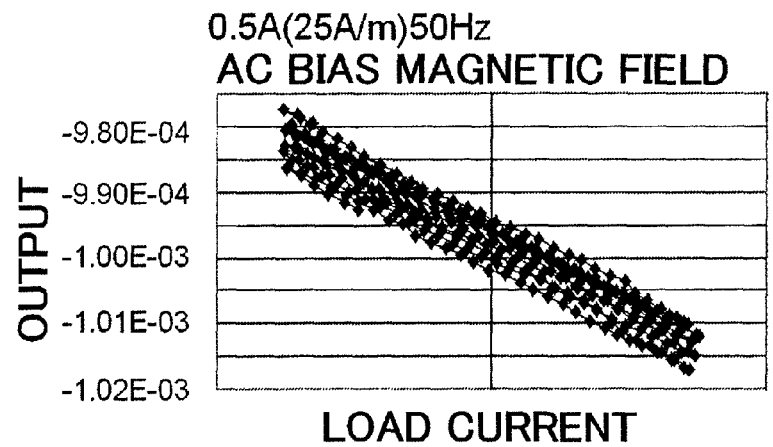

In contrast to this, FIGS. 18 to 19 show the measurement results of the output voltage V2 for the load current I1 when an AC bias magnetic field is applied in parallel to the DC magnetic field to be measured in order to measure the DC magnetic field H by the PHE type power measuring apparatus. In each case, measurements were repeated in the same manner several times. The experiment conditions for FIGS. 18 to 19 were the same as those for FIG. 17 except that the extra AC bias magnetic field was applied. Note that the AC bias magnetic field was generated in combination with an oscillator and an amplifier. Here, the means for applying the AC bias magnetic field in parallel to a magnetic field being detected is referred to as the AC bias magnetic field applying means.

On the other hand, the applied AC bias magnetic field was −0.1 A (5 A/m) at 50 Hz for FIG. 18($a$); −0.2 A (10 A/m) at 50 Hz for FIG. 18($b$); −0.3 A (15 A/m) at 50 Hz for FIG. 18($c$); −0.4 A (20 A/m) at 50 Hz for FIG. 19($d$); and −0.5 A (25 A/m) at 50 Hz for FIG. 18($e$).

It can be seen from the measurement results of FIG. 18 and FIG. 19 that a good reproducibility of the output voltage is provided when the AC bias magnetic field is 5 A/m, 10 A/m, and 15 A/m as compared with the case of no AC bias magnetic field (see FIG. 17). On the other hand, it can be seen that as the AC bias magnetic field is increased to 20 A/m and 25 A/m, the AC bias magnetic field increases relative to the DC magnetic field being measured, causing a worse reproducibility of the output voltage (FIG. 19). Thus, it was found that the reproducibility of the output voltage was improved by an AC bias magnetic field which slightly oscillates the magnetization of the magnetic film.

This phenomenon relates to the behavior of magnetization of the magnetic film, and is effective at stabilizing the output so long as the magnetic film is used for the sensor element. That is, while the PHE type power measuring apparatus was described in the aforementioned explanation, the AC bias magnetic field applying means which applies an AC bias magnetic field in parallel to a DC magnetic field being measured is also effective even for the magnetoresistive type power measuring apparatus for measuring a voltage in the same direction as that of the current allowed to flow through the magnetic film.

[Applying a Square-Wave AC Bias Magnetic Field (Improvement in Stability)]

Figure 20A:
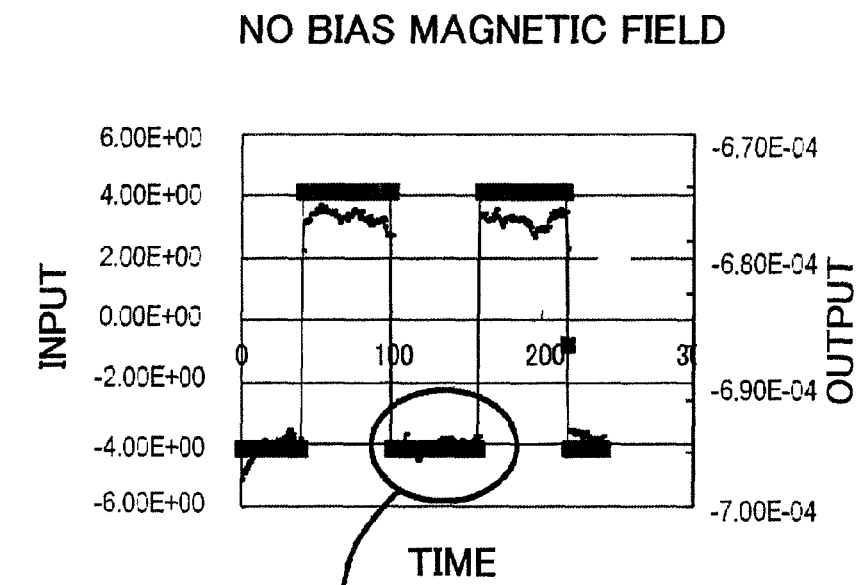
FIGS. 20(a) and 20(b) show output measurement results with no AC bias magnetic field applied to a square wave.
Figure 20B:
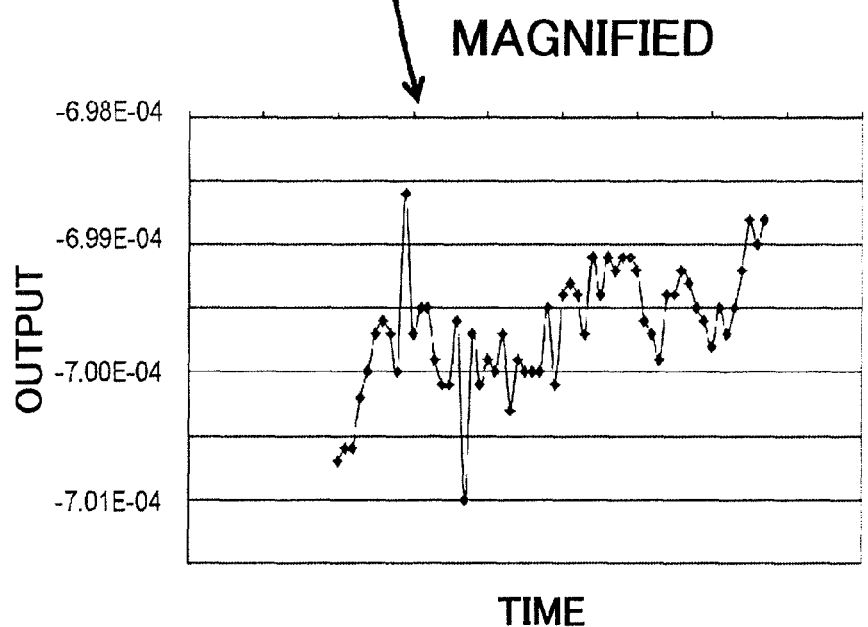
Figures 21A, 21B:
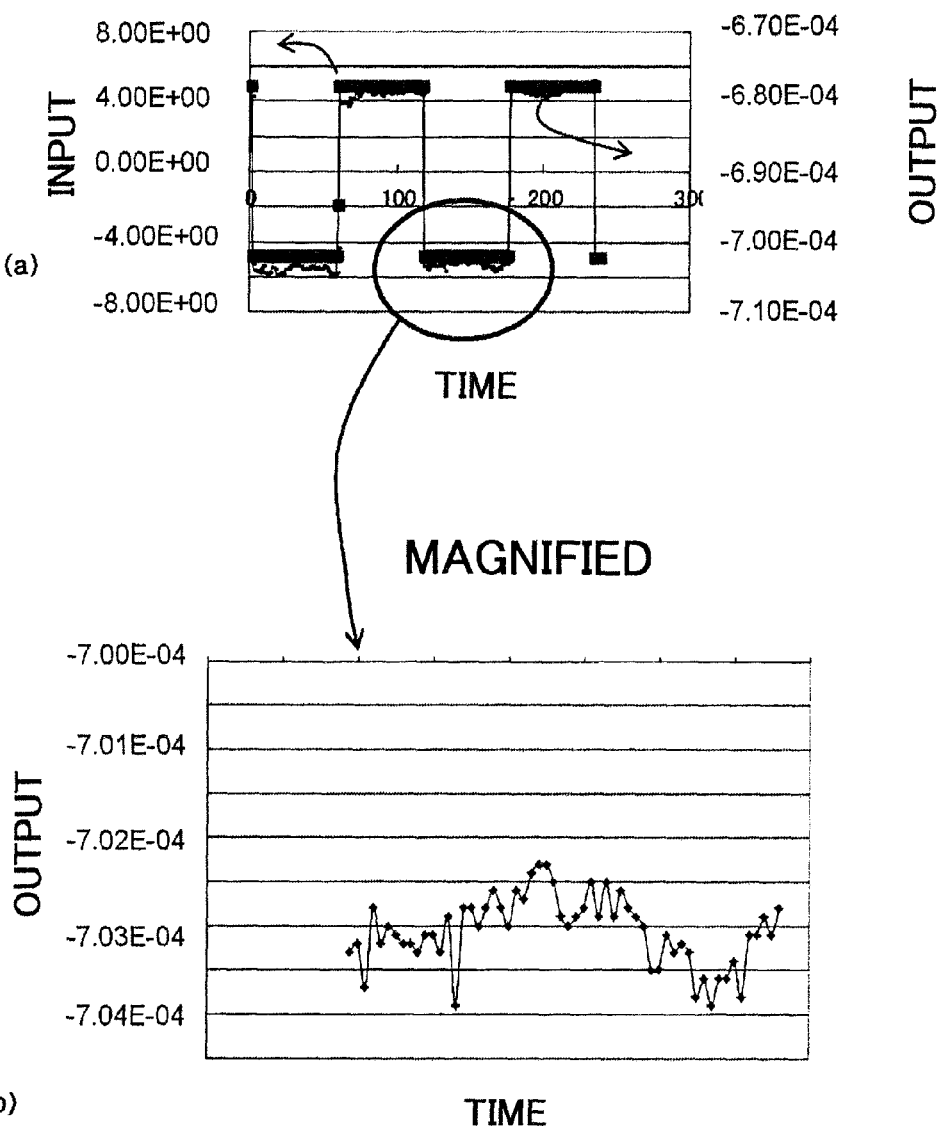
FIGS. 21(a) and 21(b) show output measurement results with an AC bias magnetic field applied to a square wave.

Now, the measurement results obtained when the AC bias magnetic field was applied to the magnetic film in order to measure power consumption with a square wave current allowed to flow through a load. FIGS. 20 to 21(*a*) show the output voltages obtained when a DC magnetic field (see FIG. 16) acted upon the magnetic film of the sensor element by allowing a square wave current of −2 A (−100 A/m) and 2 A (−100 A/m) to flow through a conductor film Cu (primary conductor) for periods of 120 [sec]. FIG. 20 shows the case with no AC bias magnetic field being applied, and FIG. 21 shows the case where the AC bias magnetic field (−0.3 A (15 A/m), 50 Hz) was applied (added) to the magnetic film in parallel to the magnetic field generated by the conductor film Cu. Note that measurements were performed 240 prot at intervals of 240 [sec] (2 periods). In the graph, the horizontal axis represents the time, and the vertical axis represents the input (DC applied magnetic field) and the output voltage.

Furthermore, (*b*) in FIGS. 20 and 21 is an enlarged view of a circled portion in (*a*). As can be seen clearly from these figures, applying the AC bias magnetic field causes the "variation (variance)" of the output voltage to be reduced. Specific variance values of the output voltage are shown in Table 1 with and without the AC bias magnetic field being applied. It can be seen from this table that the AC bias magnetic field has improved the stability of the output about 1.5 times.

TABLE 1

| | Number of samples | Variance |
|---|---|---|
| No bias magnetic field | 58 | 2.2773E−13 |
| 0.3 A, 50 Hz Bias magnetic field | 58 | 1.5304E−13 |

"Applying the DC Bias Magnetic Field (Increase in Sensitivity)"

In relation to FIGS. 17 to 21, a description has been made to the effects of applying the AC bias magnetic field when measuring the DC magnetic field. Here, a description will be made to the effects of employing the DC bias magnetic field. As used herein, the phrase, "the DC bias magnetic field" refers to a DC magnetic field being applied in parallel to the magnetization easy axis of the magnetic film.

Figure 22:
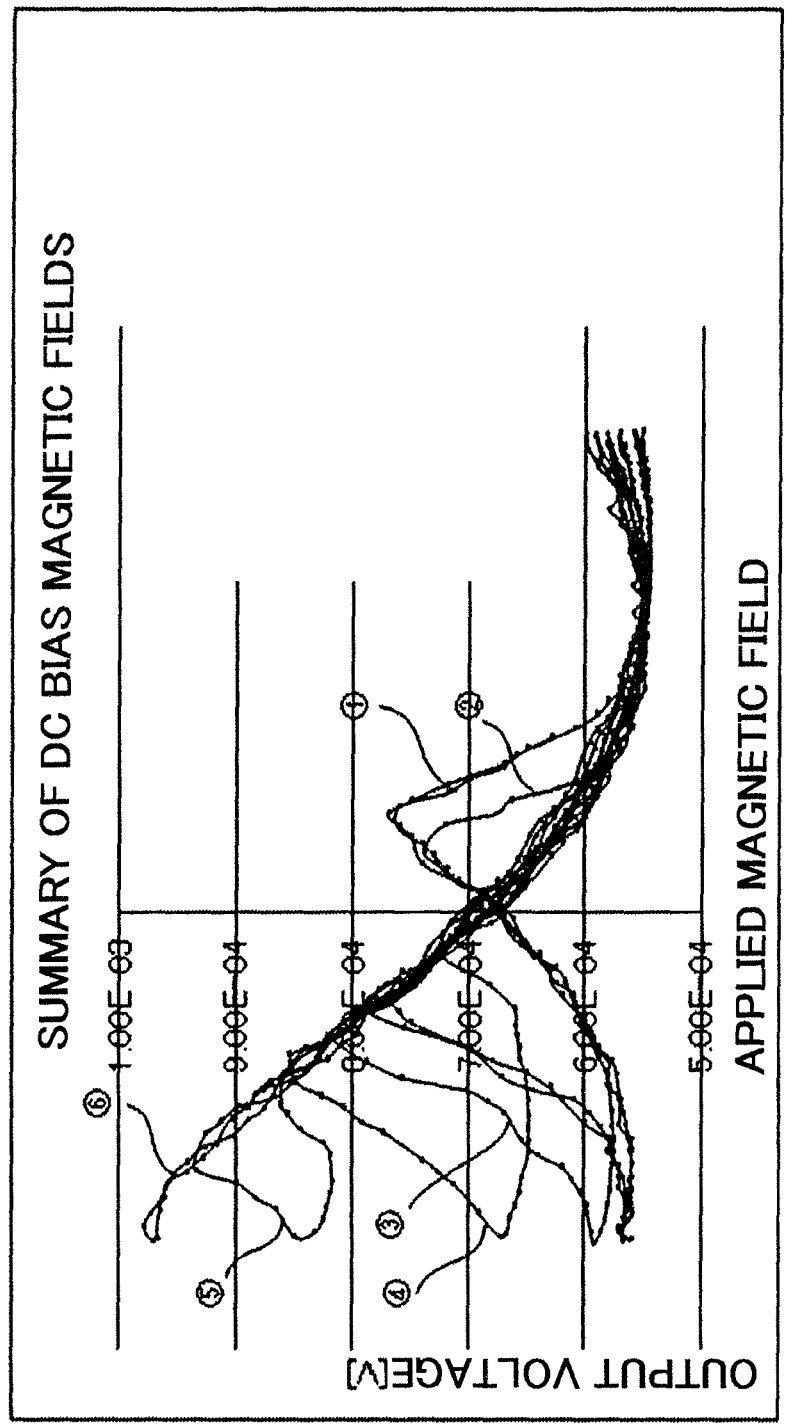
FIG. 22 shows output measurement results with a DC bias magnetic field applied and with DC bias magnetic fields of different magnitudes applied.

FIG. 22 shows the output voltages provided when the DC bias magnetic field is not applied (when only the DC magnetic field H is applied to the magnetic film in the PHE type power measuring apparatus) and when the DC bias magnetic field is applied. Note that for the measurements made when the DC bias magnetic field was applied, the results shown were obtained using DC bias magnetic fields of different magnitudes.

More specifically, the measurement results shown were obtained:
(1) when the DC bias magnetic field was not applied; (2) when a DC bias magnetic field of 80 A/m was applied, (3) when a DC bias magnetic field of 240 A/m was applied, (4) when a DC bias magnetic field of 480 A/m was applied, (5) when a DC bias magnetic field of 800 A/m was applied, and (6) when a DC bias magnetic field of 1200 A/m was applied. The direct current allowed to flow through the magnetic film was 10 mA. Note that the DC bias magnetic field is adjusted by adjusting the distance to a permanent magnet.

In FIG. 22, the horizontal axis represents the magnitude of the DC magnetic field generated by the direct current allowed to flow through a load, and the vertical axis represents the output from the power measuring apparatus. It can be seen from this figure that as the DC bias magnetic field increases, the output potential difference increases. It can also be said that the DC bias magnetic field is capable of improving the sensitivity of the power measuring apparatus.

The power measuring apparatus of the present invention can have the DC bias magnetic field applying means that applies the DC bias magnetic field to the sensor element 1 in the direction of the magnetization easy axis of the magnetic film. The direction of the magnetization easy axis of the magnetic film is often induced in the longitudinal direction of the magnetic film. In that case, the DC bias magnetic field applying means applies a magnetic field in a direction parallel to the longitudinal direction of the magnetic film of the sensor element. Furthermore, the DC bias magnetic field applying means is also applicable to the sensor element, the magnetic film of which is made of the barber pole magnetic film, the magnetization easy axis tilted magnetic film, or the zigzag magnetic film, or a combination thereof, to be discussed later.

As a matter of course, the longitudinal direction of the magnetic film may not be consistent with the magnetization easy axis in some cases as discussed later. In those cases, the DC bias magnetic field is applied in a direction apparently different from the longitudinal direction of the magnetic film (in the direction of the magnetization easy axis). Specific means for applying the DC bias magnetic field may be thought to be a permanent magnet or an electromagnet for generating a magnetic field.

<Example of Method for DC Measurement by the Magnetoresistive Type Power Measuring Apparatus (Application to Power Measurement of Batteries or the Like)>

Figure 23:
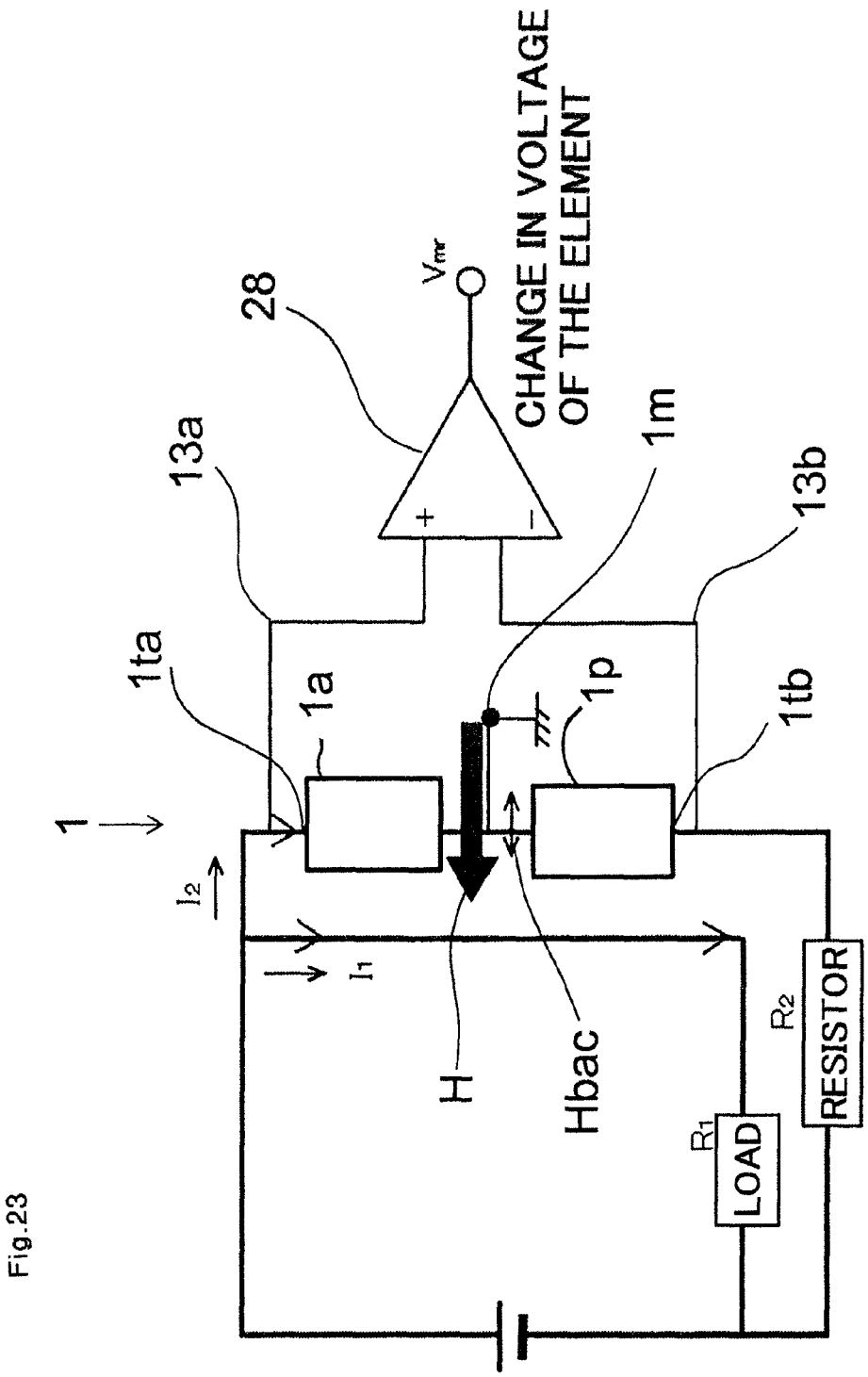
FIG. 23 shows a connection method for connecting magnetoresistive elements in series so as to measure a DC input.

In the magnetoresistive type power measuring apparatus, there appears a high DC offset voltage when a DC power supply is connected to a load. Thus, one magnetic film 1*a* is not enough to measure DC power. However, as shown in FIG. 23, two magnetic films 1*a* and 1*p* may be connected in series with the connection point grounded, thereby cancelling out the offset voltages that occur in each magnetic film. Here, the sensor terminals 1*t* (1*ta*, 1*tb*) are located on both ends of the magnetic film 1*a* and the magnetic film 1*p*. Furthermore, the sensor terminals 1*t* also serve as the measurement terminals 13 (13*a*, 13*b*), to which the voltage detection means 28 is connected. Note that in FIG. 23, the amplifier is representative of the voltage detection means 28.

That is, the sensor element 1 is configured such that the magnetic film 1*a* and the magnetic film 1*b* are connected in series; the connection point thereof is provided with a center tap electrode 1*m* for grounding; and the center terminals 1*ta* and 1*tb* are provided on both ends of the magnetic films 1*a* and 1*p* with the center tap electrode 1*m* disposed therebetween. Thus, in such a sensor element 1, there appears no offset voltage in the output voltage Vmr between both ends of each of the magnetic films 1*a* and 1*p*. Thus, such a connection method for the magnetic films can solve a drawback of the magnetoresistive type power measuring apparatus or the problem of being incapable of measuring DC power. Note that to stabilize the output, the AC bias magnetic field applying means may also be used in combination. An AC bias provided by the AC bias magnetic field applying means is denoted by Hbac. On the other hand, the two magnetic films were combined as one sensor element here. However, two sensor elements may be connected in series with the connection point grounded.

Figure 24:
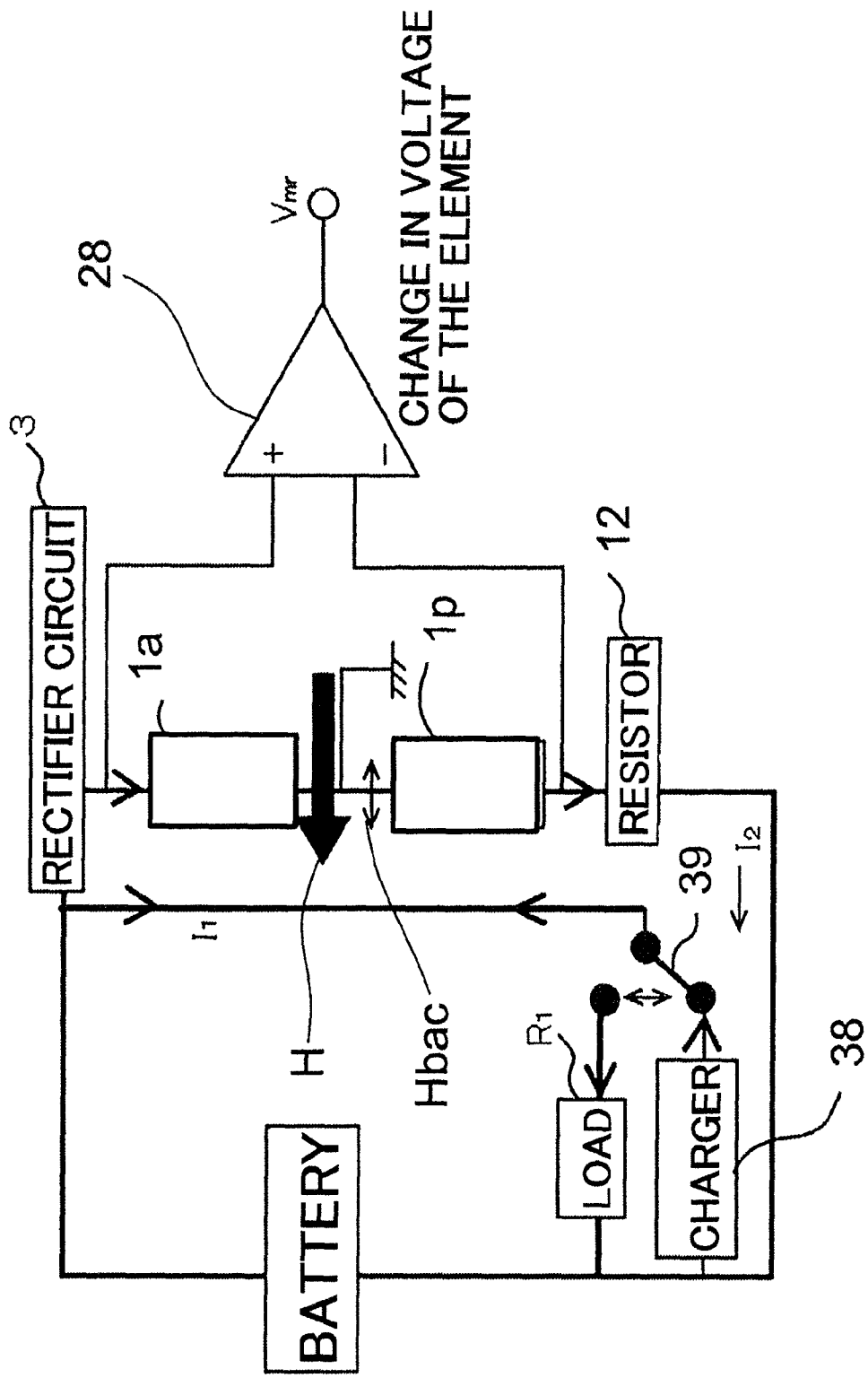
FIG. 24 shows an improved example of the connection method of FIG. 22 which is configured to be capable of monitoring the amount of discharge and the amount of charge of a battery.

FIG. 24 shows an application of the power measuring apparatus of FIG. 23 to a secondary battery, in the case of which additionally provided are a rectifier circuit 37, a charger 38, and a switch 39 in addition to the sensor element 1, the measurement resistor 12, and the voltage detection means 28 of FIG. 24. The rectifier circuit 37 serves to convert an alternating current into a direct current, and the bridge circuit is a simplified structural example. Furthermore, the charger 38 charges alternating current, and although not illustrated, the charger 38 is connected with an external power supply (AC).

First, when the switch 39 is connected to the load R1, as described in relation to FIG. 23, it is possible to detect the power consumption of the battery that is a DC power supply. On the other hand, when the switch 39 is connected to the charger 38, it is possible to detect the power to be charged to the charger 38.

Thus, for the secondary battery constructed as in FIG. 24, it is possible to monitor the amounts of power (the amount of discharge and the amount of charge) to be transferred when power is supplied by the battery to the load R1 and when power is charged from an external power supply to the battery.

Note that other than the configurations of FIG. 23 and FIG. 24, methods for cancelling out the DC bias voltage (offset voltage) that appears in the DC measurement by the magnetoresistive type power measuring apparatus may also conceivably include one in which a voltage equivalent to the DC bias voltage is produced by a dummy resistor.

<The Barber Pole Type Magnetoresistive Type Power Measuring Apparatus>

Now, a description will be made to the barber pole magnetoresistive type power measuring apparatus. This power measuring apparatus is a modified example of the magnetoresistive type power measuring apparatus described above.

Figure 26A:
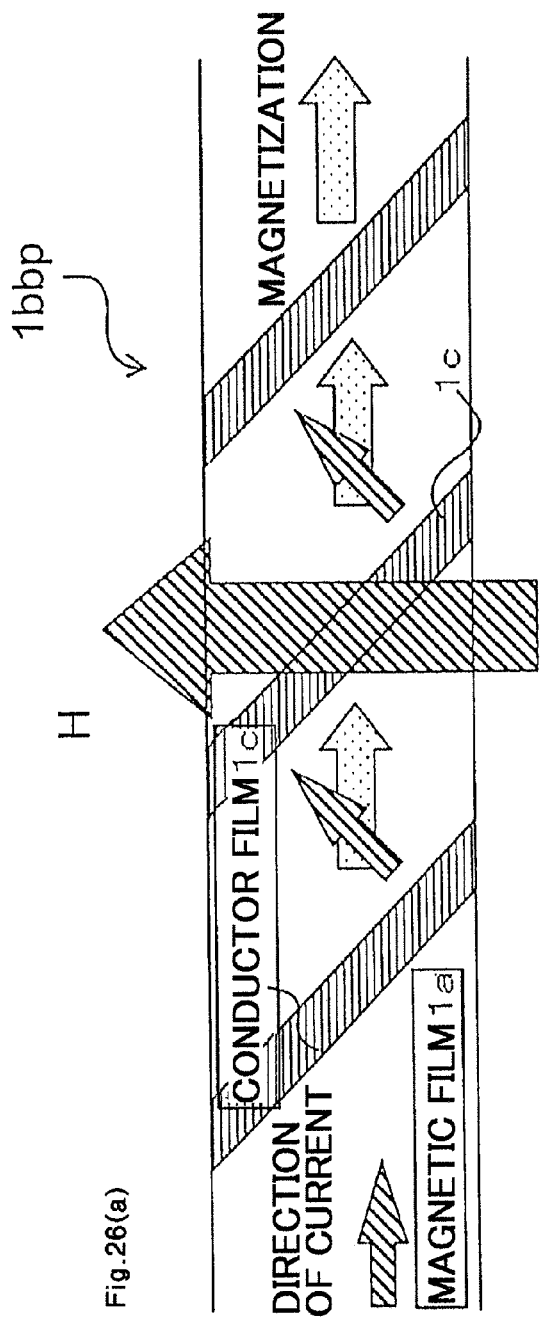
FIGS. 26(a) and 26(b) illustrate a magnetic film in a barber pole type magnetoresistive type power measuring apparatus.
Figure 26B:
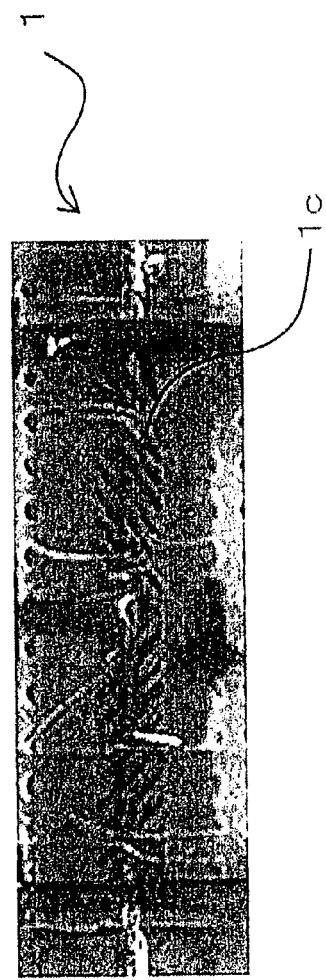
Figures 27A, 27B:
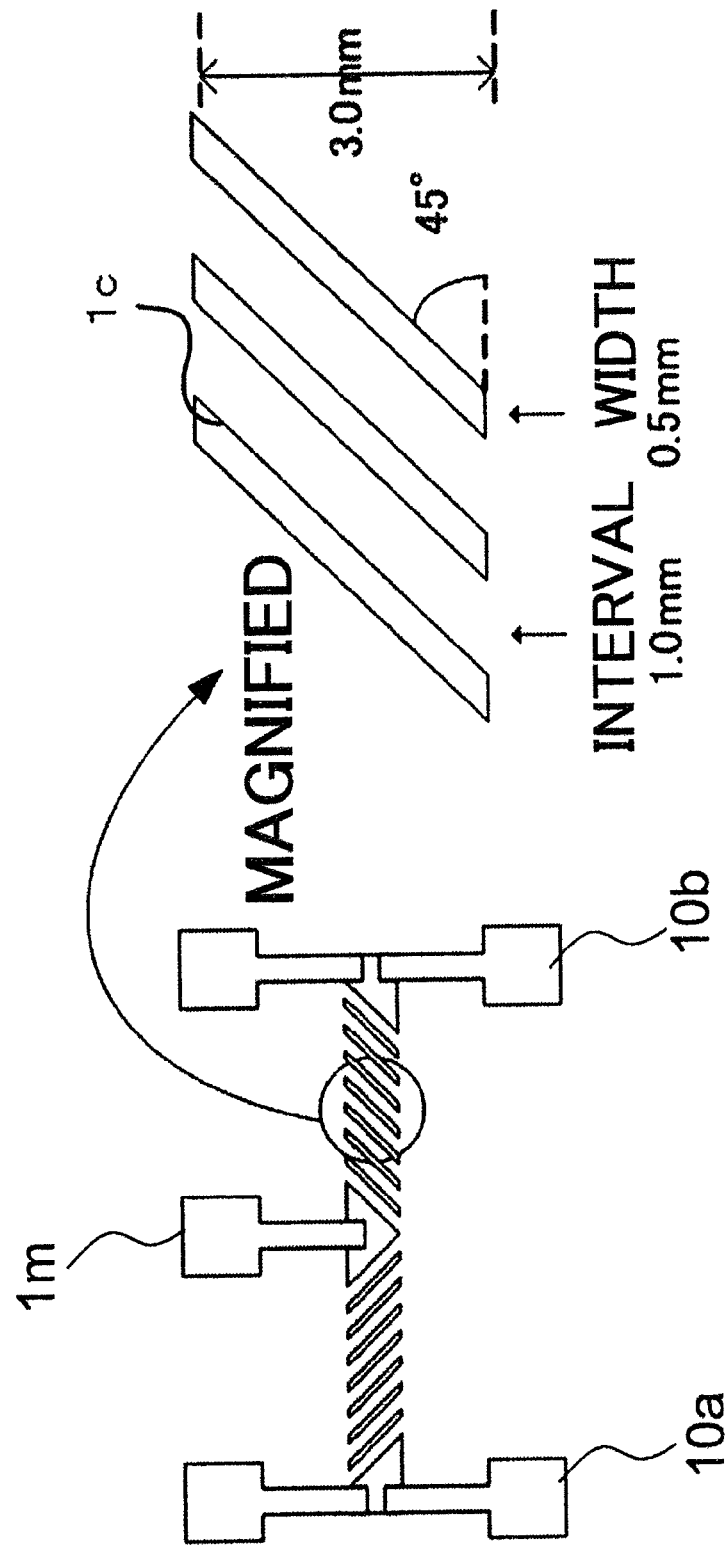
FIGS. 27(a) and 27(b) illustrate a diagonal conductor film and an electrode which are to be provided on top of a magnetic film.

FIG. 26 shows the magnetic film of the sensor element in the barber pole type magnetoresistive type power measuring apparatus. FIG. 27 shows diagonal conductor films 1c and electrodes (hereafter referred to as the barber pole electrodes) which are provided on the surface of the magnetic film. Furthermore, the integrated magnetic film of the magnetic films and the diagonal conductors (the barber pole electrodes) formed on top thereof is referred to as "the barber pole magnetic film 1bbp." FIG. 26(a) is an image view showing the direction of current and the direction of magnetization when the barber pole magnetic film 1bbp is viewed from above, and FIG. 26(b) is a photo showing the barber pole magnetic film 1bbp when being taken from above in the same manner as with (a). Note that the magnetic field H generated by the current flowing through the load is assumed to be directed from bottom toward top in the figure.

Furthermore, FIG. 27 is a view illustrating the diagonal conductors 1c and the electrodes which are provided on the surface of the magnetic film 1a, (a) is an entire view, and (b) is an enlarged view of the circled portion in (a). A plurality of diagonal conductors 1c are disposed in the longitudinal direction of the magnetic film 1a.

Furthermore, in FIG. 27, the directions of inclination are changed between right and left from the center. That is, assuming that the right diagonal conductors are included in a first group, while the left diagonal conductors are included in a second group, the respective directions of inclination are opposite to each other.

The center tap electrode 1m formed between the first group and the second group of the diagonal conductors (on the boundary therebetween). That is, two barber pole magnetic films 1bbp are connected in series into one sensor element, which allows the center tap electrode 1m to be grounded when used. Furthermore, there are formed sensor terminals 10 (10a, 10b) on both ends of the diagonal conductors. This is to allow a current to flow through the magnetic films 1c. As described above, the sensor terminals 10 may be formed away from both ends of the magnetic films 1c. Furthermore, the measurement terminals 13 are also formed from the same locations as those of the sensor terminals 10. Note that it is also acceptable to connect in series two magnetic films to which electrically conductive films having the same direction of inclination are applied and provide the center tap electrode therebetween. Such a sensor element can cancel out the offset voltage of each magnetic film.

The specific prototype example of FIG. 26(b) employs, as the magnetic film, a permalloy (NiFe) film which is 30 mm in length, 1 mm in width, and about 0.1 μm in thickness. As shown in FIGS. 26 to 27, the barber pole magnetic film 1bbp is provided with the conductor films 1c diagonal in the width direction of the magnetic film (in the vertical direction in the drawing) and is formed of copper (Cu). The conductor film 1c is 0.5 mm in width, 3 mm in length, 0.1 μm in thickness, and 1 mm in the interval between the conductor films (see FIG. 27).

To employ the sensor element 1 shown in FIG. 26 and FIG. 27 as part of the power measuring apparatus, it is necessary to allow a current to flow through the magnetic film 1a. At this time, it is possible to control the direction of a current flowing through the magnetic film by providing the conductor films 1c. That is, since current has the property of flowing through a path of less electrical resistance, the current flowing through the magnetic film travels the shortest distance between the conductor films 1c, with the result that the current is allowed to flow diagonally relative to the longitudinal direction of the magnetic film (see FIG. 26(a)).

More specifically, first, the electrical resistance of the conductor films (Cu films) 1c is approximately one tenth the electrical resistance of the magnetic film (permalloy film) 1a. Thus, the current experiences less electrical resistance when flowing through the shorter distance between the conductor films and through the conductor films 1c rather than advancing straight in the longitudinal direction of the magnetic film 1a. Since the magnetic film has the direction of magnetization (the direction of easy magnetization) pre-induced in the longitudinal direction by shape anisotropy and induced anisotropy, the current will flow through the magnetic film between the diagonal conductors 1c at an angle to the direction of magnetization.

Figures 28A, 28B:
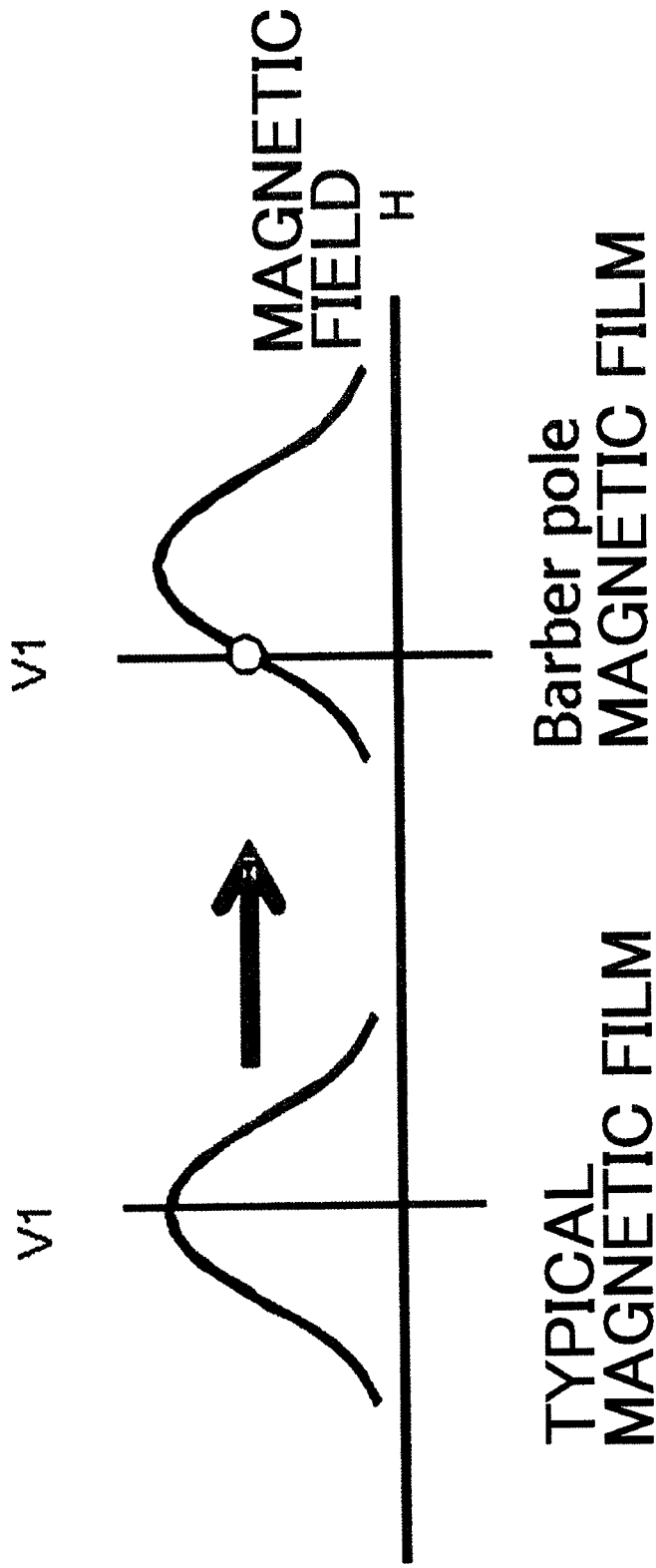
FIGS. 28(a) and 28(b) illustrate the relationship between a voltage V1 and a magnetic field H in the longitudinal direction.

Thus, as shown in FIG. 28(b), the magnetoresistive characteristic of the barber pole magnetic film 1bbp exhibits the characteristics that would be made available when the magnetic field—resistance characteristics by typical magnetoresistance effect is biased by a bias magnetic field. That is, it is possible to set the operating point at which a linear characteristic can be obtained from magnetoresistance effect to the point at which acting magnetic field is zero with no bias magnetic field.

FIG. 28 shows the relationship between the voltage V1 in the longitudinal direction and the magnetic field H. FIG. 28(a) shows typical magnetoresistance effect. The output voltage V1 versus the magnetic field H forms an even function. Thus, it is necessary to provide a bias magnetic field in order to obtain a linear characteristic. On the other hand, FIG. 28(b) shows the magnetoresistance effect of the barber pole magnetic film and that the bias magnetic field is not required. Thus, the power measuring apparatus having the sensor element with the barber pole magnetic film requires no DC bias magnetic field perpendicular to the longitudinal direction of the sensor element. Furthermore, such a power measuring apparatus can be constructed in the same manner as the power measuring apparatus described above.

<The Differential Barber Pole Magnetoresistive Type Power Measuring Apparatus>

Figure 29A:
FIGS. 29(a) and 29(b) illustrate a differential barber pole type magnetoresistive type power measuring apparatus, (a) is a photo taken from above and (b) is a schematic view showing the power measuring apparatus used for measuring a microstrip line.
Figure 29B:
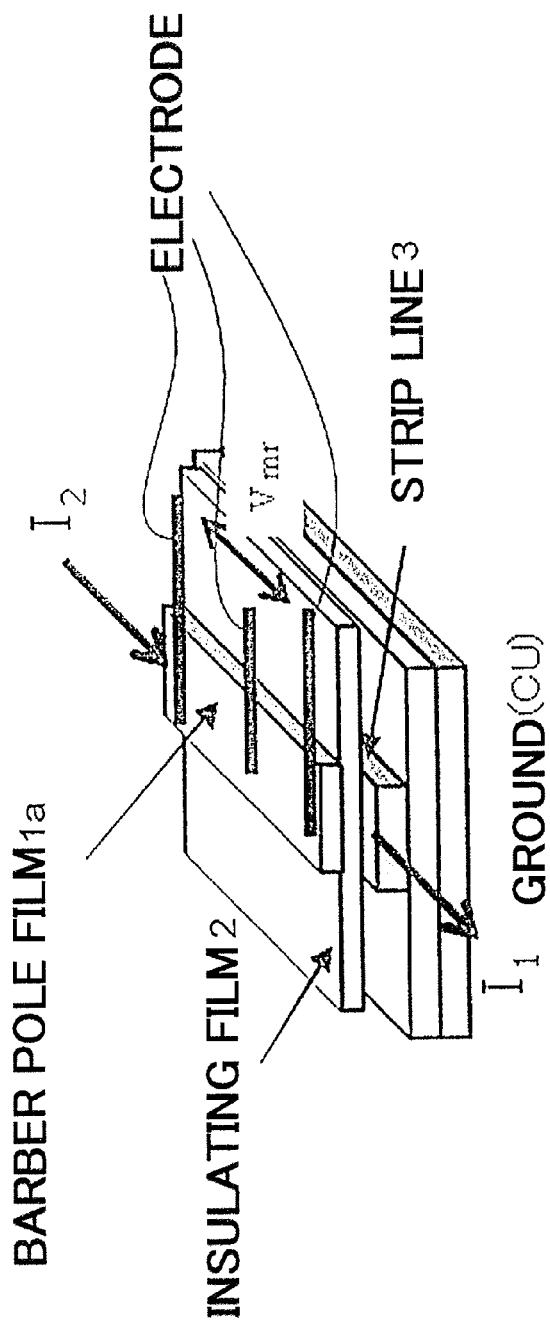

FIG. 29 shows the sensor element of a differential barber pole magnetoresistive type power measuring apparatus, (a) is a photo taken from above and (b) is a schematic view illustrating the sensor element used for measuring a microstrip line. It is seen from FIG. 29(a) that a barber pole having inclinations different between right and left is made on top of the magnetic film. Note that FIG. 29(b) is different from FIG. 25(b) in the number of electrodes. FIG. 29(b) shows a sensor element of a type having a center tap electrode.

Figure 30A:
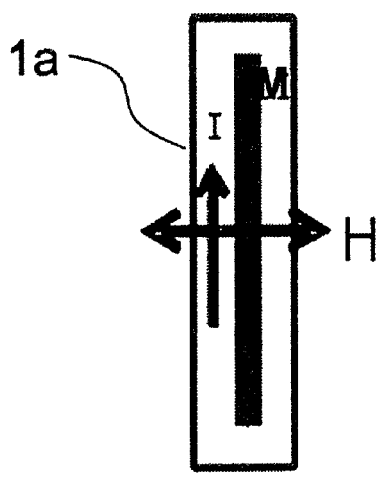
FIGS. 30(a) and 30(b) show how the electrical resistance of a magnetic film varies due to typical magnetoresistance effect.
Figure 30B:
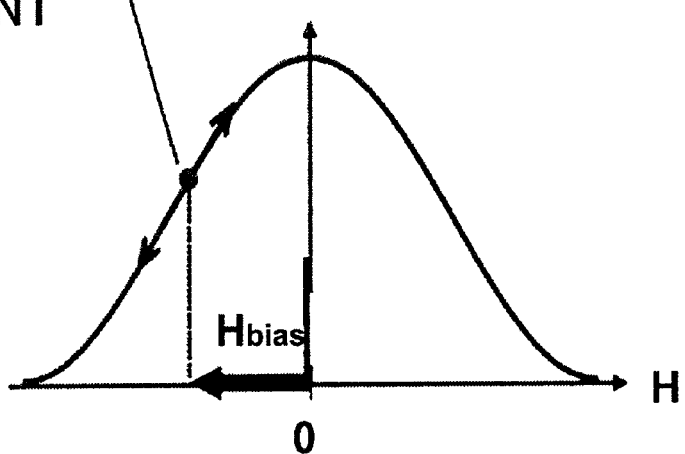

FIG. 30 shows how the electrical resistance of the magnetic film varies by typical magnetoresistance effect. FIG. 30(a) shows a strip-shaped magnetic film 1a and a magnetic field H generated by the current flowing through the load. FIG. 30(b) shows the relationship between the voltage between both the ends (the vertical axis) when a current flows through the strip-shaped magnetic film in the longitudinal direction and the magnetic field H (the horizontal axis). The voltage $V_{MR}$ on the vertical axis is proportional to a resistance R. It has already been mentioned that this output voltage characteristic exhibits an even function about the point of zero magnetic field H.

On the other hand, referring to FIG. 31(a), the magnetoresistance effect of the differential type barber pole magnetic film 1bbp of barber pole patterns of different inclinations exhibits the characteristics that would be made available when bias magnetic fields that are different, i.e., positive and negative depending on the direction of inclination of the diagonal conductors are applied. As shown in FIG. 31, the barber pole magnetic film 1bbp a on the left exhibits a characteristic B of being negative biased by an external applied magnetic field and the barber pole magnetic film 1bbpp on the right exhibits a characteristic A of being positive biased.

These different barber pole magnetic films 1bbp a and 1bbpp may be connected in series and subjected to a magnetic field in the same direction, e.g., from left to right. In this case, the resistance of each barber pole magnetic film will vary in such a manner as to decrease in one film, but increase in the other. A differential output thereof would make it possible to take only changes with the zero magnetic field point employed as the operating point, as shown in FIG. 31(b). This is called the differential type barber pole magnetic film.

Furthermore, to employ a typical magnetoresistive magnetic film 1a, is necessary to apply a large bias magnetic field as shown in FIG. 30 so as to set the operating point to a point of good linearity. However, as shown in FIG. 31, the differential type barber pole magnetic film can be employed to move the operating point to a zero magnetic field. It is also possible to enhance a change in electrical resistance caused by the magnetic field to twice. It is also possible to obtain an output voltage with no bias magnetic field.

Figure 32:
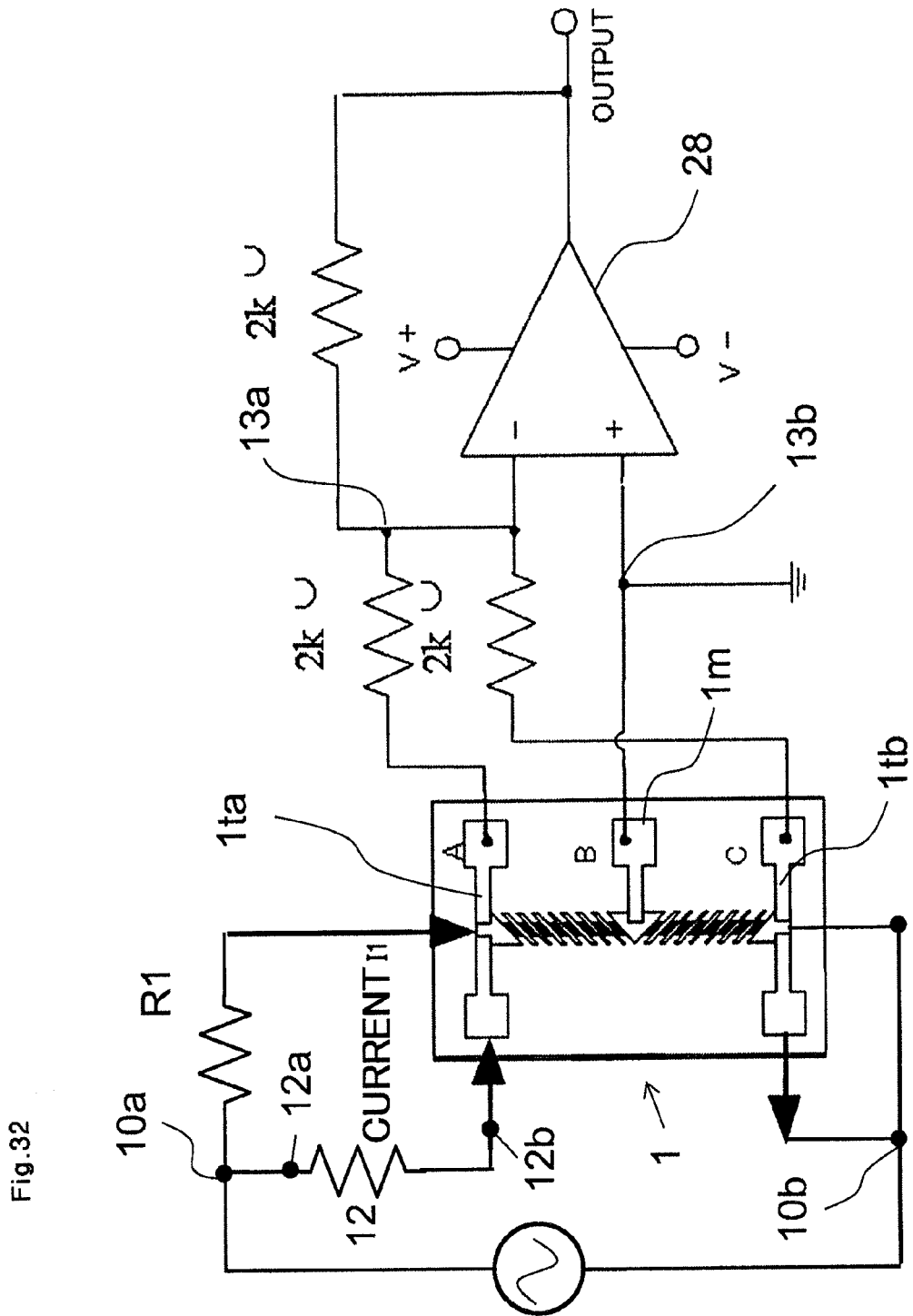
FIG. 32 illustrates how an amplifier circuit is connected to a differential barber pole magnetoresistive type power measuring apparatus.

FIG. 32 shows the configuration of the differential type barber pole magnetoresistive type power measuring apparatus which incorporates the differential type barber pole magnetic film as the sensor element. The power supply supplies a current to the load R1. There is provided a connection line for connecting between the load and the power supply. The sensor element 1 is disposed on part of the connection line in such a manner that the longitudinal direction of the magnetic film is consistent with the direction of the connection line. FIG. 32 shows that the current flowing into the load R1 flows downwardly through the sensor element 1. The connection ends 10a and 10b are coupled to the circuit formed of the power supply and the load so as to be in parallel to the load R1.

The connection end 10a is connected with one end 12a of the measurement resistor 12. The other end 12b is connected to the sensor terminal 1ta. The sensor terminal 1tb is connected to the connection end 10b. The sensor terminals 1ta and 1tb are connected to each other at a point with a resistor therebetween. This point is a measurement terminal 13a. On the other hand, the center tap electrode 1m is grounded and serves also as the measurement terminal 13b. The voltage detecting unit 28 detects the potential difference between the measurement terminals 13a and 13b.

Although FIG. 32 shows, as the voltage detecting unit 28, the operational amplifier to be provided with negative feedback. However, any means other than this may also be employed. With the terminal B of FIG. 32 (the center tap electrode) grounded, electrical signals from the terminal A (the sensor terminal 1ta) and terminal C (the sensor terminal 1tb) are summed in the operational amplifier, thereby making it possible to obtain an electrical signal which outputs only a change in magnetic field without any bias voltage.

Figure 33:
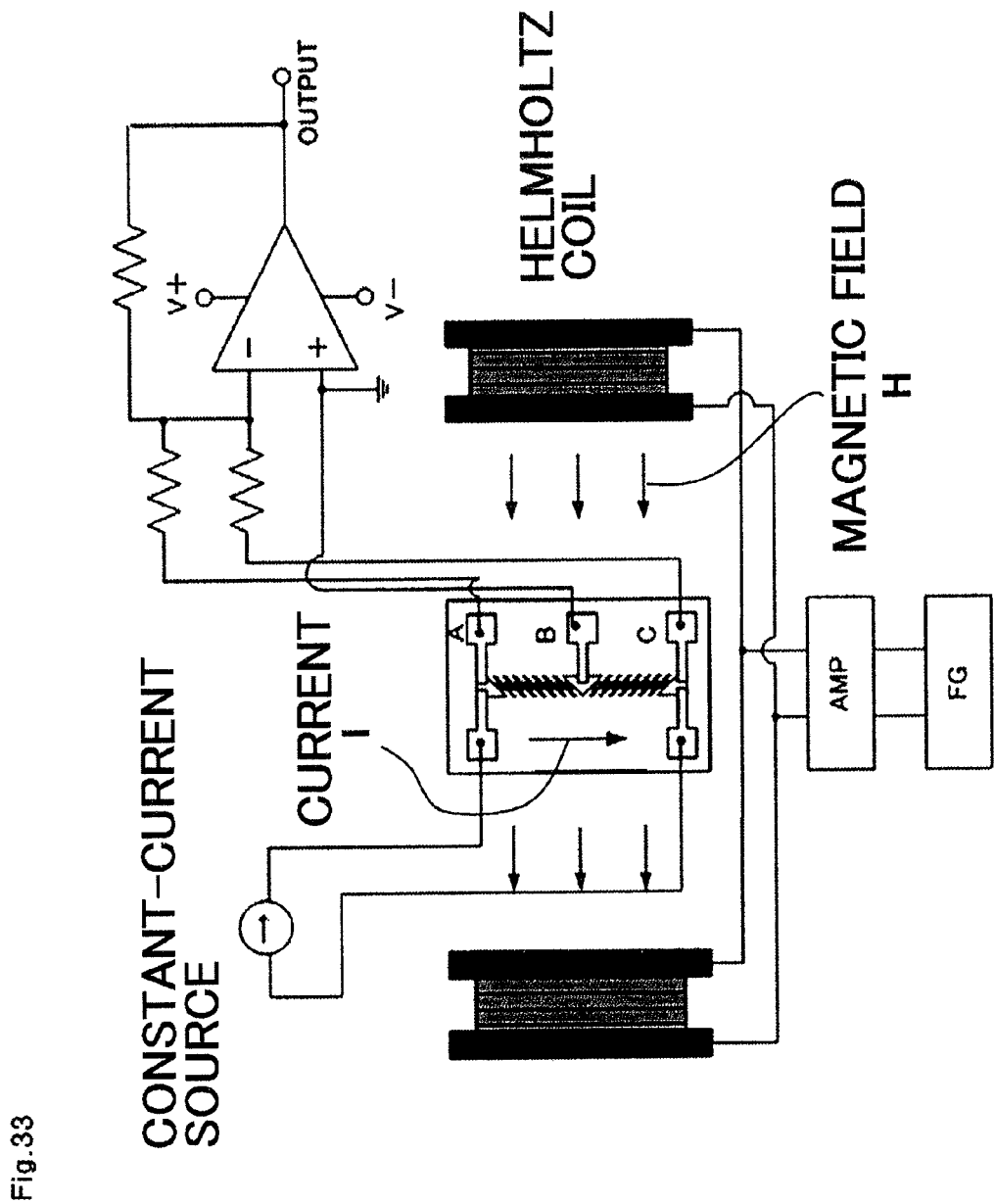
FIG. 33 illustrates a specific measurement system in relation to FIG. 32.

FIG. 33 shows the measurement system for an experiment which was conducted to check the operation of the sensor element that incorporates the differential type barber pole magnetic film. The magnetic field applied to the differential type barber pole magnetic film was produced by a Helmholtz coil. Furthermore, the current allowed to flow through the magnetic film was supplied by the constant-current source. Note that the values of all the resistors of the amplifier are 2 kilo ohms and the amplification gain is one.

Figure 34:
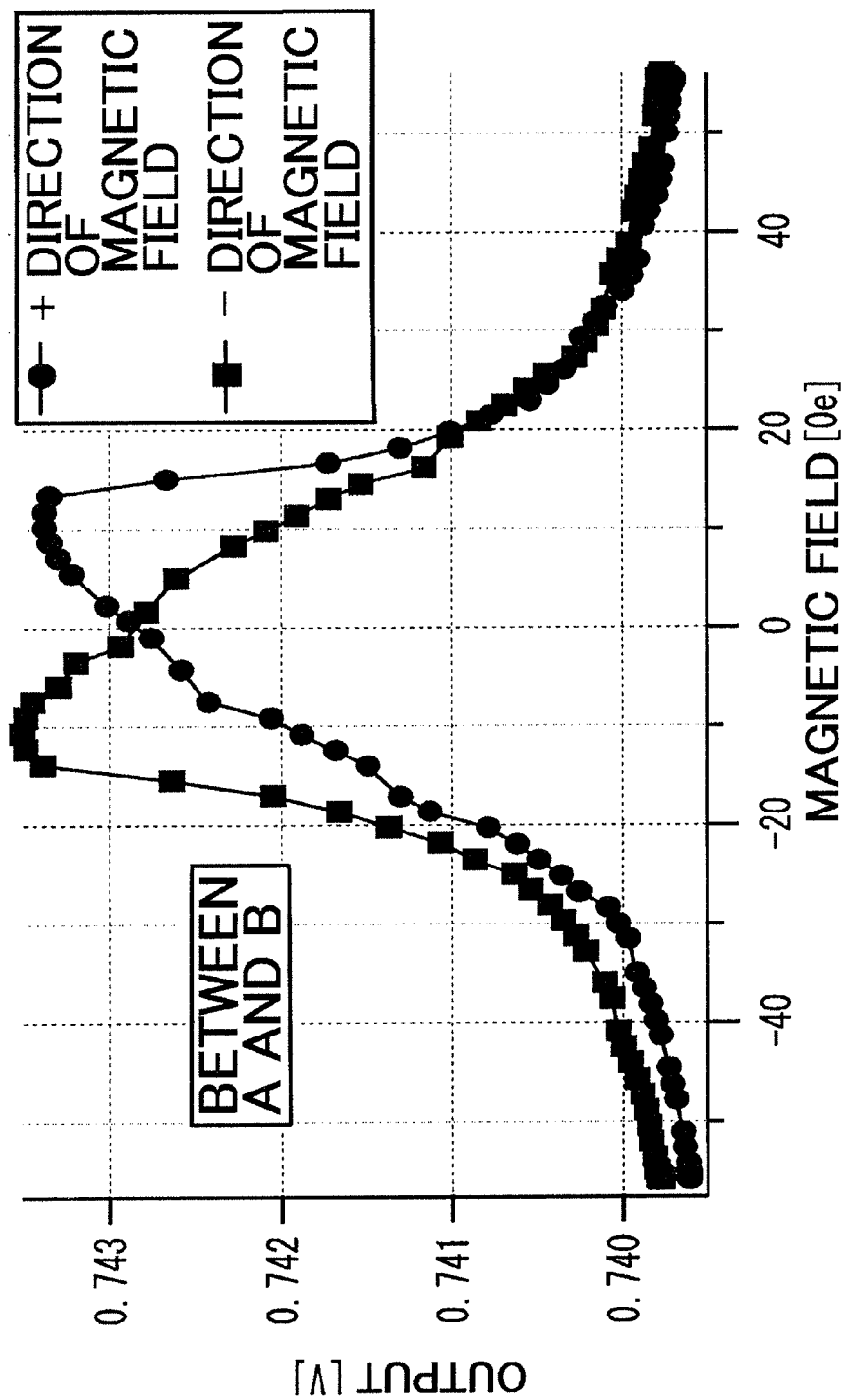
FIG. 34 shows the output characteristics between A and B terminals of FIG. 33.
Figure 35:
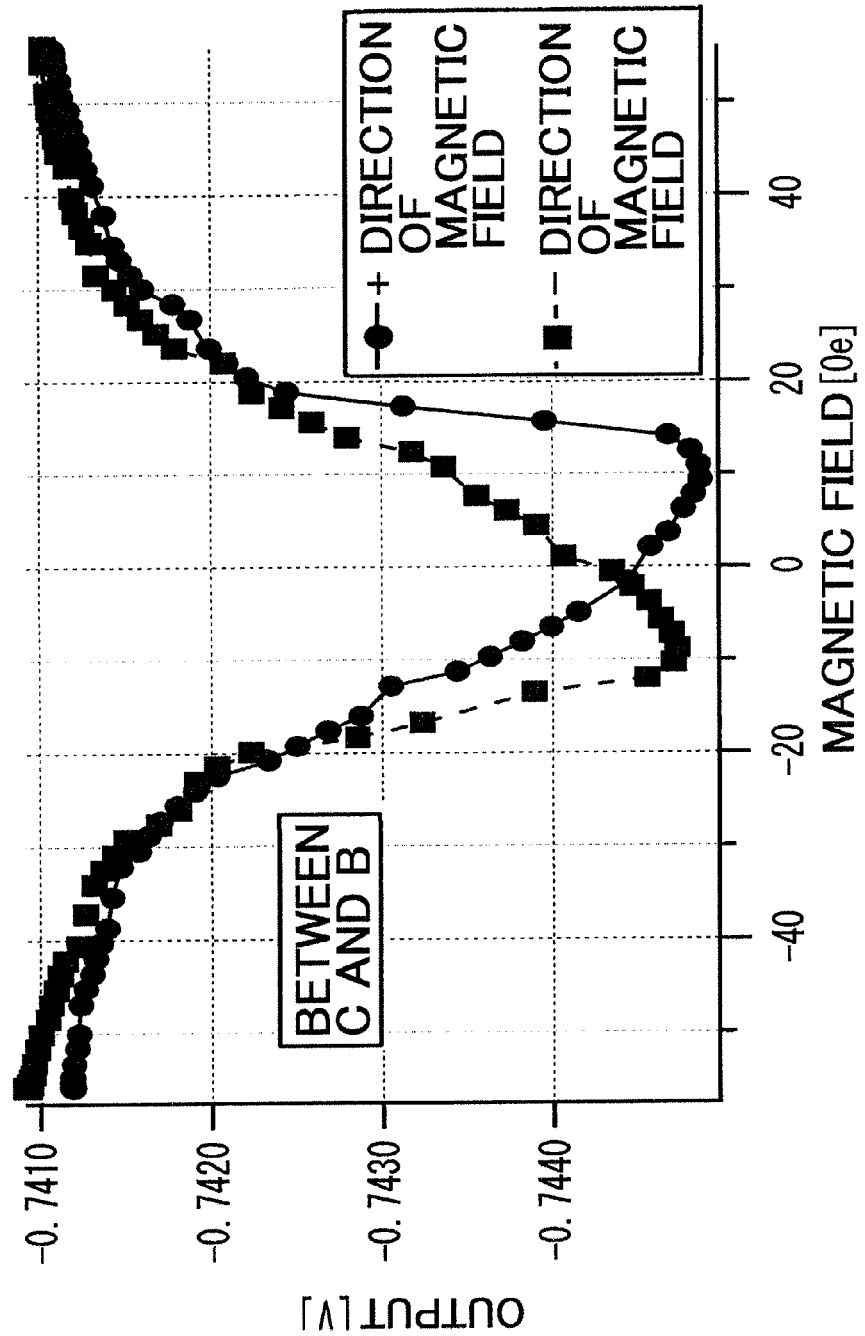
FIG. 35 shows the output characteristics between C and B terminals of FIG. 33.

Measured next was the output characteristics of the power measuring apparatus with the barber pole magnetic film in the presence of a uniform external magnetic field. FIG. 34 shows the output characteristics between the terminals A and B of the measurement system shown in FIG. 33; FIG. 35 shows the output characteristics between terminals C and B of the measurement system; and FIG. 36(c) shows the output voltage of the operational amplifier of the measurement system.

Note that the output characteristics between the terminals A and B shown in FIG. 34 are such that the output offset between A and B is 742 [mV], the change in output between A and B is 4 [mV], the rate of change in output between A and B is 0.42 [%], and the rate of change in resistance is 0.0031/0.7420*100=0.42 [%].

Furthermore, the output characteristics between terminals C and B shown in FIG. 35 are such that the output offset between C and B is 743 [mV], the change in output between C and B is 2.6 [mV], the rate of change in output between C and B is 0.35 [%], and the rate of change in resistance is 0.0026/0.7430*100=0.35 [%].

Figure 36:
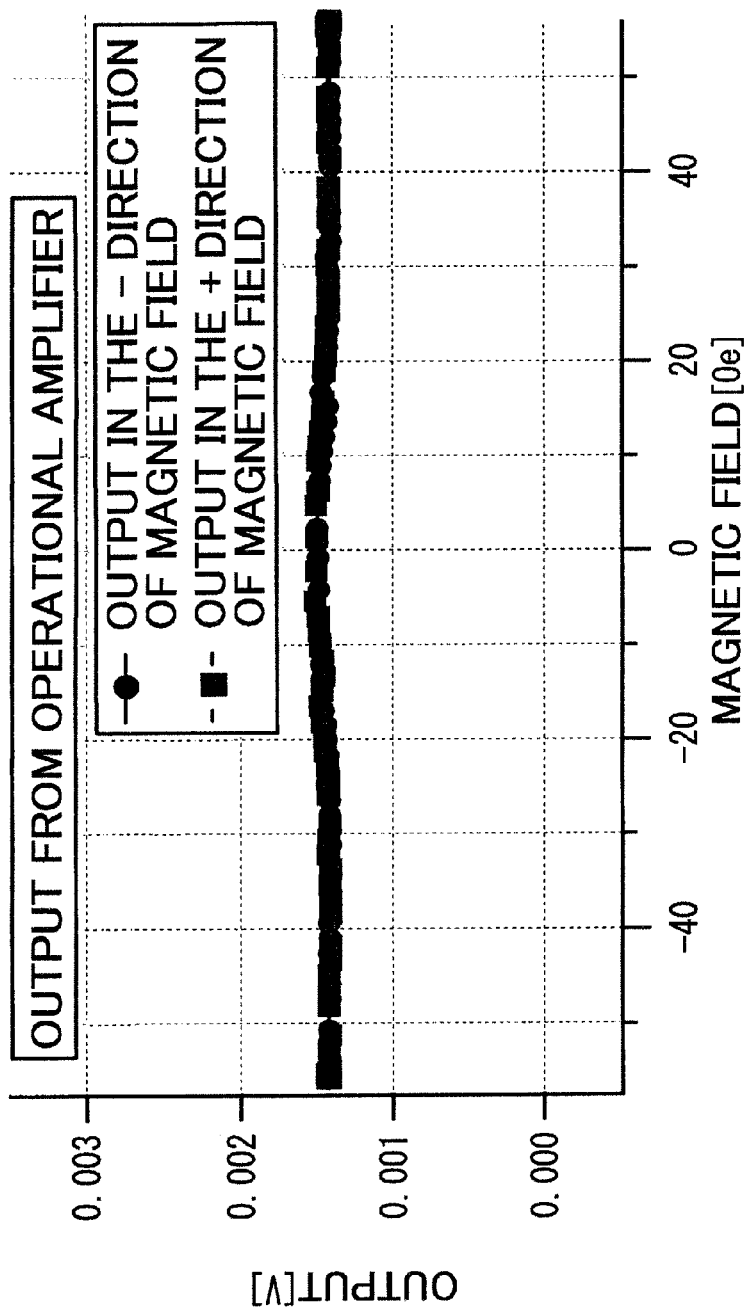
FIG. 36 shows the output voltage from an operational amplifier of FIG. 33.

Furthermore, the output characteristics shown in FIG. 36(c) of the operational amplifier of FIG. 33 are such that the output offset between A and C is 1.46 [mV], the change in output between A and C is 0.11 [mV], the rate of change in output between A and C is 7.5 [%], and the rate of change in resistance is 0.00011/0.00146*100=7.5 [%].

FIG. 34 and FIG. 35 show a significant change in resistance with the magnetic field. In FIG. 36(c) as compared with FIG. 34 and FIG. 35, it is seen that the bias voltage was significantly reduced. On the other hand, the magnetic field caused an insignificant change in output voltage. Thus, it is thought that the direction of magnetization and the magnetic domain structure in the magnetic film 1c are not in a multi-magnetic domain state but in a single magnetic domain state with uniaxial anisotropy.

TABLE 2

|  | Between A and B (a) | Between C and B (b) | Average (c) ((a) + (b))/2 | Between A and C (d) (Differential) | Differential/ Average (d)/(c) |
|---|---|---|---|---|---|
| Output offset | 742 [mv] | 743 [mv] | 742.5 [mv] | 1.5 [mv] | 0.20[%] |
| Change in output | 4 [mv] | 2.6 [mv] | 3.3 [mv] | 0.11 [mv] | 3.3[%] |
| Rate of change in output (Change/Offset) | 0.42 [%] | 0.35 [%] | 0.385 [%] | 7.5 [%] | 1950[%] |

Table 2 shows the results of improvements in the output by the differential type barber pole magnetic thin film. The significant reductions in the change in output and the rate of change in output are estimated to be caused by the fact that the magnetization of the film is not sufficiently aligned in the longitudinal direction of the element. However, it is seen that an abrupt reduction in the offset voltage led to a sharp improvement in the rate of change in resistance and that the differential connection of the barber pole magnetic film resulted in a great improvement in the performance of the device. The reduction in the offset voltage led to a very advantageous result, enabling an amplifier circuit connected to the element to have an enhanced amplification factor.

Figure 37:
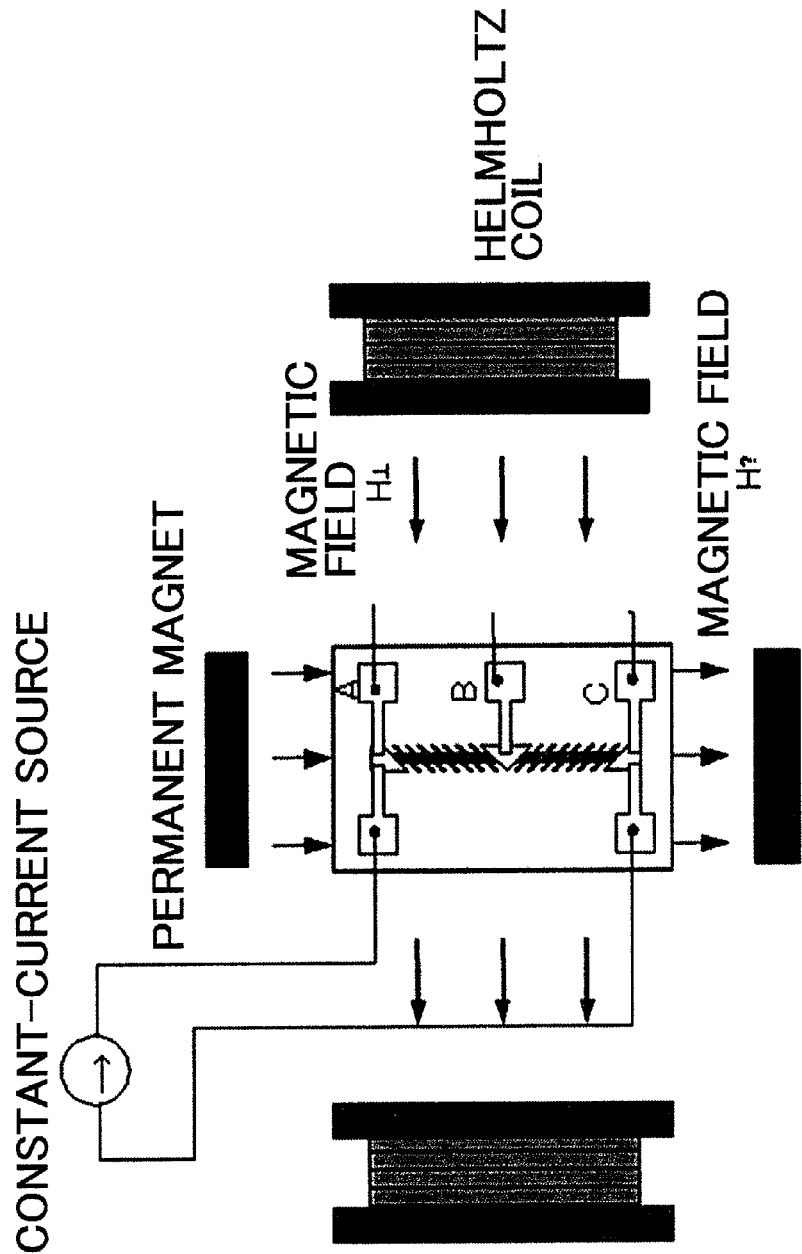
FIG. 37 is a schematic view illustrating a measurement system when a bias magnetic field is applied in parallel to the longitudinal axis.

Now, FIG. 37 is a schematic view illustrating a measurement system employed to apply a DC bias magnetic field in parallel to the longitudinal direction of the magnetic film. This is to apply the DC bias magnetic field to the magnetic film of the sensor element of the power measuring apparatus in the longitudinal direction of the sensor element. Here, the differential type barber pole magnetic film is shown, but any other type than the differential type may also be acceptable. In the power measuring apparatus, this is achieved by the DC bias magnetic field applying means. As previously stated, studies were conducted on the changes in characteristics of the element (device) by forcedly aligning the directions of magnetization in one direction.

Figure 38:
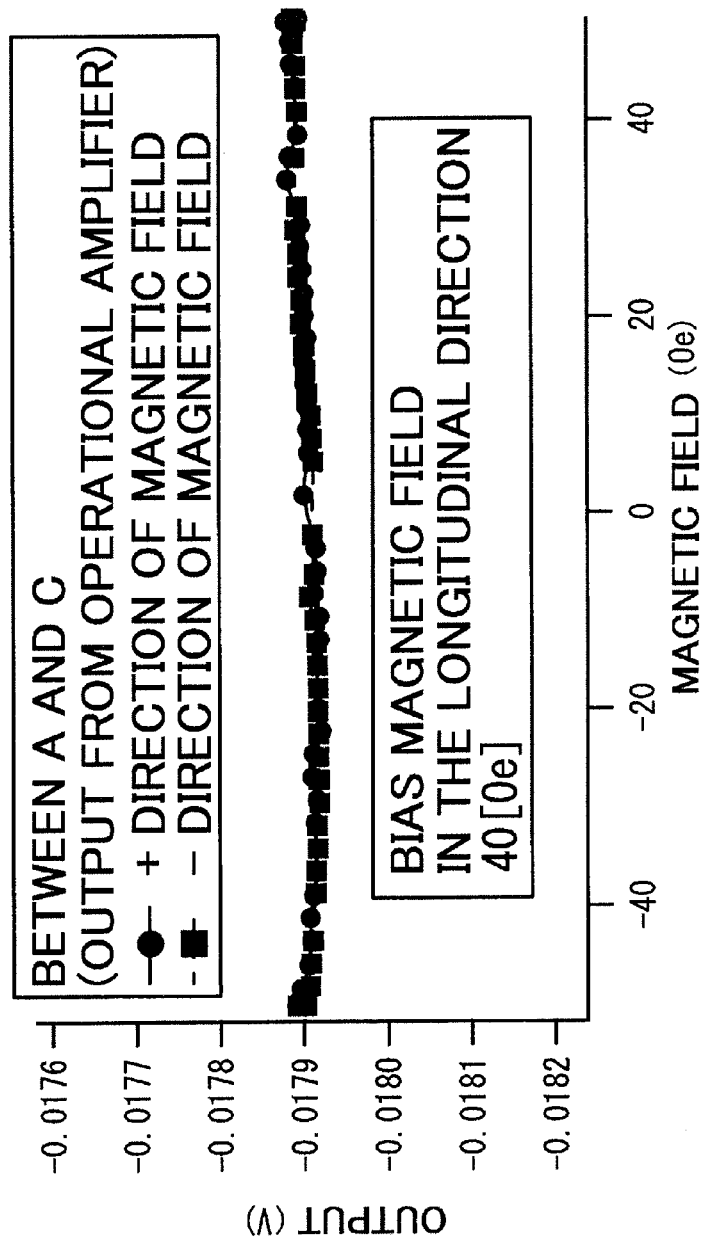
FIG. 38 shows the output characteristics of the measurement system of FIG. 37.
Figure 39:
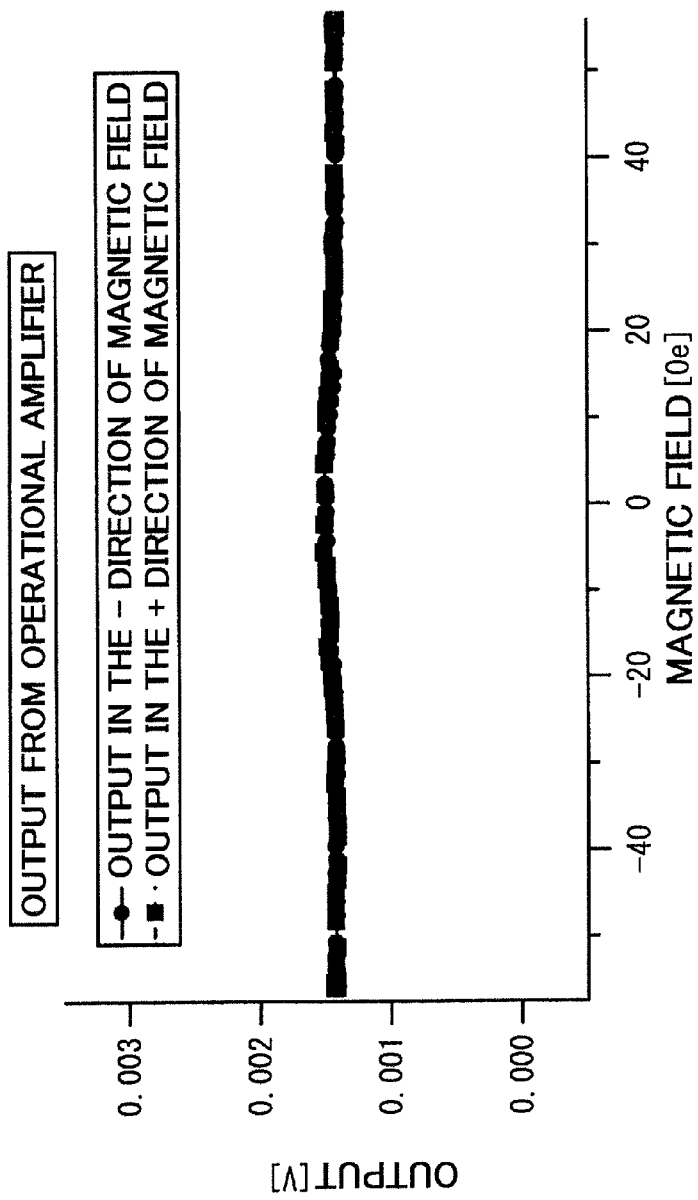
FIG. 39 shows the output characteristics of the measurement system of FIG. 37.
Figure 40:
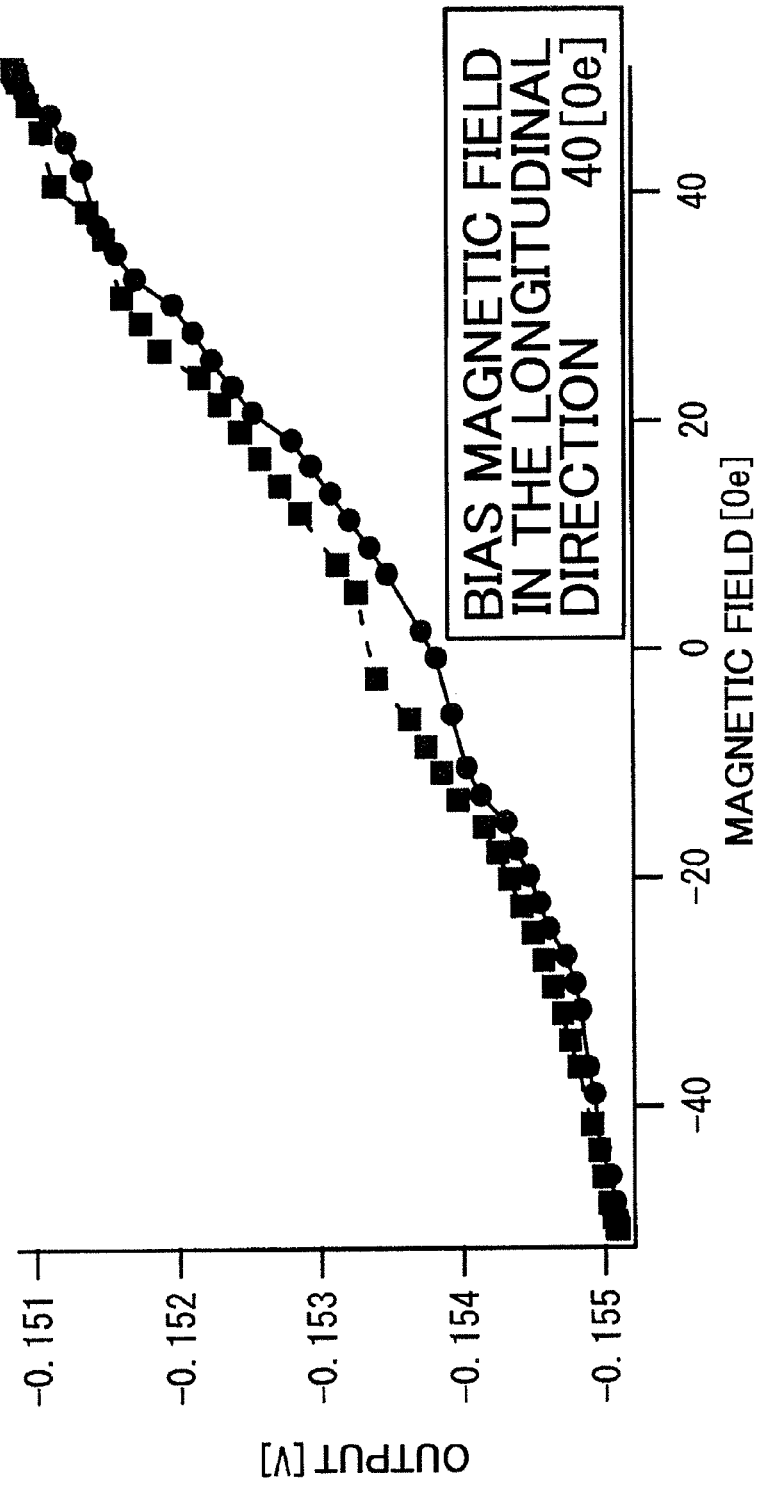
FIG. 40 shows the output characteristics of the measurement system of FIG. 37.

The output characteristics of the measurement system of FIG. 37 are shown in FIGS. 38 to 40. FIG. 38 shows the output characteristics when a bias magnetic field was applied, in the longitudinal direction of the magnetic film, to the sensor element (differential connection) incorporating a magnetic film prepared without the barber pole. The horizontal axis represents the externally applied magnetic field, and the vertical axis represents the output voltage. The change in resistance with no barber pole and with a bias magnetic field was very small, and the rate of change in resistance was as very small as 0.00022%.

FIG. 39 shows the output characteristics of the element with the barber pole and with no bias magnetic field in the longitudinal direction of the magnetic film, that is, the output characteristics with no DC bias magnetic field applied in the longitudinal direction of the barber pole magnetic film.

FIG. 40 shows the output characteristics of the element with the barber pole and with the bias magnetic field in the longitudinal direction of the magnetic film, that is, the output characteristics with the DC bias magnetic field applied in the longitudinal direction of the barber pole magnetic film 1. It is seen that the output characteristics significantly change depending on whether the DC bias magnetic field is applied in the longitudinal direction of the sensor element.

This can be estimated to be caused by an insufficient strength of the anisotropy of the magnetic film. It is estimated to be caused by the fact that the DC bias magnetic field in the longitudinal direction of the sensor element for complementing the strength of anisotropy causes the magnetization to be strongly aligned in the direction of the magnetic field, forming a distinct angle between the magnetization and the current. It can be said that the DC bias magnetic field was very effective because the rate of change in resistance was 0.6% with no DC bias magnetic field, but 3.3% or greater with the DC bias magnetic field.

Figure 41:
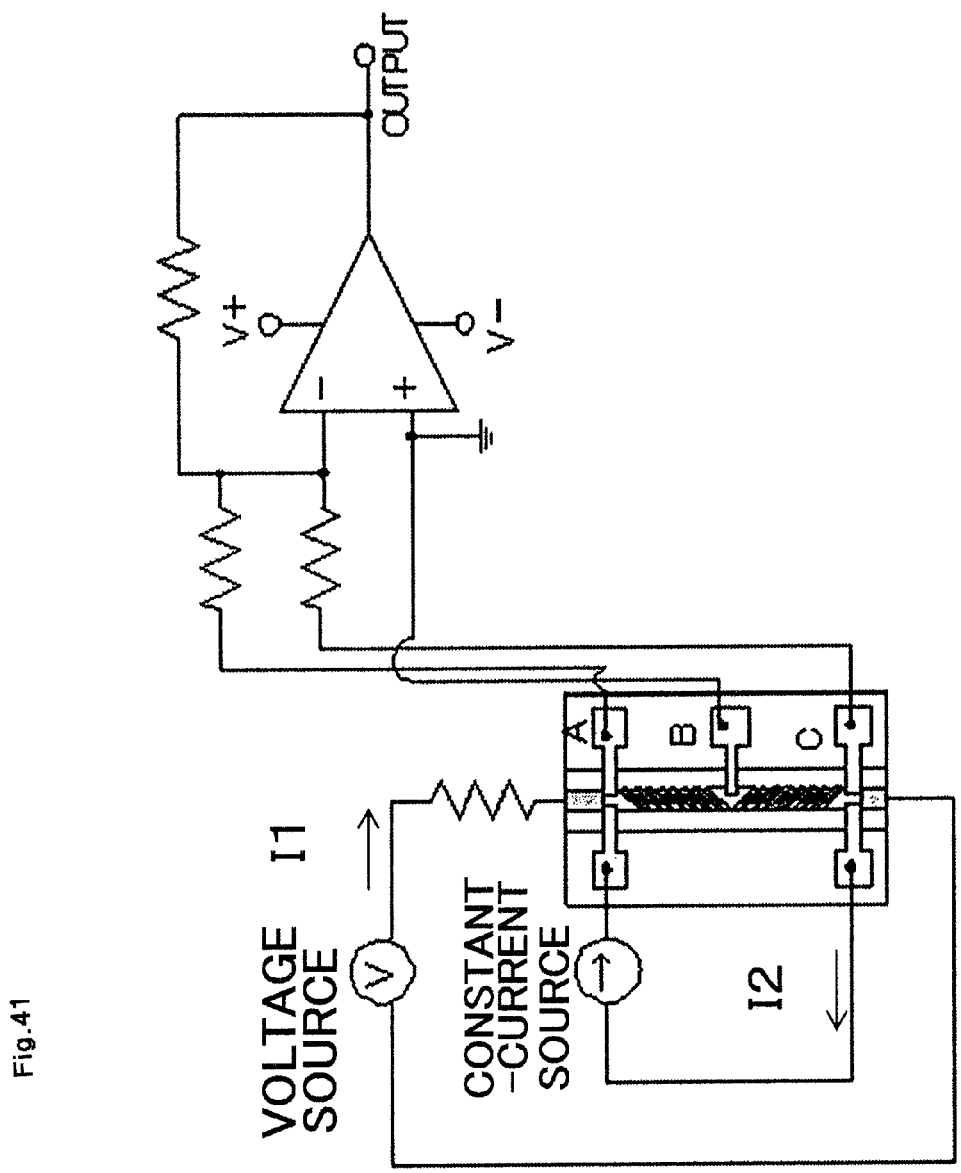
FIG. 41 illustrates a system for measuring characteristics as a power meter when a load current (I1) is allowed to flow through a conductor film.

FIG. 41 shows a measurement system as a power meter to measure the characteristics when a load current (I1) is allowed to flow through the conductor film. For typical power measurement, measurements are often made by allowing a current (I2) proportional to the magnitude of a load voltage to flow through the magnetic film. However, here, the characteristics were evaluated by making it possible to set the I1 and I2 individually. That is, it is possible to connect a constant-current power supply between the sensor terminals and allow a desired current to flow irrespective of the current flowing through the load.

Figure 42:
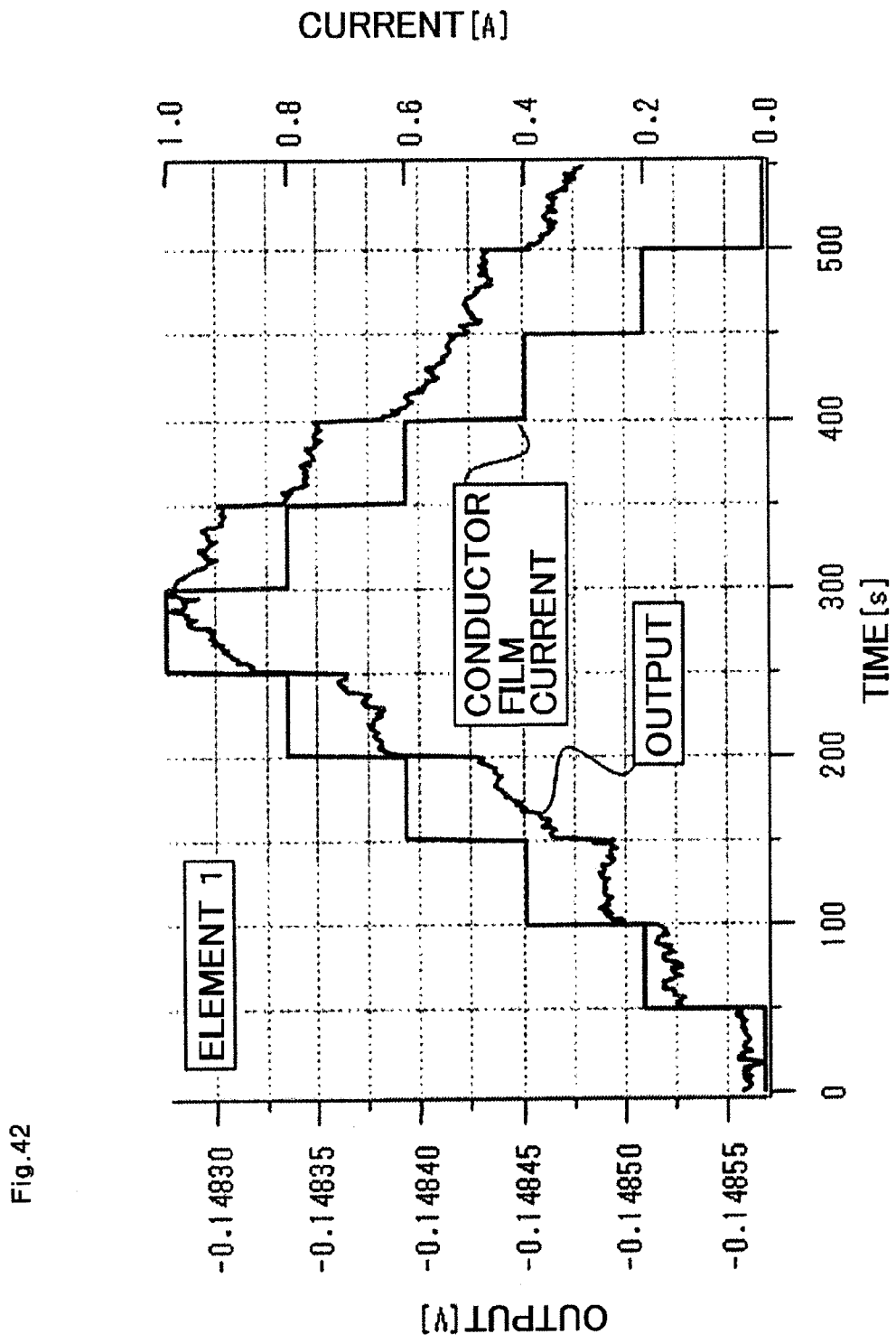
FIG. 42 shows the output characteristics when the load current (I1) is allowed to flow through the conductor film with no bias magnetic field applied.

FIG. 42 shows the output characteristics obtained when the load current (I1) is allowed to flow through the conductor film with no DC bias magnetic field applied. In this measurement, the direct current (I2) allowed to flow through the magnetic film was 2 mA. Furthermore, the load current (I1) was set using the DC power supply connected to the load resistor. While the load current was increased from 0 [A] to 1 [A] in increments of 0.2 [A] and thereafter, decreased in decrements of 0.2 [A], the measurements were conducted for 50 [s] at each step. Thus, in FIG. 42, the horizontal axis represents the time, but substantially represents the load current.

It is seen that the output increases as the load current (I1) increases. However, it cannot be said that the change in the power sensor output clearly reflects the change in the load current. It is thought to be partly due to the fact that the direction of magnetization of the magnetic film is not displaced in proportion to the magnetic field being applied.

Figure 43:
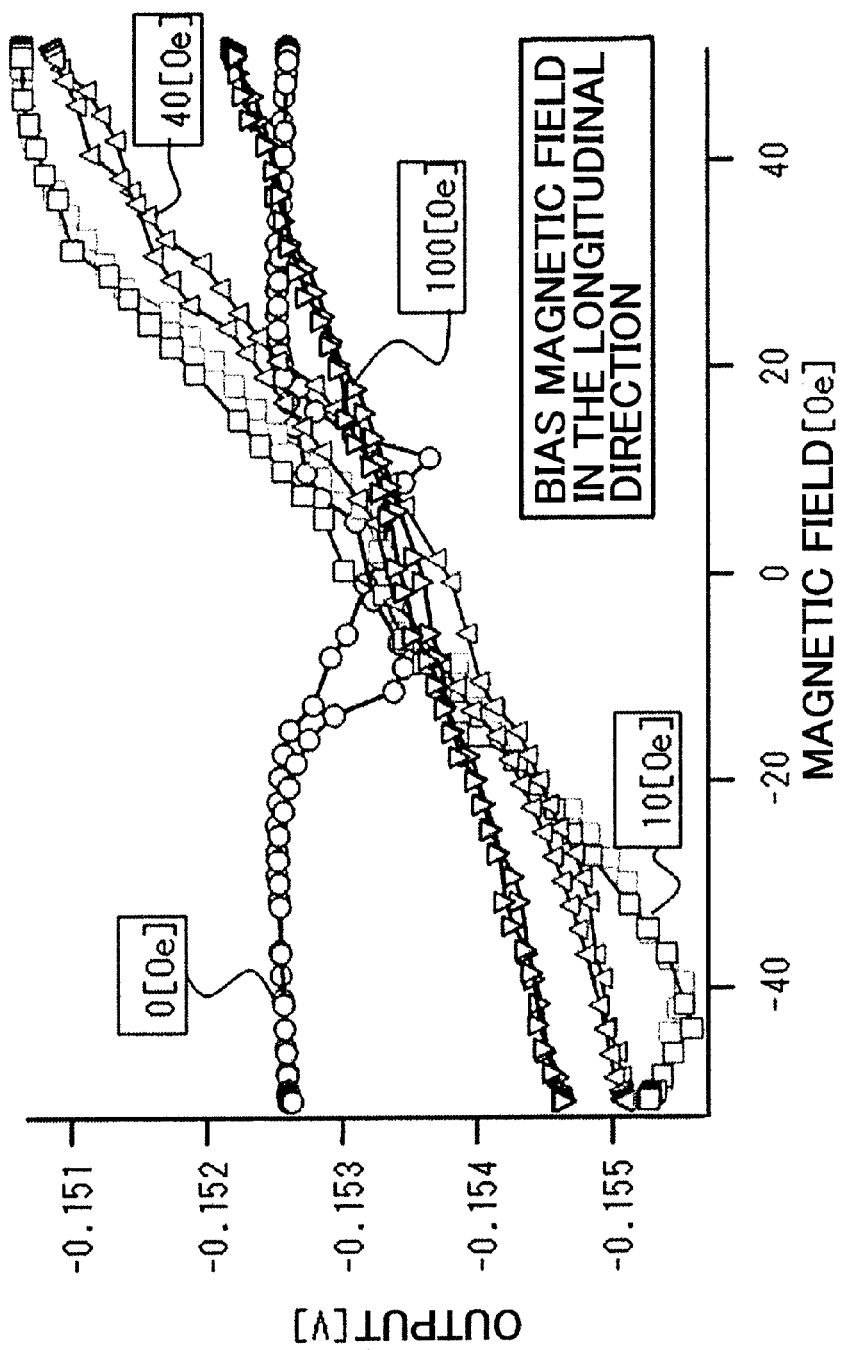
FIG. 43 shows changes in output when a magnetic field is applied in the longitudinal direction of an element (in the longitudinal direction of the magnetic film).

FIG. 43 shows the changes in output caused by applying a magnetic field (the DC bias magnetic field) in the longitudinal direction of the magnetic film. The horizontal axis represents the strength of the magnetic field acting upon the magnetic film, and the vertical axis represents the output voltage. With no bias magnetic field, the relationship between the strength of anisotropy and the direction of magnetization of the magnetic film does not uniquely determine the output as the power meter, so that no power meter can be made available. At the magnitudes of the DC bias magnetic field of 10 Oe and 40 Oe, a good linearity and a good sensitivity could be obtained over a wide range. However, degradation in sensitivity is found clearly at a DC bias magnetic field of 100 Oe.

However, at 100 Oe, when compared with 10 Oe and 40 Oe, an extended linear region is found. It is clear that up to a certain magnitude, the DC bias magnetic field can adjust the magnetic domain structure of the film and provide a high sensitivity and a good linearity. However, a high bias magnetic field can cause degradation in sensitivity.

It can be said that the application of the DC bias magnetic field that is slightly above the coercivity of the magnetic film provides an effect of significantly improving the sensitivity as the power meter, and that the application of the magnetic field greater than the anisotropic magnetic field will reduce the sensitivity, but has an effect of providing an enhanced range of operation as the power meter. It can be said that a measurable current (power) can be set by varying the magnitude of the magnetic field to be applied. However, the sensitivity will be reduced.

Figure 44:
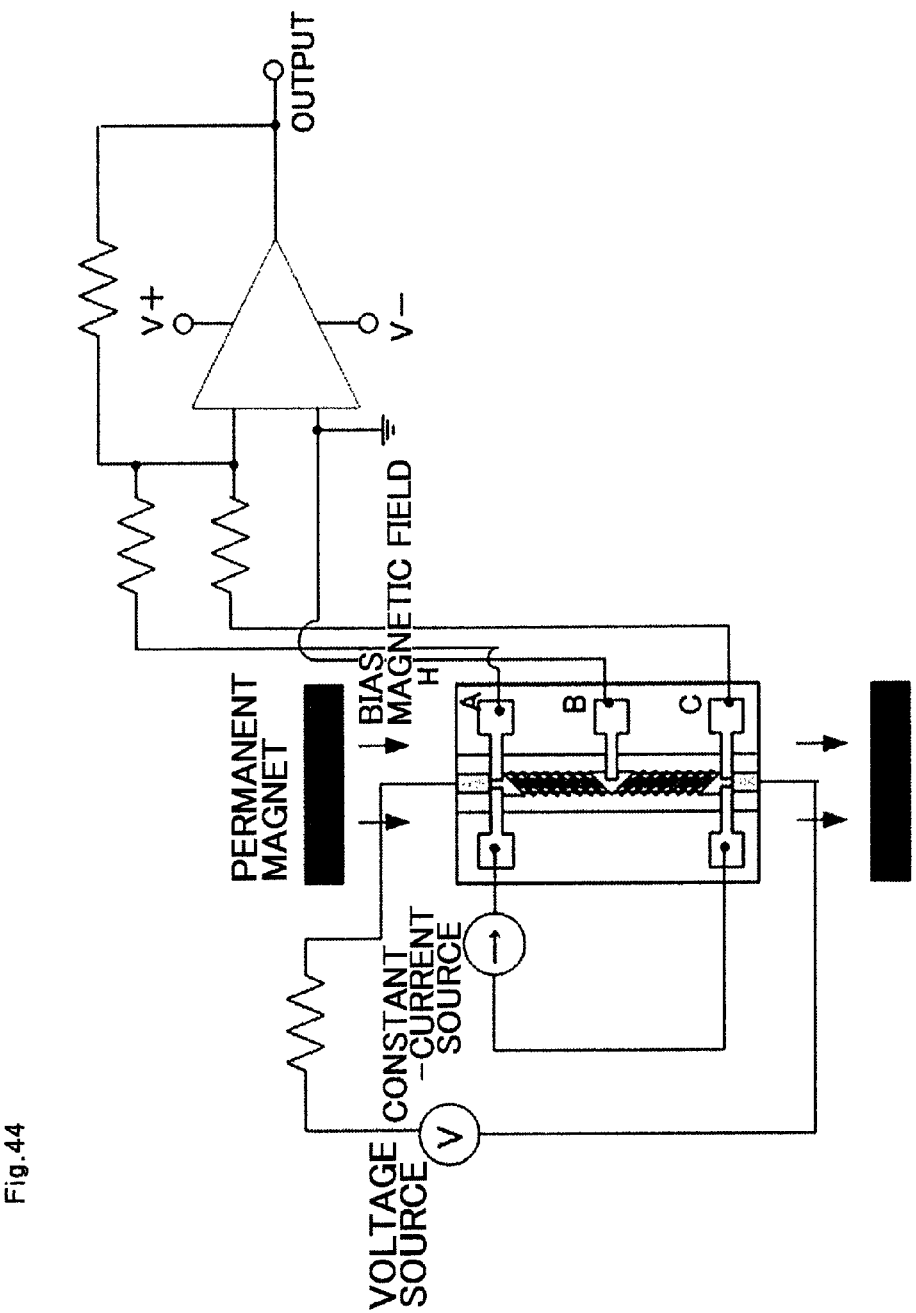
FIG. 44 illustrates a measurement system when a bias magnetic field is applied.

FIG. 44 shows the measurement system when the DC bias magnetic field was applied. Here, the DC bias magnetic field was applied using permanent magnets. The magnitude of the magnetic field was set by adjusting the distance between the magnets.

Figure 45:
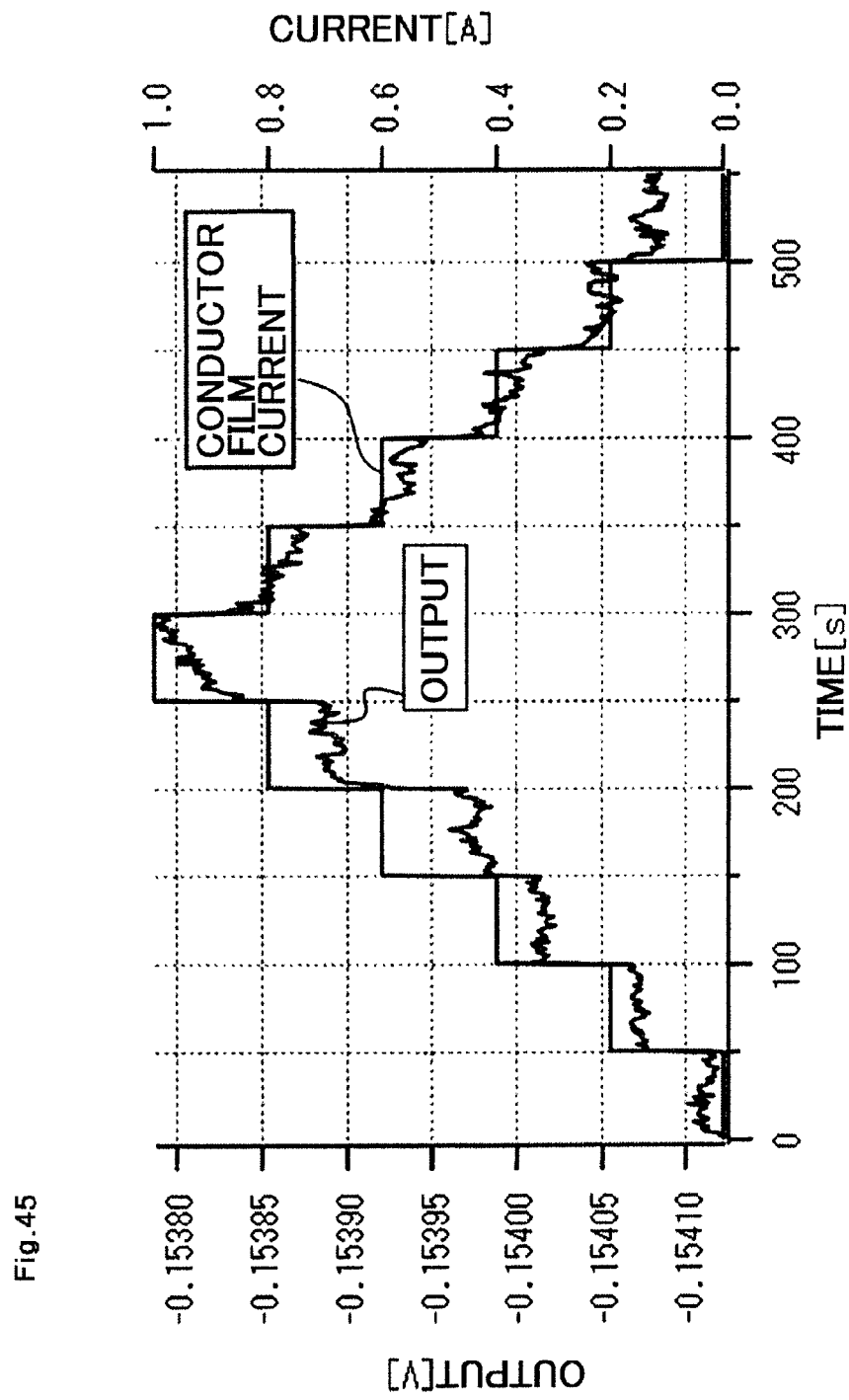
FIG. 45 shows the output characteristics of the magnetoresistive type power measuring apparatus with a bias magnetic field applied.

Furthermore, FIG. 45 shows the output characteristics of the magnetoresistive type power measuring apparatus when the DC bias magnetic field was applied. The magnitude of the DC bias magnetic field was 40 Oe. The other measurement conditions were the same as those of FIG. 42. It is clear from FIG. 45 that the application of the DC bias magnetic field enhances the trackability of the output voltage to the change in current.

Furthermore, although there arose slight errors, it is thought that significant improvements can be expected by the improvement in the film characteristics, the use of the aforementioned bandpass filter, and the application of an AC bias as illustrated in FIGS. 16 to 21. Furthermore, it is thought that the apparatus will operate for AC power measurement with no problem.

It can be concluded from the results described above that the barber pole type magnetic film power measuring apparatus and the differential type barber pole magnetic film power measuring apparatus are best applicable to smart grids and smart batteries and advantageously employed to avoid power shortage or the like. Note that even when the sensor element with the barber pole type magnetic film is employed, the application of an AC bias magnetic field in a direction perpendicular to the current flowing through the sensor element would provide an effect of stabilizing the output, as shown in FIGS. 17 and 18. That is, even the sensor element with the barber pole type magnetic film could constitute the power measuring apparatus in conjunction with the AC bias magnetic field applying means.

Furthermore, it is possible to employ, as shown in FIG. 23, the sensor element in which the two barber pole type magnetic films with the diagonal electrical conductors tilted in the same direction are connected in series and the center tap electrode is provided at the connection point. Such a configuration makes it possible to cancel offsets that occur in each of the barber pole type magnetic film parts.

It was shown in FIG. 28 that the use of the barber pole type magnetic thin film leads to an operation that would be available in the presence of a bias magnetic field. This is thought to be because even when no external magnetic field was applied, the direction of the current flowing through the magnetic film was controlled to be different from the magnetization easy axis induced in the longitudinal direction. That is, even in the absence of the external magnetic field, it is possible to obtain the same characteristics as those shown in FIG. 28 if the magnetization easy axis and the direction in which the current flows are different from each other.

Figure 46A:
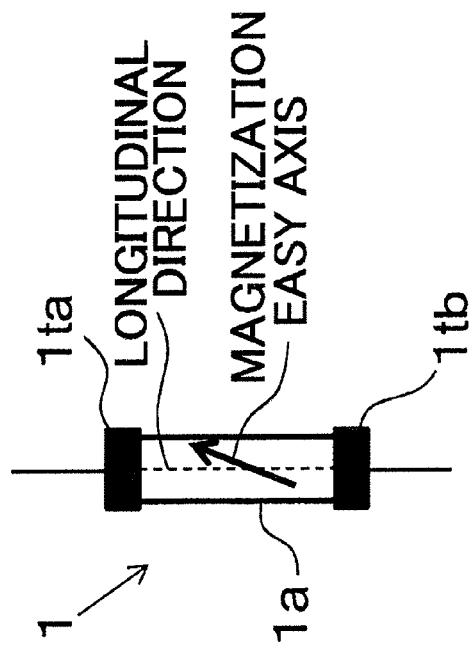
FIGS. 46(a) and 46(b) show a sensor element which employs a magnetic film that has a magnetization easy axis tilted relative to the longitudinal direction.

FIG. 46(a) shows the sensor element 1 with a magnetic film having the magnetization easy axis tilted relative to the longitudinal direction of the strip shape. The sensor element is strip-shaped with the sensor terminals are provided on the shorter sides of the strip shape. On the other hand, the magnetization easy axis is induced by being tilted relative to the longitudinal direction of the magnetic film. Such a magnetization easy axis tilted magnetic film also exhibits the same characteristics as those of the barber pole type magnetic film as shown in FIG. 28.

Thus, the power measuring apparatus with the sensor element having the magnetization easy axis tilted magnetic film does not require the DC bias magnetic field in a direction perpendicular to the longitudinal direction of the sensor element. Furthermore, such a power measuring apparatus can be constructed in the same manner as the power measuring apparatus described above.

Figure 46B:
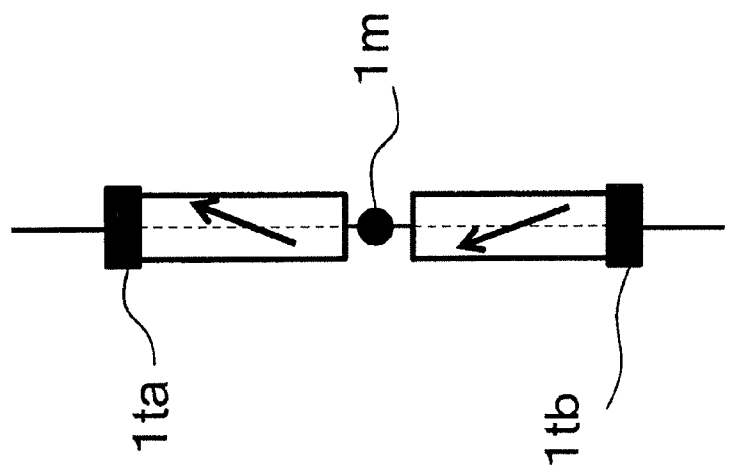

Furthermore, FIG. 46(b) shows the sensor element with two magnetization easy axis tilted magnetic films connected in series. The two magnetization easy axis tilted magnetic films connected in series and disposed in a straight line have different directions of inclination of the magnetization easy axes relative to the longitudinal direction. In such a sensor element, the operation characteristics of the magnetization easy axis tilted magnetic films are shifted from each other in the same manner as in FIG. 31. Thus, when a magnetic field is applied to such a sensor element in the sideward direction, it is possible to obtain the same effects as those of FIG. 31.

Furthermore, when the DC bias magnetic field is applied in the longitudinal direction of the magnetic film, it is possible to obtain the same effects as those of the sensor element with the barber pole type magnetic film. Furthermore, when the AC bias magnetic field is applied in the same direction as that of the magnetic field produced by the current flowing through the load, there is also available an effect of stabilizing the output as shown in FIGS. 17 and 18. That is, even when the sensor element with the magnetization easy axis tilted magnetic film is employed, it is possible to constitute the power measuring apparatus in conjunction with the DC bias magnetic field applying means or the AC bias magnetic field applying means.

It is also possible to use, as shown in FIG. 23, the sensor element in which two magnetization easy axis tilted magnetic films with the magnetization easy axes tilted in the same direction are connected in series and the center tap electrode is provided at the connection point. Such a configuration makes it possible to cancel offsets that occur in each of the magnetization easy axis tilted magnetic films.

<Power Measurement Circuit 3 and Measurement Results Provided Thereby>

Here, an actual power measurement circuit of the magnetoresistive type power measuring apparatus will be shown again.

A description will be made with reference to FIG. 7. As described above, in FIG. 7, a signal from the function generator 32 is supplied to the two amplifiers (DC amplifier) 34 and then amplified, thereby employing the resulting signal as an AC power supply. The high-frequency components of the output voltage from the sensor element 1 are cut in the low-pass filter 26. The DC components of the output voltage with the high-frequency components cut in the low-pass filter 26 are measured by the digital tester 28 (DMM).

This circuit is constructed such that the change in offset of the amplifier 34 (AMP1) will not affect the output voltage from the sensor element 1. The amplifier 34 (AMP1) and the amplifier 35 (AMP2) have the same amplification factor and deliver AC outputs at the same frequency. This is because if the input voltages are not at the same frequency, the output voltages have only an AC component.

In other words, the power measurement shown in FIG. 7 has the problem that it is difficult to carry out an accurate measurement because the low-pass filter 26 or the DMM 28 (see the image view of FIG. 47(b)) are used to measure a slight DC component of the output voltage (see the image view of FIG. 47(a)) that is superposed on an AC component.

Figure 48:
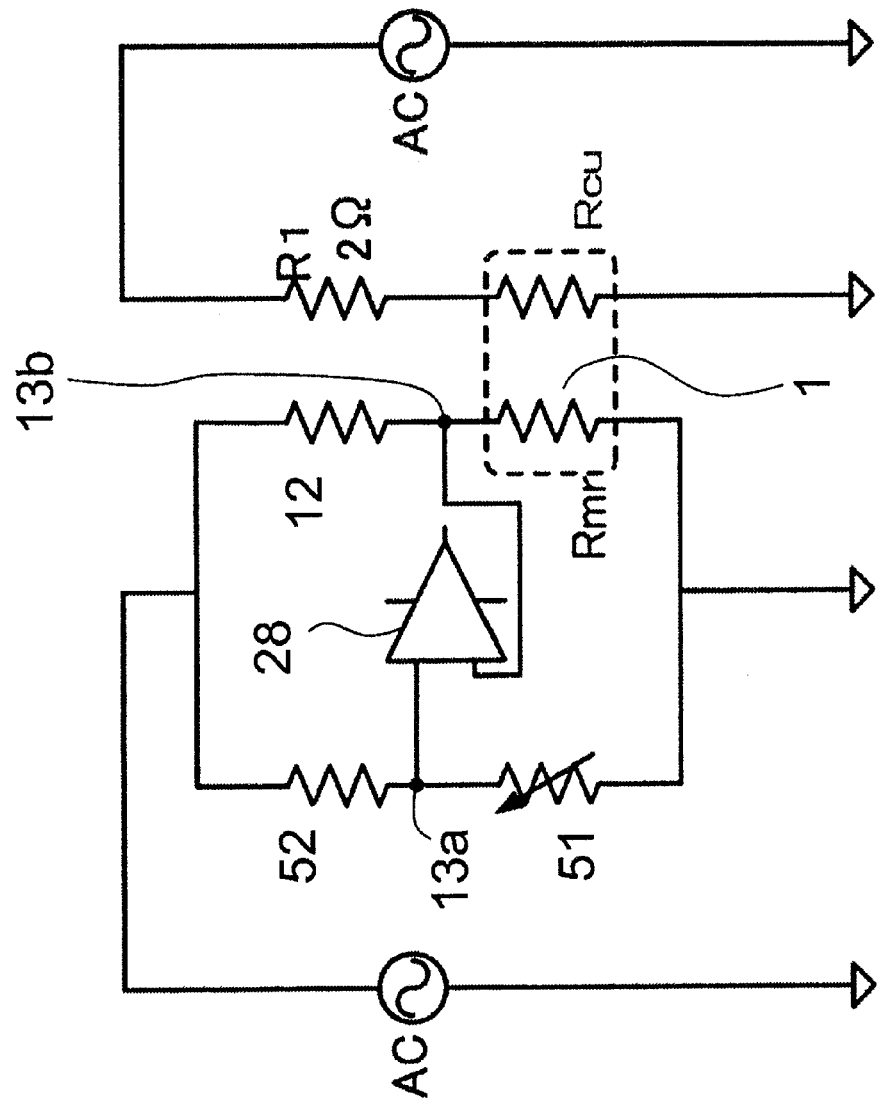
FIG. 48 illustrates a specific measurement circuit in relation to FIG. 47.

FIG. 48 shows part of the structure according to another embodiment of the power measuring apparatus of the present invention. This power measuring apparatus is configured to include an equivalent sensor resistor 51 and an equivalent measurement resistor 52 which are connected in parallel to the sensor element 1 and measurement resistor 13.

Then, with a connection point 53 between the equivalent sensor resistor 51 and the equivalent measurement resistor 52 and a connection point between the measurement resistor 12 and the sensor element 1 being defined as measurement terminals (13a, 13b), respectively, it is possible to take only the DC voltage component by differential amplification of the output voltage between the measurement terminals (see the image view of FIG. 47(c)). That is, it is possible to measure the power consumption of the AC power supply with high accuracy by constituting the bridge circuit that includes the sensor element and the measurement resistors. Note that the resistance values of each resistor are R1=2 ohms, Rcu<<1, and R2 and R2'=360 ohms, allowing differential amplification with a gain of 60 to 80 dB.

Figure 49A:
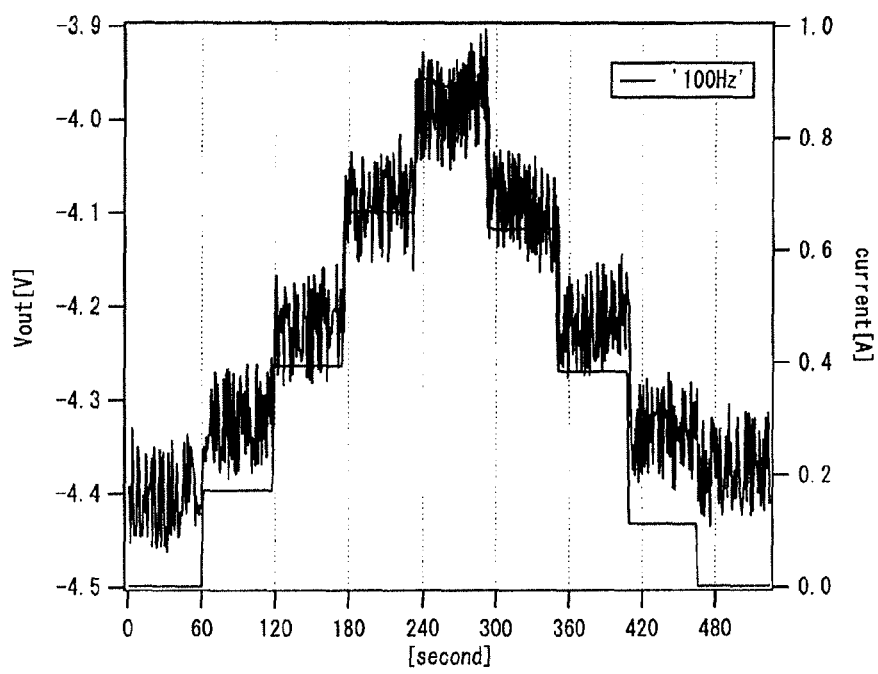
FIGS. 49(a) and 49(b) each show measurement results with the input alternating current (load current) on a reference side having an execution value of 4.0 V at 100 Hz.

A description will be now made to the measurement results provided by the measurement circuit 2 of FIG. 7 and the measurement circuit 3 of FIG. 48 above. The measurement results of FIGS. 49(a) and (b) are shown by comparison between the outputs from both the measurement circuits 2 and 3, in the case of which the AC input (load current) to each of the power measuring apparatuses (the AMP1 (34) side in FIG. 7) is an execution value of 4.0 V at 100 Hz. The horizontal axis represents the time, but substantially the current flowing through the load, and the vertical axis represents the output of the amplifier. It can be seen from FIG. 49 that the differential amplification with a gain of 80 dB has improved the noise caused by the AC component as well as the DC offset.

Figure 49B:
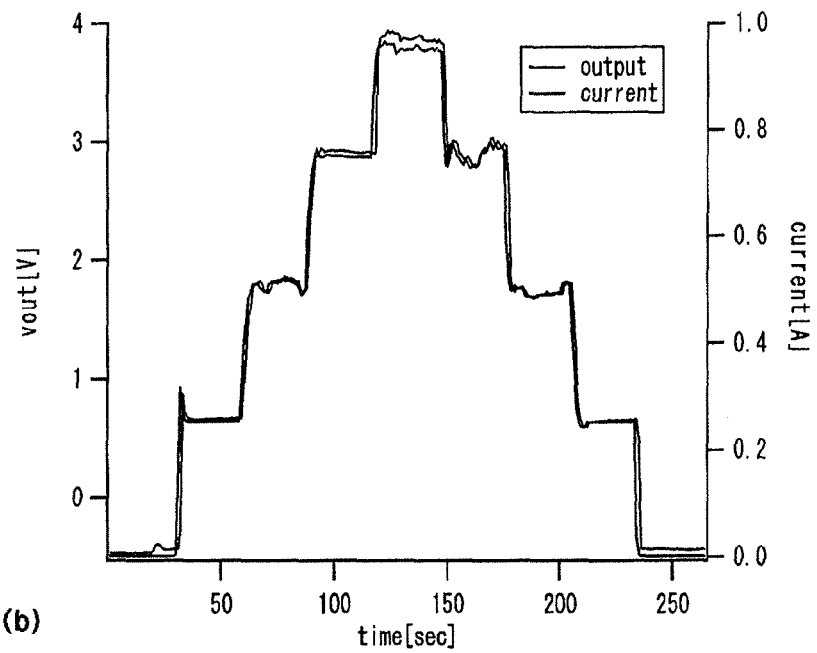
Figure 50:
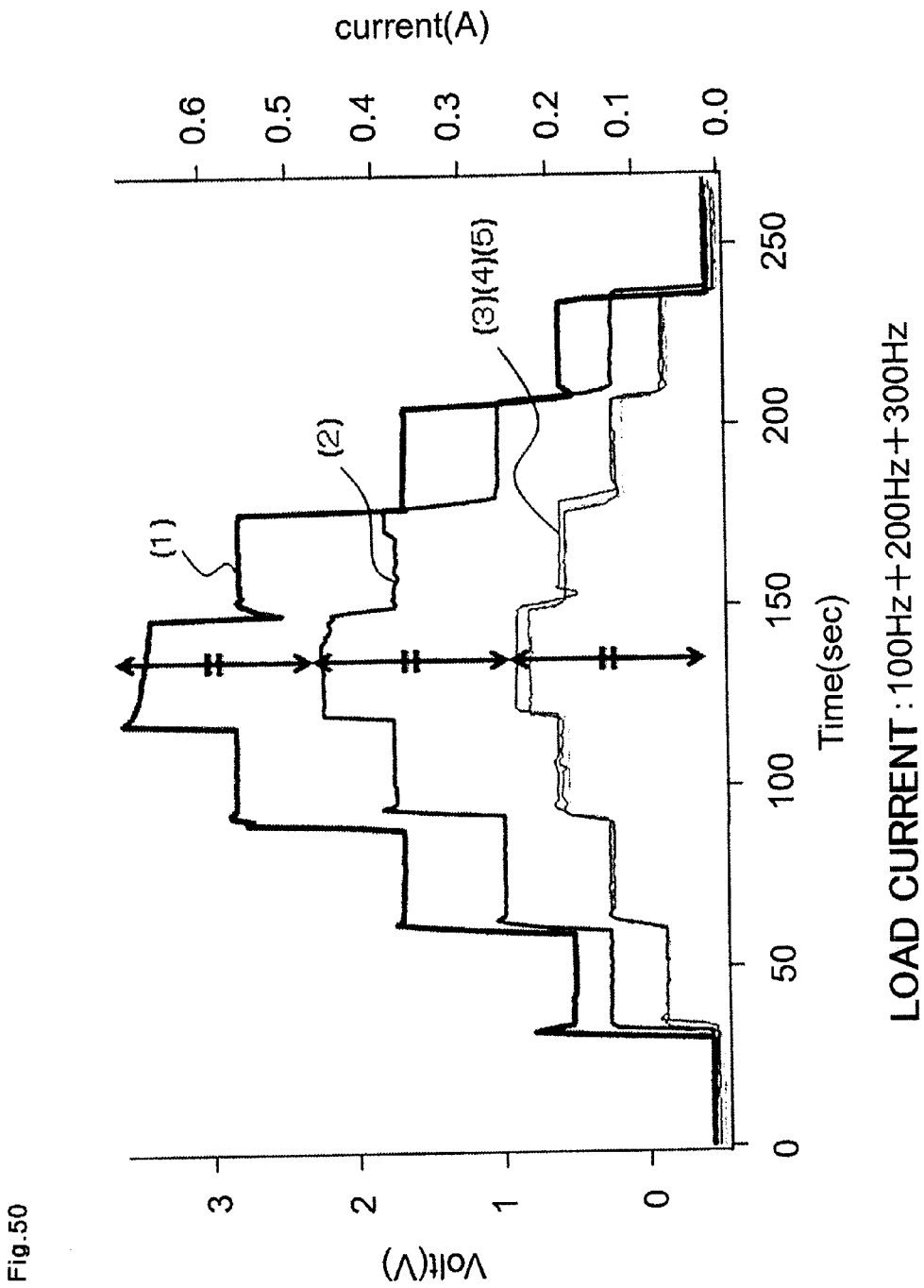
FIG. 50 is a graph showing the results of detecting harmonic currents in the same method as with FIG. 49(b).

FIG. 50 is a graph showing the results obtained by detecting harmonic currents in the same method as in FIG. 49(b). This graph shows the measurement results of the outputs provided when currents are each supplied to the magnetic film of the power measuring apparatus at a frequency of (1) 100 Hz+200 Hz+300 Hz, (2) 100 Hz+200 Hz, (3) 100 Hz, (4) 200 Hz, and (5) 300 Hz. From the results, it can be seen that only the currents at each frequency were generally accurately detected.

Figure 51:
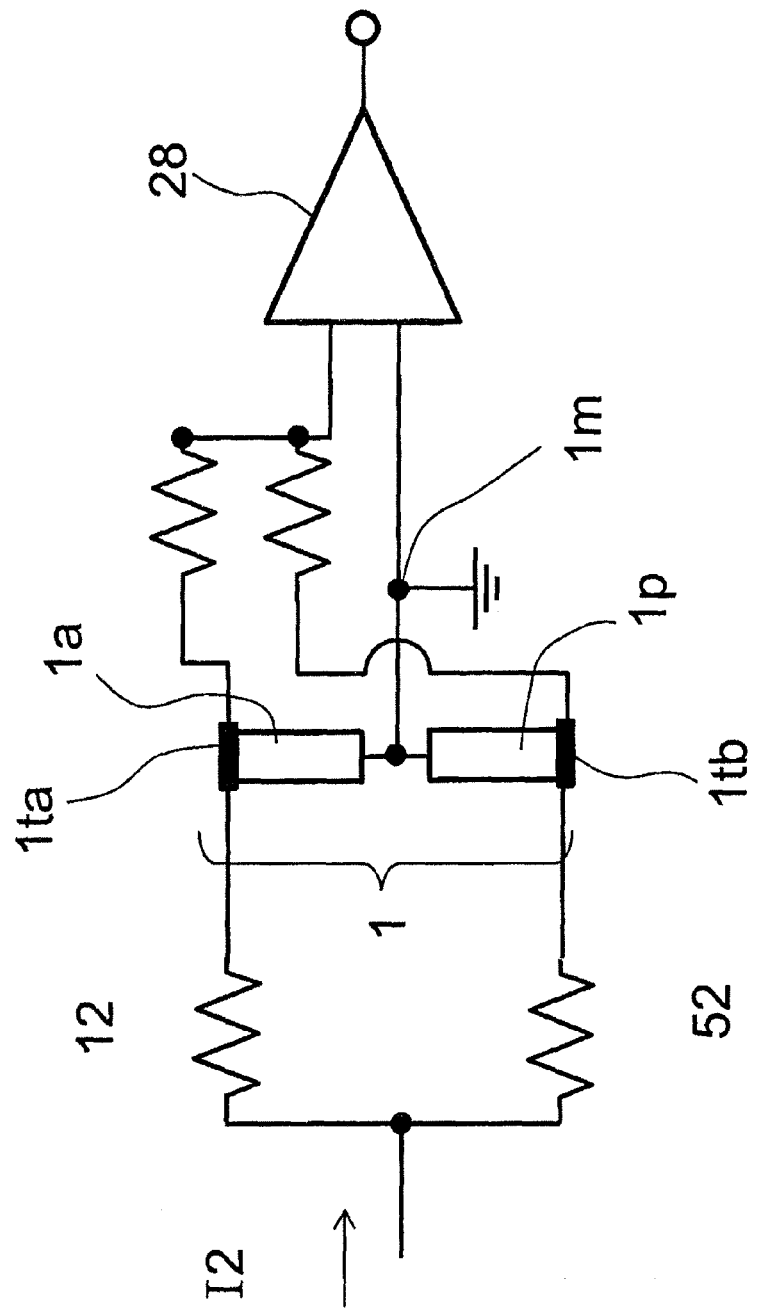
FIG. 51 is a view illustrating a connection for incorporating a sensor element into a bridge circuit in the presence of a center tap electrode.

FIG. 51 shows a connection structure for forming a bridge circuit which includes a sensor element and measurement resistors when a center tap electrode is provided. With only the equivalent measurement resistor 52 added, the bridge circuit is made up of the magnetic film parts on both the sides of the center tap electrode and the measurement resistors. Note that a variable resistor may also be added for offset adjustment purposes. Furthermore, the magnetic film may be provided in a combination of barber pole magnetic films, in a combination of magnetization easy axis tilted magnetic films, or by inducing the magnetization easy axis in the typical longitudinal direction. Note that as used herein, the "combination" includes both the case where the magnetic films having different operating points are connected in series with a center tap electrode provided therebetween and the case where the magnetic films having the same operating point are connected in series with a center tap electrode provided therebetween. On the other hand, applying the AC bias magnetic field to these magnetic films allows the output to be obtained with improved reproducibility.

Figure 52:
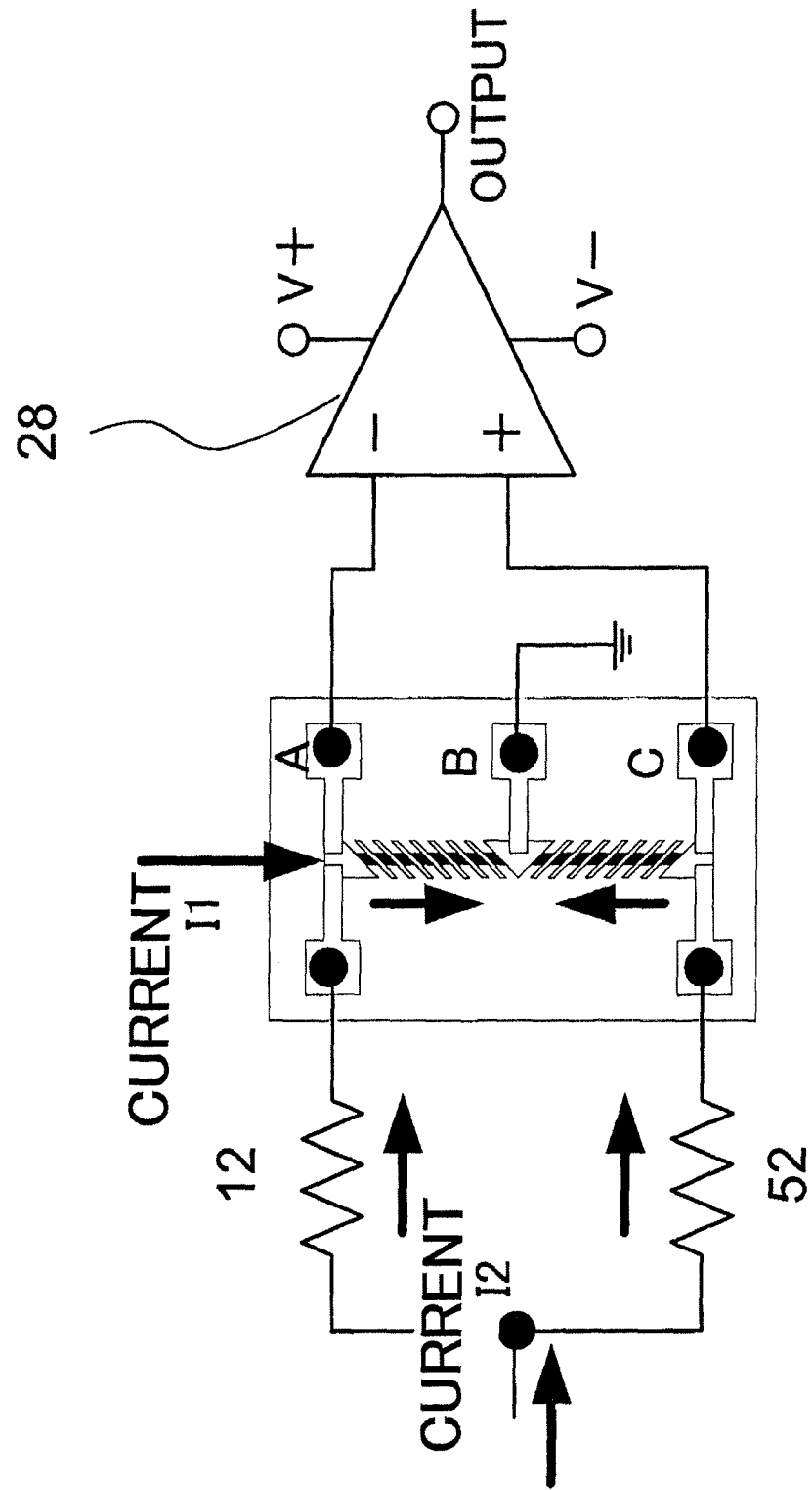
FIG. 52 is a view illustrating a connection for incorporating a sensor element into a bridge circuit in the presence of a center tap electrode, the sensor element having magnetic films of different operating points on both sides.

FIG. 52 shows a connection structure for forming a bridge circuit when the magnetic film parts on both the sides of the center tap electrode have different operating points. In the case of the operating points being different, the magnetization easy axis tilted magnetic film or the differential type barber pole magnetic film may be employed. This is acceptable so long as the magnetic film parts each have a different magnetization easy axis or a different direction of inclination of electrical conductors.

Figure 53:
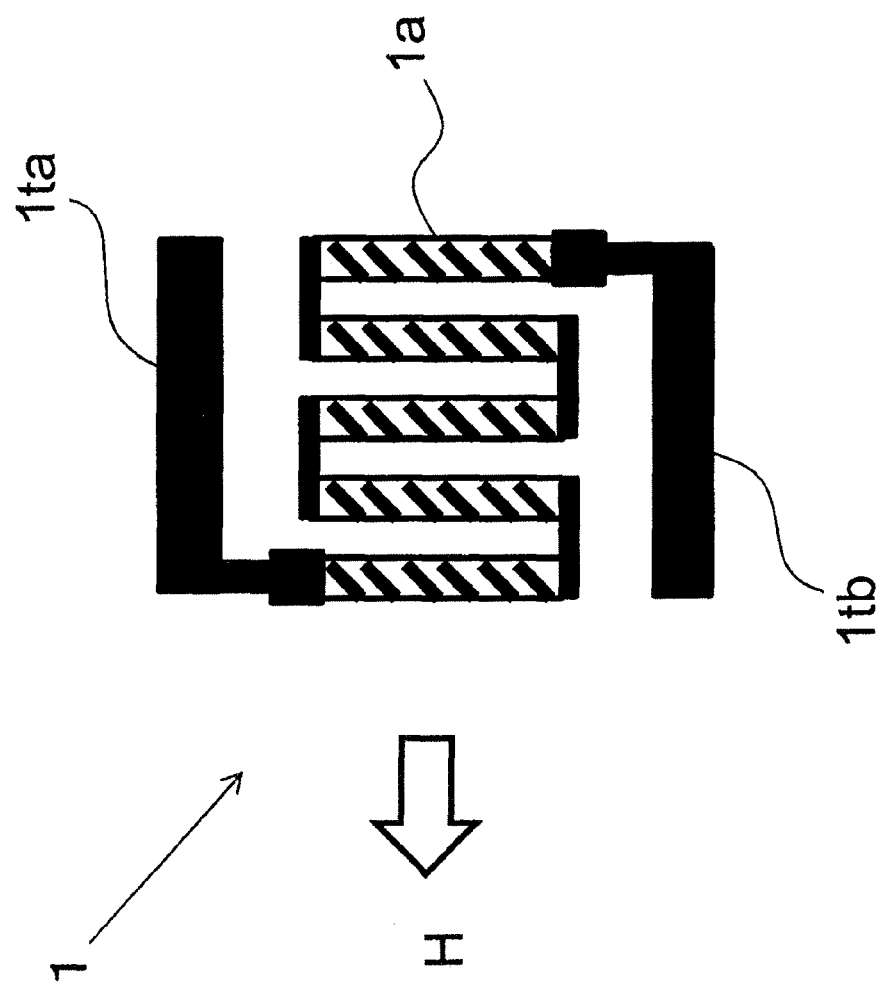
FIG. 53 is a view illustrating the configuration of a sensor element incorporating a zigzag magnetic film.

FIG. 53 shows a sensor element having a type of magnetic film parts that are arranged in parallel to each other with either the upper ends or the lower ends of adjacent magnetic films in the figure alternately coupled to each other. The sensor terminals (1ta, 1tb) are formed on the upper end and lower end of the respective magnetic films on both the ends of the sensor element. That is, all the magnetic films are connected in series. The magnetic film of such a type is referred to as the zigzag type magnetic film.

When the magnetic film is used as the magnetoresistive type, the output characteristics for an applied magnetic field exhibit an even function as shown in FIG. 3. Thus, the resistance of the film varies irrespective of the direction of the current flowing through the magnetic film. Furthermore, in the case of the magnetoresistive type, the longer the current path is, the higher the output voltage can be made. In this context, it is possible to enhance the sensitivity of the output voltage by employing the zigzag magnetic film as the sensor element.

On the other hand, two zigzag magnetic films coupled to each other with the center tap electrode 1m formed at the coupling point can be used as the sensor element having the center tap electrode. The zigzag magnetic film can also have a barber pole electrode formed on top of the magnetic film. Note that FIG. 53 shows the magnetic film on the surface of which the barber pole electrode is provided. On the other hand, in the same manner as described above, it is also acceptable to employ the magnetization easy axis tilted magnetic film.

Figure 54:
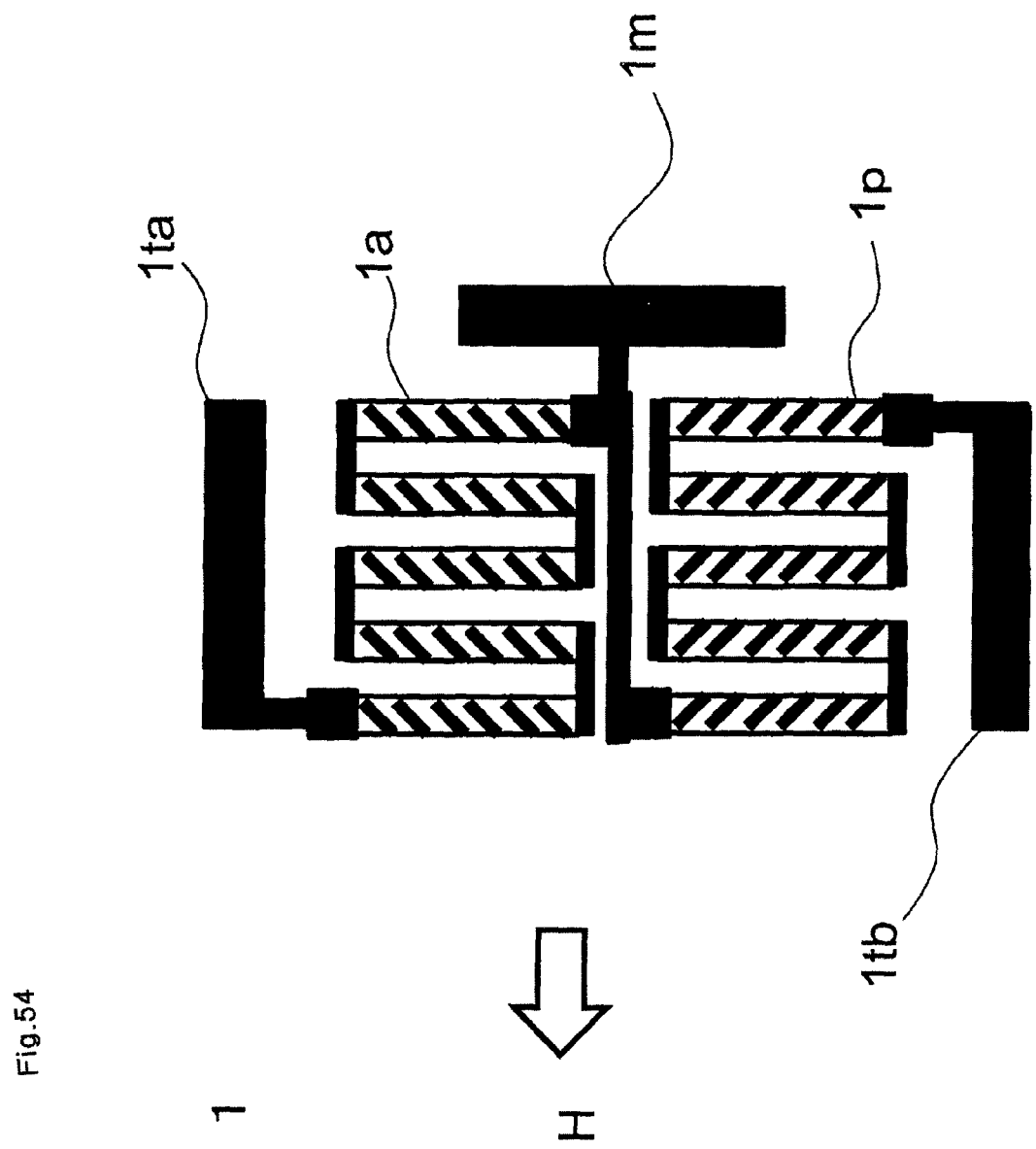
FIG. 54 is a view illustrating the configuration of a zigzag sensor element with a center tap electrode.

FIG. 54 shows the sensor element with the differential type barber pole magnetic films which are formed in a zigzag manner and provided with a center tap electrode therebetween. Such a sensor element can also be employed to construct the power measuring apparatus of the present invention. Note that even when the sensor element of the aforementioned variation employing the zigzag magnetic film is used, it is possible to take advantage of the operating point adjustment bias magnetic field applying means, the DC bias magnetic field applying means, the AC bias magnetic field applying means, or the bandpass filter means. On the other hand, in place of the barber pole magnetic film, such a sensor element may also be acceptable in which two magnetization easy axis tilted magnetic films each having a different direction of inclination of the magnetization easy axis are connected in series with a center tap electrode formed therebetween.

While the embodiments of the various power measuring apparatuses according to the present invention and the concepts thereof have been described above, it will be understood by those skilled in the art that the invention is not limited thereto but may be otherwise embodied or modified without departing from the spirit or teachings which are delineated by the following scope of claims and the description.

INDUSTRIAL APPLICABILITY

The present invention is applicable not only to a power measuring apparatus but also to larger apparatuses or systems that require power measurement means.

REFERENCE SIGNS LIST

1 Sensor element
1a, 1p Magnetic film
1c Conductor film
1t Sensor terminal
1m Center tap electrode
2 Insulating film
3 Conductor film
10 Connection end
12 Measurement resistor
13 Measurement end
15 Power measuring apparatus
22, 32 Function generator
24, 34, 35 Amplifier
26, 37 Low-pass filter
28, 38 DMM (digital tester)
37 Rectifier circuit
38 Charger
39 Switch
40 Bandpass filter means
41 Bandpass filter
42 Switch
51 Equivalent sensor resistor
52 Equivalent measurement resistor

The invention claimed is:

1. A power measuring apparatus for measuring power to be consumed by a load connected to a power supply through a connection line, which comprises:
   a pair of connection ends for connecting the power measuring apparatus to the power supply in parallel with the load;
   a magnetic film part including a magnetic film;
   a sensor element having a pair of sensor terminals provided on both ends of the magnetic film part, disposed adjacent to the connection line with an insulating layer interposed therebetween in such a manner that a direction of a current flowing through the magnetic film part between the sensor terminals is substantially in parallel with a direction of a current flowing through the connection line, wherein one of the sensor terminals is connected to one of the connection ends;
   a measurement resistor with one end connected to the other of the sensor terminals of the sensor element and the other end connected to the other of the connection ends;
   a voltage detecting unit for measuring voltage between measurement terminals using the respective sensor terminals as the measurement terminals;
   n numbers of bandpass filters arranged to be connected in parallel between the measurement resistor and the voltage detecting unit; and
   a bandpass filter having a switch capable of selecting n or less numbers of the bandpass filters out of the n numbers of the bandpass filters.

2. A sensor element formed by connecting two magnetic film parts with each other between a pair of sensor terminals, wherein:
   the magnetic film parts have a magnetization easy axis induced in a longitudinal direction of a magnetic film and a plurality of electrically conductive films tilted relative to the magnetization easy axis and formed on a surface of the magnetic film, the magnetic film parts respectively have electrically conductive films with different inclination direction from each other, and a center tap electrode is formed at a portion where the magnetic film parts are connected with each other,
   the sensor terminals are disposed adjacent to a power connection with an insulating layer interposed therebetween in such a manner that a direction of a current flowing through the magnetic film part between the sensor terminals is substantially in parallel with a direction of a current flowing through a power connection line,
   a voltage detector for measuring voltage is provided between measurement terminals using the respective sensor terminals as the measurement terminals;
   n numbers of bandpass filters are arranged to be connected in parallel between a measurement resistor and the voltage detector; and
   a bandpass filter having a switch capable of selecting n or less numbers of the bandpass filters out of the n numbers of the bandpass filters is provided.

3. The power measuring apparatus using the sensor element according to claim 2 for measuring power to be consumed by a load connected to a power supply through a connection line, comprising:
   a pair of connection ends for connecting the power measuring apparatus to the power supply in parallel with the load; and
   the sensor element according to claim 2 with the sensor terminals one of which is connected to one of the connection ends, and the grounded center tap electrode, wherein the measurement resistor has one end connected to the other of the sensor terminals of the sensor element and the other end connected to the other of the connection ends.

4. The power measuring apparatus using the sensor element according to claim 2 for measuring power to be consumed by a load connected to a power supply through a connection line, which comprises:
   a pair of connection ends for connecting the power measuring apparatus to the power supply in parallel with the load;
   the sensor element according to claim 2 with the sensor terminals one of which is connected to one of the connection ends, and the grounded center tap electrode, wherein:
   the measurement resistor has one end connected to the other of the sensor terminals of the sensor element and the other end connected to the other of the connection ends; and
   the voltage detector measures voltage between measurement terminals using the other of the sensor terminals connected with one of the sensor terminals through a register, and a grounded point as the measurement terminals.

5. The power measuring apparatus using the sensor element according to claim 2 for measuring power to be consumed by a load connected to a power supply through a connection line, which comprises:
   a pair of connection ends for connecting the power measuring apparatus to the power supply in parallel with the load;
   the sensor element according to claim 2 with the sensor terminals one of which is connected to one of the connection ends, and the grounded center tap electrode; and
   the measurement resistor has one end connected to the other of the sensor terminals of the sensor element and the other end connected to the other of the connection ends, wherein:
   the voltage detector detects potential between measurement terminals using the sensor terminals as the measurement terminals, and an equivalent measurement resistor having the same resistance value as that of the measurement resistor is connected between one of the sensor terminals of the sensor element connected to the one of the connection ends and the other end of the measurement resistor connected to the other of the connection ends.

6. The power measuring apparatus using the sensor element according to claim 2 for measuring power to be consumed by a load connected to a power supply through a connection line, which comprises:
  a pair of connection ends for connecting the power measuring apparatus to the power supply in parallel with the load; and
  the sensor element according to claim 2 with the sensor terminals one of which is connectedto one of the connection ends, and the grounded center tap electrode, wherein
  the measurement resistor has one end connected to the other of the sensor terminals of the sensor element and the other end connected to the other of the connection ends,
  the voltage detector detects potential between measurement terminals using a point for connecting the sensor terminals respectively through a resistor and the grounded point as the measurement terminals, and
  an equivalent measurement resistor having the same resistance value as that of the measurement resistor is connected between one of the sensor terminals of the sensor element connected to the one of the connection ends and the other end of the measurement resistor connected to the other of the connection ends.

7. The power measuring apparatus according claim 3, further comprising DC bias magnetic field applier configured to apply a DC magnetic field in the same direction as the longitudinal direction of the magnetic film part to the magnetic film part.

8. The power measuring apparatus according to claim 4, comprising DC bias magnetic field applier configured to apply a DC magnetic field in the same direction as the longitudinal direction of the magnetic film part to the magnetic film part.

9. The power measuring apparatus according to claim 5, comprising DC bias magnetic field applier configured to apply a DC magnetic field in the same direction as the longitudinal direction of the magnetic film part to the magnetic film part.

10. The power measuring apparatus according to claim 6, comprising DC bias magnetic field applier configured to apply a DC magnetic field in the same direction as the longitudinal direction of the magnetic film part to the magnetic film part.

11. The power measuring apparatus according to claim 3, comprising AC bias magnetic field applier configured to apply an AC magnetic field perpendicular to the longitudinal direction of the magnetic film part to the magnetic film part.

12. The power measuring apparatus according to claim 4, comprising AC bias magnetic field applier configured to apply an AC magnetic field perpendicular to the longitudinal direction of the magnetic film part to the magnetic film part.

13. The power measuring apparatus according to claim 5, comprising AC bias magnetic field applier configured to apply an AC magnetic field perpendicular to the longitudinal direction of the magnetic film part to the magnetic film part.

14. The power measuring apparatus according to claim 6, comprising AC bias magnetic field applier configured to apply an AC magnetic field perpendicular to the longitudinal direction of the magnetic film part to the magnetic film part.

15. The power measuring apparatus according to claim 3, wherein the voltage detector is provided with a low-pass filter between the measurement terminals.

16. The power measuring apparatus according to claim 4, wherein the voltage detector is provided with a low-pass filter between the measurement terminals.

17. The power measuring apparatus according to claim 5, wherein the voltage detector is provided with a low-pass filter between the measurement terminals.

18. The power measuring apparatus according to claim 6, wherein the voltage detector is provided with a low-pass filter between the measurement terminals.

19. A sensor element wherein two magnetic film parts having a plurality of strip-shaped magnetic films connected in series between a pair of sensor terminals and disposed adjacent to each other are cascaded, wherein:
  the longitudinal directions of the strip-shaped magnetic films of the respective magnetic film parts are aligned in one direction, a connection point for connecting the magnetic film parts in series is formed with a center tap electrode formed at the connection point,
  a plurality of electrically conductive films tilted relative to the longitudinal direction of the strip-shaped magnetic films are formed on a surface of the strip-shaped magnetic films,
  the magnetic film parts are tilted at different angles with respect to the longitudinal direction,
  the sensor terminals are disposed adjacent to the connection with an insulating layer interposed therebetween in such a manner that a direction of a current flowing through the magnetic film part between the sensor terminals is substantially in parallel with a direction of a current flowing through a power connection line,
  a voltage detector for measuring voltage is provided between measurement terminals using the respective sensor terminals as the measurement terminals;
  n numbers of bandpass filters are arranged to be connected in parallel between a measurement resistor and the voltage detector; and
  a bandpass filter having a switch capable of selecting n or less numbers of the bandpass filters out of the n numbers of the bandpass filters is provided.

* * * * *